US012243792B2

(12) United States Patent
Karhade et al.

(10) Patent No.: US 12,243,792 B2
(45) Date of Patent: Mar. 4, 2025

(54) MICROELECTRONIC STRUCTURES INCLUDING BRIDGES

(71) Applicant: Intel Corporation, Santa Clara, CA (US)

(72) Inventors: Omkar G. Karhade, Chandler, AZ (US); Xiaoxuan Sun, Phoenix, AZ (US); Nitin A. Deshpande, Chandler, AZ (US); Sairam Agraharam, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 924 days.

(21) Appl. No.: 17/129,135

(22) Filed: Dec. 21, 2020

(65) Prior Publication Data

US 2022/0199480 A1 Jun. 23, 2022

(51) Int. Cl.
 *H01L 23/31* (2006.01)
 *H01L 23/00* (2006.01)
 (Continued)

(52) U.S. Cl.
 CPC ...... *H01L 23/3192* (2013.01); *H01L 23/3185* (2013.01); *H01L 23/5385* (2013.01);
 (Continued)

(58) Field of Classification Search
 CPC ............ H01L 23/3192; H01L 23/3185; H01L 23/5385; H01L 23/295; H01L 23/49822; H01L 23/49816; H01L 23/5383; H01L 23/5389; H01L 23/3128; H01L 24/14; H01L 24/81; H01L 24/92; H01L 24/95; H01L 24/19; H01L 24/16; H01L 24/17; H01L 24/32; H01L 24/33; H01L 24/73; H01L 24/11; H01L 2224/0401; H01L 2224/04105; H01L 2224/0603; H01L 2224/06181; H01L 2224/12105; H01L 2224/16237; H01L 2224/214; H01L 2224/291; H01L 2224/73201; H01L 2224/73209; H01L 2224/73251; H01L 2224/73259; H01L 2224/1403; H01L 2224/16225; H01L 2224/17181; H01L 2224/32225; H01L 2224/96; H01L 2224/73267; H01L 2224/81005; H01L 2224/81191; H01L 2224/81192; H01L 2224/81193; H01L 2224/81815;
 (Continued)

(56) References Cited

U.S. PATENT DOCUMENTS

2017/0236794 A1  8/2017  Wang et al.
2017/0301625 A1  10/2017  Mahajan et al.
(Continued)

FOREIGN PATENT DOCUMENTS

CN   104979314 A   10/2015
CN   109727944 A   5/2019
(Continued)

*Primary Examiner* — Shaun M Campbell
*Assistant Examiner* — Teresa M. Arroyo
(74) *Attorney, Agent, or Firm* — Akona IP PC

(57) ABSTRACT

Disclosed herein are microelectronic structures including bridges, as well as related assemblies and methods. In some embodiments, a microelectronic structure may include a substrate and a bridge.

20 Claims, 37 Drawing Sheets

(51) Int. Cl.
*H01L 23/29* (2006.01)
*H01L 23/498* (2006.01)
*H01L 23/538* (2006.01)
*H01L 25/065* (2023.01)
*H01L 25/18* (2023.01)

(52) U.S. Cl.
CPC .............. *H01L 24/16* (2013.01); *H01L 24/17* (2013.01); *H01L 24/32* (2013.01); *H01L 24/33* (2013.01); *H01L 24/73* (2013.01); *H01L 25/0655* (2013.01); *H01L 25/18* (2013.01); H01L 23/295 (2013.01); H01L 23/49822 (2013.01); H01L 2224/16145 (2013.01); H01L 2224/16227 (2013.01); H01L 2224/1703 (2013.01); H01L 2224/32137 (2013.01); H01L 2224/32505 (2013.01); H01L 2224/33505 (2013.01); H01L 2224/73204 (2013.01); H01L 2224/73253 (2013.01); H01L 2924/381 (2013.01)

(58) Field of Classification Search
CPC ... H01L 2224/8384; H01L 2224/83896; H01L 2224/92124; H01L 2224/92125; H01L 2224/9222; H01L 2224/92224; H01L 2224/92242; H01L 2224/92244; H01L 2224/95; H01L 2225/06517; H01L 2225/06548; H01L 2225/06513; H01L 2225/06524; H01L 2225/06541; H01L 21/568; H01L 25/50; H01L 25/0655; H01L 25/18; H01L 25/0652; H01L 2224/32137; H01L 2224/32505; H01L 2224/33505; H01L 2224/73204; H01L 2224/73253; H01L 2224/32245; H01L 2224/0557; H01L 2224/08225; H01L 2224/13082; H01L 2224/16238; H01L 2224/2919; H01L 2224/16145; H01L 2224/16227; H01L 2224/1703; H01L 2924/381; H01L 2924/15311; H01L 2924/181; H01L 2924/18161; H01L 2924/15153; H01L 2924/15313; H01L 2924/18162; H01L 2224/80; H01L 2224/81; H01L 2224/08; H01L 2224/16
USPC ......................................................... 257/777
See application file for complete search history.

(56) References Cited

U.S. PATENT DOCUMENTS

| | | | |
|---|---|---|---|
| 2019/0198445 A1 | 6/2019 | Alur et al. | |
| 2019/0287907 A1 | 9/2019 | Mahler et al. | |
| 2020/0227385 A1 | 7/2020 | Hiner et al. | |
| 2020/0395313 A1 | 12/2020 | Mallik et al. | |
| 2022/0149005 A1* | 5/2022 | Sun | H01L 23/5385 |
| 2022/0320026 A1* | 10/2022 | Sun | H01L 24/49 |
| 2023/0062783 A1* | 3/2023 | Lin | H01L 23/562 |
| 2023/0064277 A1* | 3/2023 | Lai | H01L 21/563 |
| 2023/0064957 A1* | 3/2023 | Lin | H01L 21/6835 |

FOREIGN PATENT DOCUMENTS

| | | | | |
|---|---|---|---|---|
| TW | 1582039 B | * | 5/2017 | ............ H01L 25/50 |
| WO | 2014136720 A1 | | 9/2014 | |

* cited by examiner

MICROELECTRONIC STRUCTURES INCLUDING BRIDGES

BACKGROUND

In conventional microelectronic packages, a die may be attached to an organic package substrate by solder. Such a package may be limited in the achievable interconnect density between the package substrate and the die, the achievable speed of signal transfer, and the achievable miniaturization, for example.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
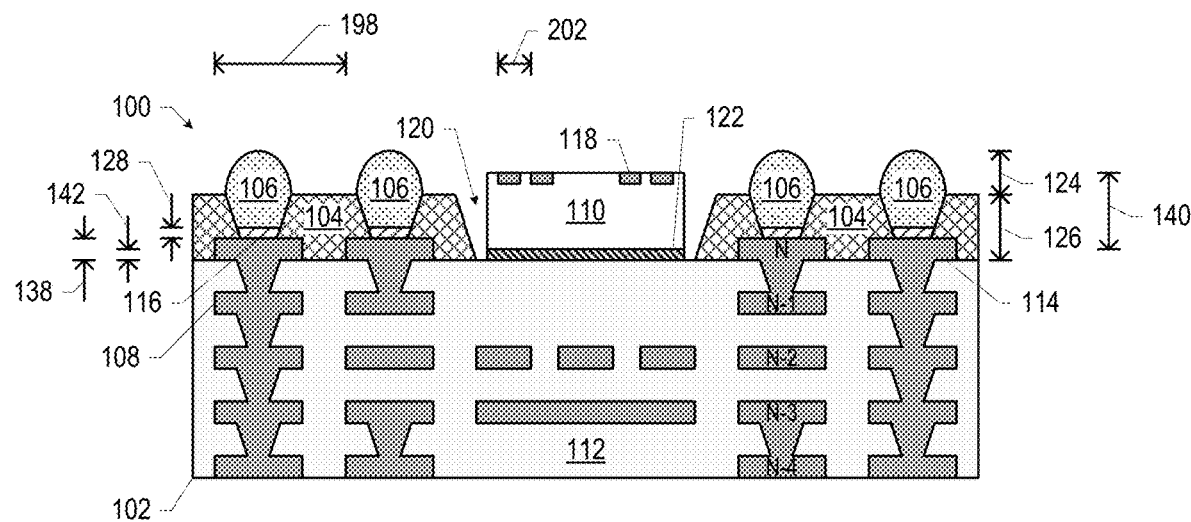
FIG. 1 is a side, cross-sectional view of an example microelectronic structure, in accordance with various embodiments.

Disclosed herein are microelectronic structures including bridges, as well as related assemblies and methods. In some embodiments, a microelectronic structure may include a substrate and a bridge in a cavity of the substrate. Microelectronic components may be coupled to both the substrate and the bridge.

To achieve high interconnect density in a microelectronics package, some conventional approaches require costly manufacturing operations, such as fine-pitch via formation and first-level interconnect plating in substrate layers over an embedded bridge, done at panel scale. The microelectronic structures and assemblies disclosed herein may achieve interconnect densities as high or higher than conventional approaches without the expense of conventional costly manufacturing operations. Further, the microelectronic structures and assemblies disclosed herein offer new flexibility to electronics designers and manufacturers, allowing them to select an architecture that achieves their device goals without excess cost or manufacturing complexity.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The phrase "A or B" means (A), (B), or (A and B). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y.

FIG. 1 is a side, cross-sectional view of an example microelectronic structure 100. The microelectronic structure 100 may include a substrate 102 and a bridge component 110 in a cavity 120 at a "top" face of the substrate 102. The substrate 102 may include a dielectric material 112 and conductive material 108, with the conductive material 108 arranged in the dielectric material 112 (e.g., in lines and vias, as shown) to provide conductive pathways through the substrate 102. In some embodiments, the dielectric material 112 may include an organic material, such as an organic buildup film. In some embodiments, the dielectric material 112 may include a ceramic, an epoxy film having filler particles therein, glass, an inorganic material, or combinations of organic and inorganic materials, for example. In some embodiments, the conductive material 108 may include a metal (e.g., copper). In some embodiments, the substrate 102 may include layers of dielectric material 112/conductive material 108, with lines of conductive material 108 in one layer electrically coupled to lines of conductive material 108 in an adjacent layer by vias of the conductive material 108. A substrate 102 including such layers may be formed using a printed circuit board (PCB) fabrication technique, for example. A substrate 102 may include N such layers, where N is an integer greater than or equal to one; in the accompanying drawings, the layers are labeled in descending order from the face of the substrate 102 closest to the cavity 120 (e.g., layer N, layer N−1, layer N−2, etc.). Although a particular number and arrangement of layers of dielectric material 112/conductive material 108 are shown in various ones of the accompanying figures, these particular numbers and arrangements are simply illustrative, and any desired number and arrangement of dielectric material 112/conductive material 108 may be used. For example, although FIG. 1 and others of the accompanying drawings do not illustrate conductive material 108 in layer N−1 under the bridge component 110, conductive material 108 may be present in layer N−1 under the bridge component 110. Further, although a particular number of layers are shown in the substrate 102 (e.g., five layers), these layers may represent only a portion of the substrate 102, and further layers may be present (e.g., layers N−5, N−6, etc.).

As noted above, a microelectronic structure 100 may include a cavity 120 at the "top" face of the substrate 102. In the embodiment of FIG. 1, the cavity 120 extends through a surface insulation material 104 at the "top" face, and the bottom of the cavity is provided by the "topmost" dielectric material 112. The surface insulation material 104 may include a solder resist and/or other dielectric materials that may provide surface electrical insulation and may be compatible with solder-based or non-solder-based interconnects, as appropriate. In other embodiments, a cavity 120 in a substrate 102 may extend into the dielectric material 112, as discussed further below. The cavity 120 may have a tapered shape, as shown in FIG. 1, narrowing toward the bottom of the cavity 120. The substrate 102 may include conductive contacts 114 at the "top" face that are coupled to conductive pathways formed by the conductive material 108 through the dielectric material 112, allowing components electrically coupled to the conductive contacts 114 (not shown in FIG. 1, but discussed below with reference to FIG. 2) to couple to circuitry within the substrate 102 and/or to other components electrically coupled to the substrate 102. The conductive contacts 114 may include a surface finish 116, which may protect the underlying material of the conductive contact from corrosion. In some embodiments, the surface finish 116 may include nickel, palladium, gold, or a combination thereof. The conductive contacts 114 may be located at the "top" face and outside the cavity 120; as shown, the surface insulation material 104 may include openings at the bottom of which the surface finishes 116 of the conductive contacts 114 are exposed. Any of the conductive contacts disclosed herein may include a surface finish 116, whether or not such a surface finish 116 is expressly illustrated. In FIG. 1, solder 106 (e.g., a solder ball) may be disposed in the openings, and in conductive contact with the conductive contacts 114. As shown in FIG. 1 and others of the accompanying drawings, these openings in the surface insulation material 104 may be tapered, narrowing toward the conductive contacts 114. In some embodiments, the solder 106 on the conductive contacts 114 may be first-level interconnects, while in other embodiments, non-solder first-level interconnects may be used to electrically couple the conductive contacts 114 to another component. As used herein, a "conductive contact" may refer to a portion of conductive material (e.g., one or more metals) serving as part of an interface between different components; although some of the conductive contacts discussed herein are illustrated in a particular manner in various ones of the accompanying drawings, any conductive contacts may be recessed in, flush with, or extending away from a surface of a component, and may take any suitable form (e.g., a conductive pad or socket).

A bridge component 110 may be disposed in the cavity 120, and may be coupled to the substrate 102. This coupling may include electrical interconnects or may not include electrical interconnects; in the embodiment of FIG. 1, the bridge component 110 is mechanically coupled to the dielectric material 112 of the substrate 102 by an adhesive 122 (e.g., a die-attach film (DAF)) between the "bottom" face of the bridge component 110 and the substrate 102, while other types of couplings are described elsewhere herein. The bridge component 110 may include conductive contacts 118 at its "top" face; as discussed below with reference to FIG. 2, these conductive contacts 118 may be used to electrically couple the bridge component 110 to one or more other microelectronic components. The bridge component 110 may include conductive pathways (e.g., including lines and vias, as discussed below with reference to FIG. 67) to the conductive contacts 118 (and/or to other circuitry included in the bridge component 110 and/or to other conductive contacts of the bridge component 110, as discussed below). In some embodiments, the bridge component 110 may include a semiconductor material (e.g., silicon); for example, the bridge component 110 may be a die 1502, as discussed below with reference to FIG. 66, and may include an integrated circuit (IC) device 1600, as discussed below with reference to FIG. 67. In some embodiments, the bridge component 110 may be an "active" component in that it may contain one or more active devices (e.g., transistors), while in other embodiments, the bridge component 110 may be a "passive" component in that it does not contain one or more active devices. The bridge component 110 may be manufactured so as to permit a greater density of interconnects than the substrate 102. Consequently, the pitch 202 of the conductive contacts 118 of the bridge component 110 may be less than the pitch 198 of the conductive contacts 114 of the substrate 102. When multiple microelectronic components are coupled to the bridge component 110 (e.g., as discussed below with reference to FIG. 2), these microelectronic components may use the electrical pathways through the bridge component 110 (and may use other circuitry within the bridge component 110, when present) to achieve a higher density interconnection between them, relative to interconnections made via the conductive contacts 114 of the substrate 102.

The dimensions of the elements of a microelectronic structure 100 may take any suitable values. For example, in some embodiments, the thickness 138 of the metal lines of the conductive contacts 114 may be between 5 microns and 25 microns. In some embodiments, the thickness 128 of the surface finish 116 may be between 5 microns and 10 microns (e.g., 7 microns of nickel and less than 100 nanometers of each of palladium and gold). In some embodiments, the thickness 142 of the adhesive 122 may be between 2 microns and 10 microns. In some embodiments, the pitch 202 of the conductive contacts 118 of the bridge component 110 may be less than 70 microns (e.g., between 25 microns and 70 microns, between 25 microns and 65 microns, between 40 microns and 70 microns, or less than 65 microns). In some embodiments, the pitch 198 of the conductive contacts 114 may be greater than 70 microns (e.g., between 90 microns and 150 microns). In some embodiments, the thickness 126 of the surface insulation material 104 may be between 25 microns and 50 microns. In some embodiments, the height 124 of the solder 106 above the surface insulation material 104 may be between 25 microns and 50 microns. In some embodiments, the thickness 140 of the bridge component 110 may be between 30 microns and 200 microns.

Figure 2:
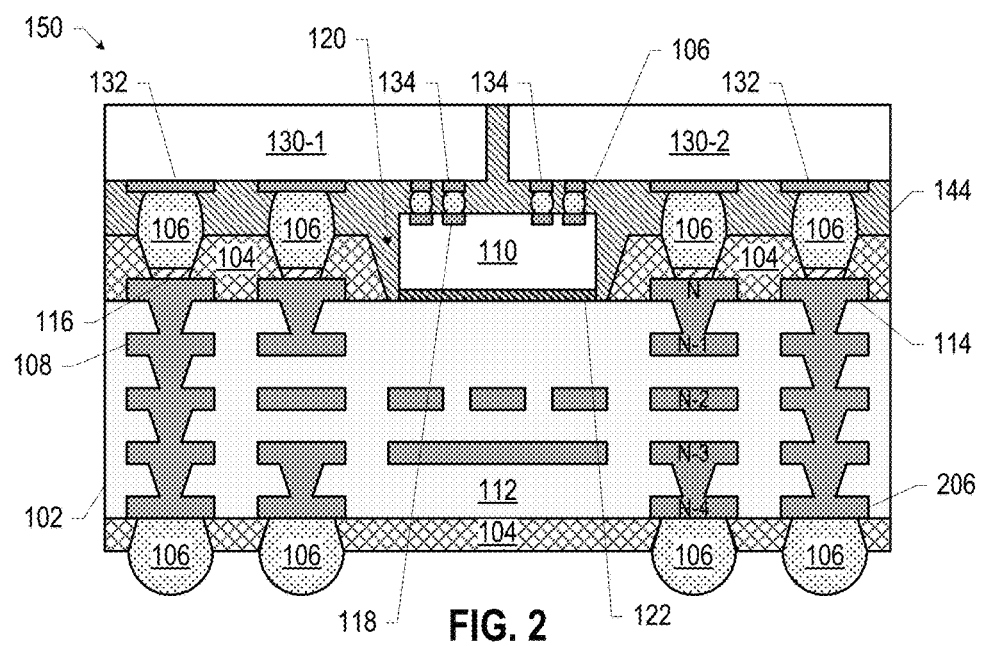
FIG. 2 is a side, cross-sectional view of an example microelectronic assembly including the microelectronic structure of FIG. 1, in accordance with various embodiments.

A microelectronic structure 100, like that of FIG. 1 and others of the accompanying drawings, may be included in a larger microelectronic assembly. FIG. 2 illustrates an example of such a microelectronic assembly 150, which may include one or more microelectronic components 130 having conductive contacts 134 coupled to the conductive contacts 118 of the bridge component 110 (e.g., by solder 106 or another interconnect structure) and conductive contacts 132 coupled to the conductive contacts 114 of the substrate 102 (e.g., by solder 106 or another interconnect structure, as discussed above). FIG. 2 illustrates two microelectronic components 130 (the microelectronic components 130-1 and 130-2), but a microelectronic assembly 150 may include more or fewer microelectronic components 130. Although FIG. 2 depicts the microelectronic components 130-1/130-2 as substantially "covering" the proximate surface of the microelectronic structure 100, this is simply an illustration, and need not be the case. Further, although FIGS. 1 and 2 (and others of the accompanying drawings) depict microelectronic structures 100/microelectronic assemblies 150 that include a single bridge component 110 in a substrate 102, this is simply for ease of illustration, and a microelectronic structure 100/microelectronic assembly 150 may include multiple bridge components 110 in a substrate 102. Although various ones of the accompanying drawings depict solder 106 in contact with only a portion of the exposed surface of a conductive contact (e.g., only a portion of the exposed surface of the conductive contacts 132 of FIG. 2), this is simply for ease of illustration, and solder 106 in contact with a conductive contact may wet the entire exposed surface of the conductive contact.

The microelectronic components 130 may include conductive pathways (e.g., including lines and vias, as discussed below with reference to FIG. 67) to the conductive contacts 132/134 (and/or to other circuitry included in the microelectronic component 130 and/or to other conductive contacts of the microelectronic component 130, not shown). In some embodiments, a microelectronic component 130 may include a semiconductor material (e.g., silicon); for example, a microelectronic component 130 may be a die 1502, as discussed below with reference to FIG. 66, and may include an IC device 1600, as discussed below with reference to FIG. 67. In some embodiments, the microelectronic component 130 may be an "active" component in that it may contain one or more active devices (e.g., transistors), while in other embodiments, the microelectronic component 130 may be a "passive" component in that it does not contain one or more active devices. In some embodiments, for example, a microelectronic component 130 may be a logic die. More generally, the microelectronic components 130 may include circuitry to perform any desired functionality. For example, one or more of the microelectronic components 130 may be logic dies (e.g., silicon-based dies), and one or more of the microelectronic components 130 may be memory dies (e.g., high bandwidth memory). As discussed above with reference to FIG. 1, when multiple microelectronic components 130 are coupled to the bridge component 110 (e.g., as shown in FIG. 2), these microelectronic components 130 may use the electrical pathways through the bridge component 110 (and may use other circuitry within the bridge component 110, when present) to achieve a higher density interconnection between them, relative to interconnections made via the conductive contacts 114 of the substrate 102.

As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, a mold material 144 may be disposed between the microelectronic structure 100 and the microelectronic components 130, and may also be between the microelectronic components 130 and above the microelectronic components 130 (not shown). In some embodiments, the mold material 144 may include multiple different types of mold materials, including an underfill material between the microelectronic components 130 and the microelectronic structure 100 and a different material disposed above and at side faces of the microelectronic components 130. Example materials that may be used for the mold material 144 include epoxy materials, as suitable.

The microelectronic assembly 150 also illustrates a surface insulation material 104 at the "bottom" face of the substrate 102 (opposite to the "top" face), with tapered openings in the surface insulation material 104 at the bottoms of which conductive contacts 206 are disposed. Solder 106 may be disposed in these openings, in conductive contact with the conductive contacts 206. The conductive contacts 206 may also include a surface finish (not shown). In some embodiments, the solder 106 on the conductive contacts 206 may be second-level interconnects (e.g., solder balls for a ball grid array arrangement), while in other embodiments, non-solder second-level interconnects (e.g., a pin grid array arrangement or a land grid array arrangement) may be used to electrically couple the conductive contacts 206 to another component. The conductive contacts 206/ solder 106 (or other second-level interconnects) may be used to couple the substrate 102 to another component, such as a circuit board (e.g., a motherboard), an interposer, or another IC package, as known in the art and as discussed below with reference to FIG. 68. In embodiments in which the microelectronic assembly 150 includes multiple microelectronic components 130, the microelectronic assembly 150 may be referred to as a multi-chip package (MCP). A microelectronic assembly 150 may include additional components, such as passive components (e.g., surface-mount resistors, capacitors, and inductors disposed at the "top" face or the "bottom" face of the substrate 102), active components, or other components.

FIGS. 3-10 are side, cross-sectional views of various stages in an example process for the manufacture of the microelectronic assembly 150 of FIG. 2, in accordance with various embodiments. Although the operations of the process of FIGS. 3-10 (and the processes of others of the accompanying drawings, discussed below) may be illustrated with reference to particular embodiments of the microelectronic structures 100/microelectronic assemblies 150 disclosed herein, the method may be used to form any suitable microelectronic structures 100/microelectronic assemblies 150. Operations are illustrated once each and in a particular order in FIGS. 3-10 (and in the figures representing others of the manufacturing processes disclosed herein), but the operations may be reordered and/or repeated as desired (e.g., with different operations performed in parallel when manufacturing multiple microelectronic structures 100/microelectronic assemblies 150).

Figure 3:
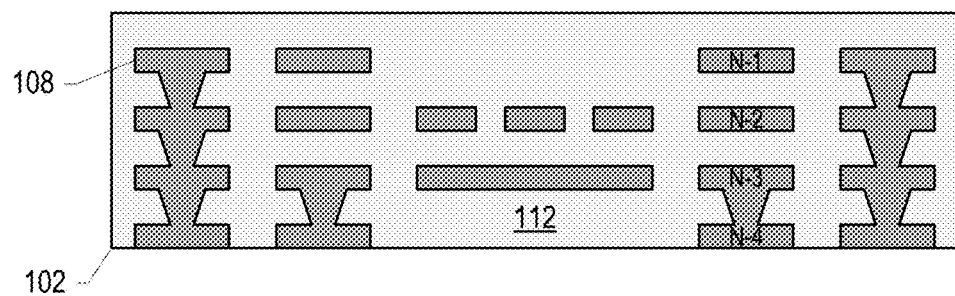
FIGS. 3-10 are side, cross-sectional views of various stages in an example process for the manufacture of the microelectronic assembly of FIG. 2, in accordance with various embodiments.

FIG. 3 illustrates an assembly that includes a preliminary substrate 102 including dielectric material 112 and patterned conductive material 108. The assembly of FIG. 3 may be manufactured using conventional package substrate manufacturing techniques (e.g., lamination of layers of the dielectric material 112, etc.), and may include layers up to N–1.

Figure 4:
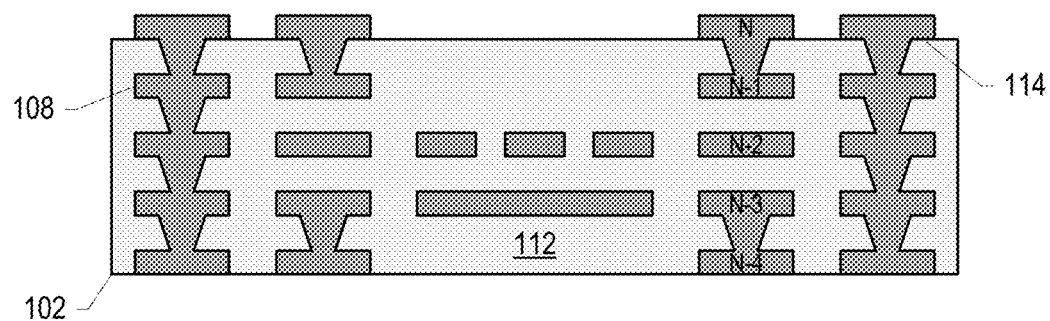

FIG. 4 illustrates an assembly subsequent to fabricating an additional Nth layer for the preliminary substrate 102 of FIG. 4. The assembly of FIG. 4 includes the underlying metal of the conductive contacts 114. The assembly of FIG. 4 may be manufactured using conventional package substrate manufacturing techniques.

Figure 5:
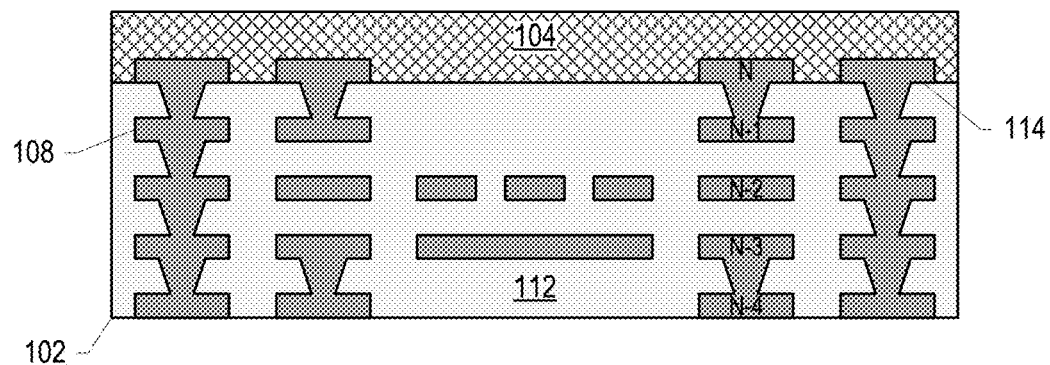

FIG. 5 illustrates an assembly subsequent to former a layer of surface insulation material 104 on the assembly of FIG. 4.

Figure 6:
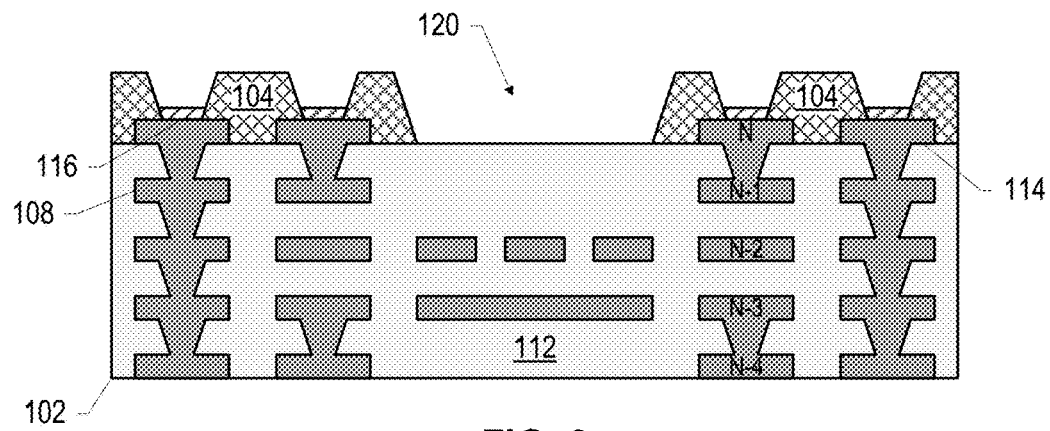

FIG. 6 illustrates an assembly subsequent to patterning openings in the surface insulation material 104 of the assembly of FIG. 5 to expose the underlying metal of the conductive contacts 114, forming the surface finish 116 of the conductive contacts 114, and forming the cavity 120. In some embodiments, the openings in the surface insulation material 104 (including the cavity 120) may be formed by mechanical patterning, laser patterning, dry etch patterning, or lithographic patterning techniques.

Figure 7:
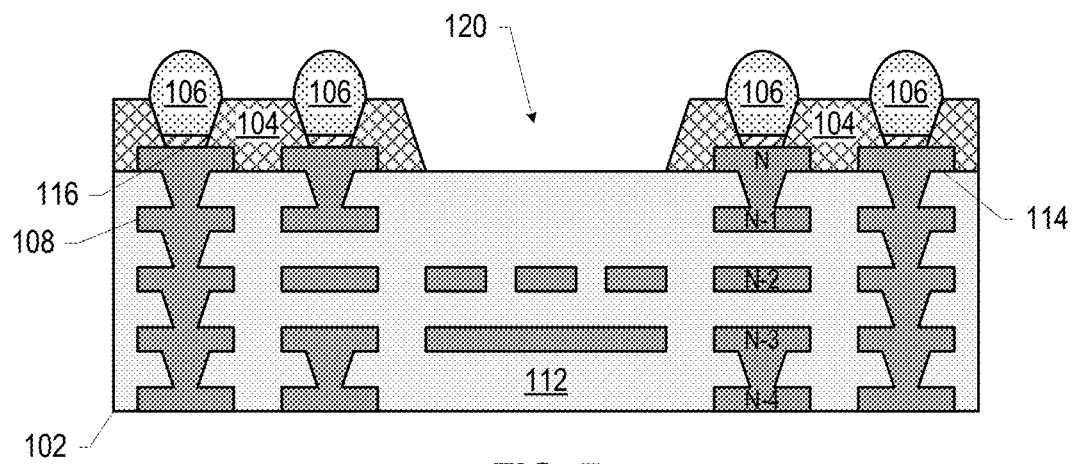

FIG. 7 illustrates an assembly subsequent to performing a clean operation on the assembly of FIG. 6, and forming the solder 106 (e.g., microballs) on the conductive contacts 114.

Figure 8:
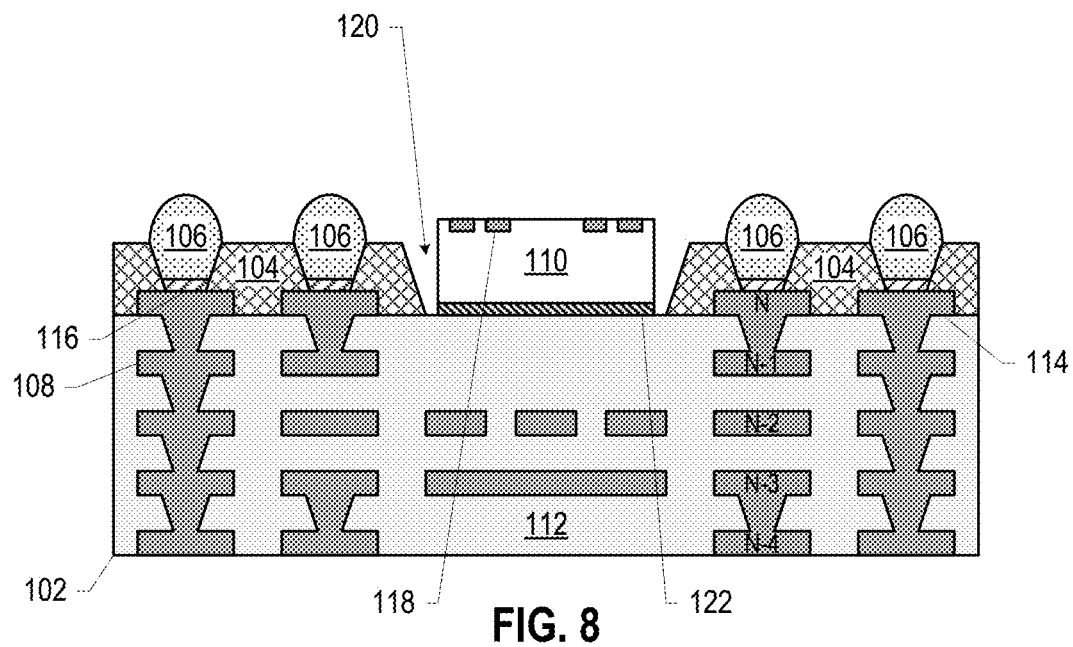

FIG. 8 illustrates an assembly subsequent to attaching the bridge component 110 to the exposed dielectric material 112 of the cavity 120 of the assembly of FIG. 7, using the adhesive 122. In some embodiments, the adhesive 122 may be a DAF, and attaching the bridge component 110 may include performing a film cure operation. The assembly of FIG. 8 may take the form of the microelectronic structure 100 of FIG. 1.

Figure 9:
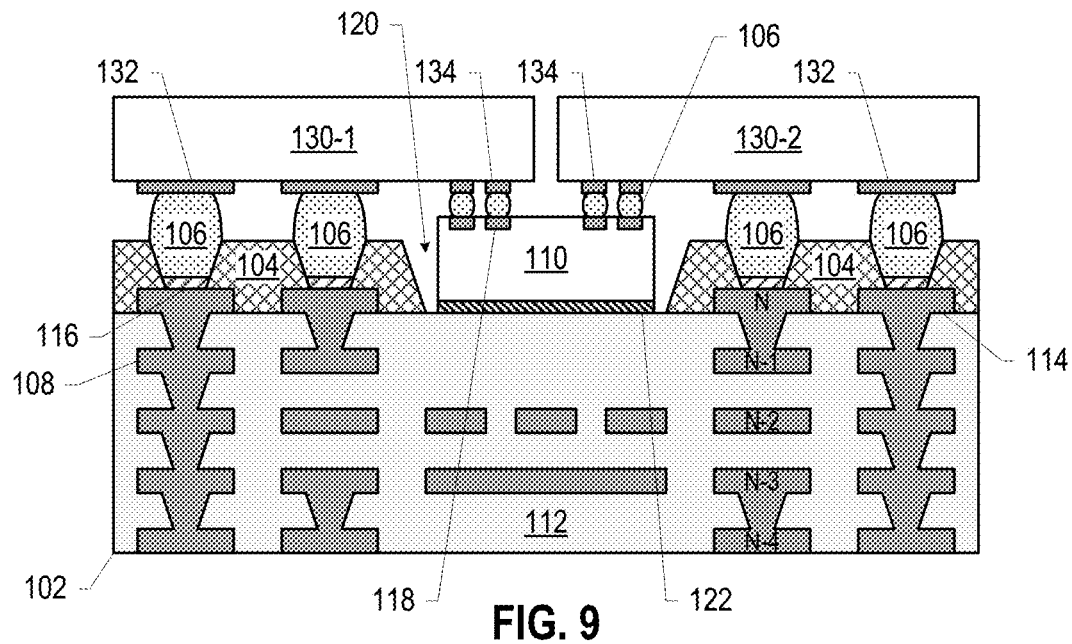

FIG. 9 illustrates an assembly subsequent to attaching the microelectronic components 130 to the assembly of FIG. 8. In some embodiments, this attachment may include a thermocompression bonding (TCB) operation. In some embodiments, additional solder may be provided on the conductive contacts 118, the conductive contacts 132, and/or the conductive contacts 134 before the TCB operation.

Figure 10:
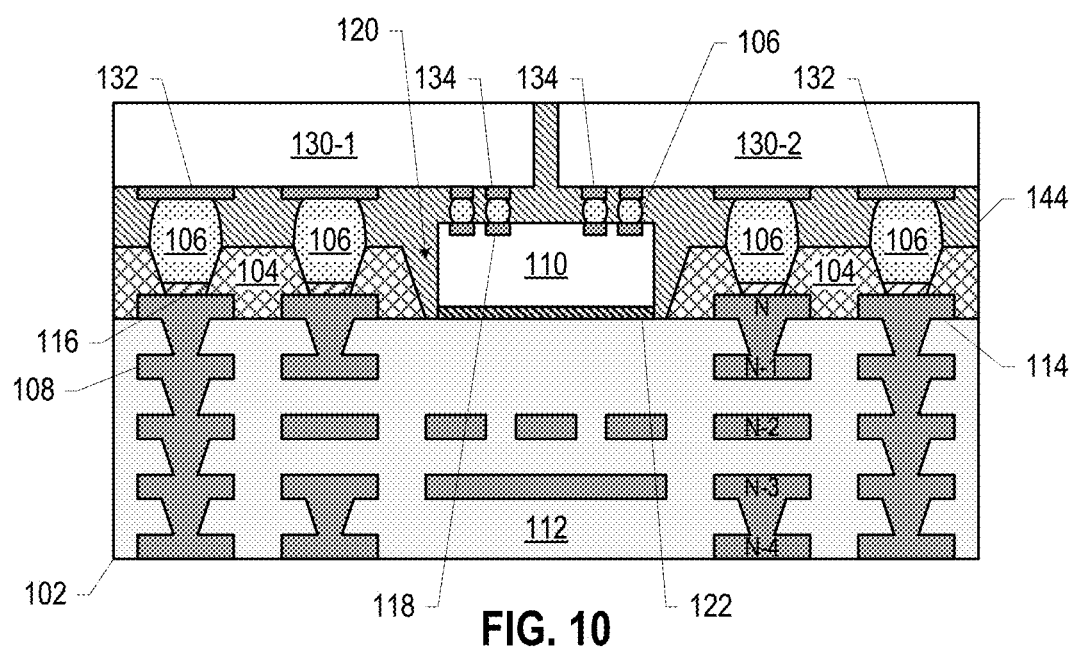

FIG. 10 illustrates an assembly subsequent to providing the mold material 144 to the assembly of FIG. 9. As noted above, in some embodiments, the mold material 144 of FIG. 10 may include multiple different materials (e.g., a capillary underfill material between the microelectronic components 130 and the microelectronic structure 100, and a different material over the microelectronic components 130). The assembly of FIG. 10 may take the form of the microelectronic assembly 150 of FIG. 2. As discussed above, the mold material 144 may include an underfill material (e.g., a capillary underfill material).

Figure 65:
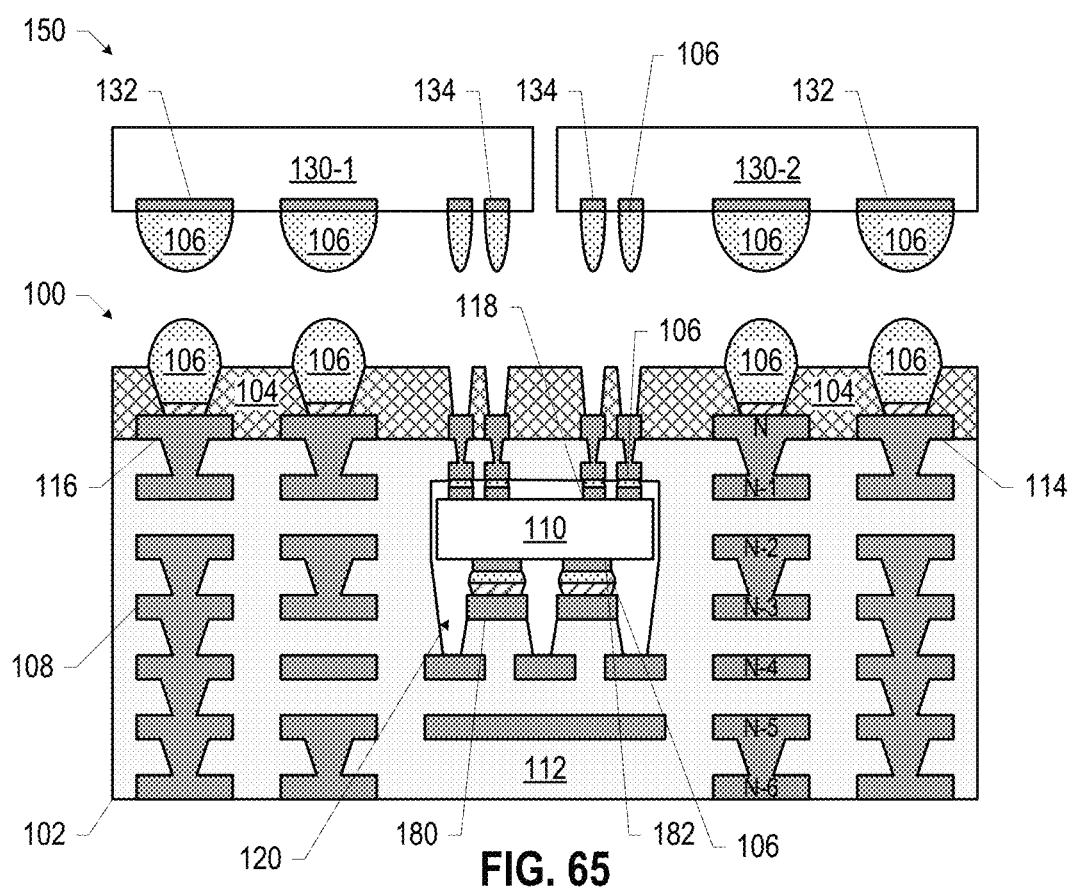
FIG. 65 is a side, cross-sectional, exploded view of an example microelectronic assembly, in accordance with various embodiments.

Various ones of FIGS. 3-65 illustrate example microelectronic structures 100/microelectronic assemblies 150 having various features. The features of these microelectronic structures 100/microelectronic assemblies 150 may be combined with any other features disclosed herein, as suitable, to form a microelectronic structure 100/microelectronic assembly 150. For example, any of the microelectronic structures 100 disclosed herein may be coupled to one or more microelectronic components 130 (e.g., as discussed above with reference to FIGS. 2-10) to form a microelectronic assembly 150, and any of the microelectronic assemblies 150 disclosed herein may be manufactured separately from their constituent microelectronic structures 100. A number of elements of FIGS. 1 and 2 are shared with FIGS. 3-65; for ease of discussion, a description of these elements is not repeated, and these elements may take the form of any of the embodiments disclosed herein.

A microelectronic structure 100 may include a cavity 120 that extends through a surface insulation material 104 at a "top" face of the substrate 102 (e.g., as discussed above with reference to FIG. 1). In some embodiments, the dielectric material 112 of the substrate 102 may provide the bottom of the cavity 120 (e.g., as discussed above with reference to FIG. 1), while in other embodiments, another material may provide a bottom of the cavity 120.

Figure 11:
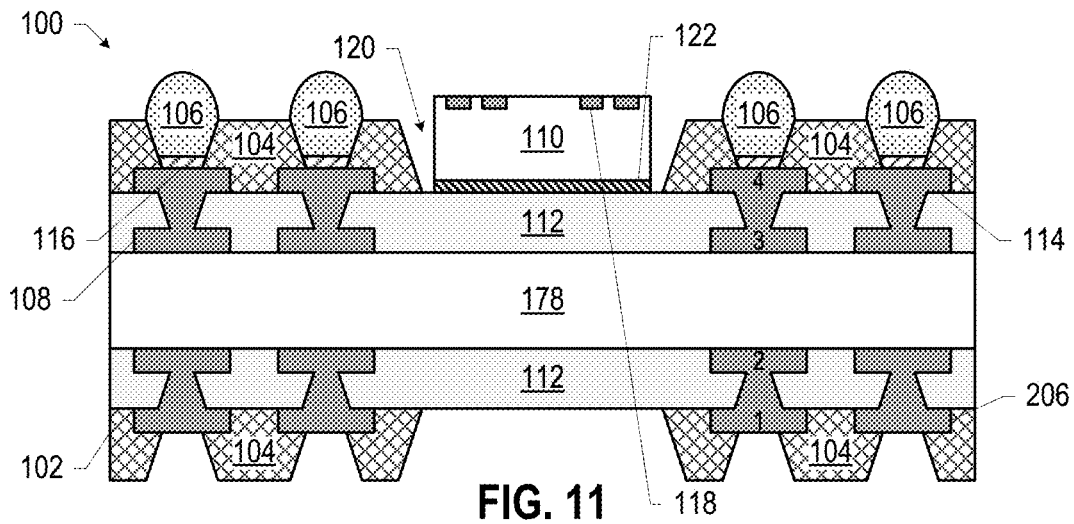
FIG. 11 is a side, cross-sectional view of an example microelectronic structure, in accordance with various embodiments.

Although various ones of the drawings herein illustrate the substrate 102 as a coreless substrate (e.g., having vias that all taper in the same direction), any of the substrates 102 disclosed herein may be cored substrates 102. For example, FIG. 11 illustrates a microelectronic structure 100 having similar features to the microelectronic structure of FIG. 1, but having a substrate 102 having a core 178 (through which conductive pathways, not shown, may extend). As shown in FIG. 11, a cored substrate 102 may include vias that taper toward the core 178 (and thus taper in opposite directions at opposite sides of the core 178).

Figure 12:
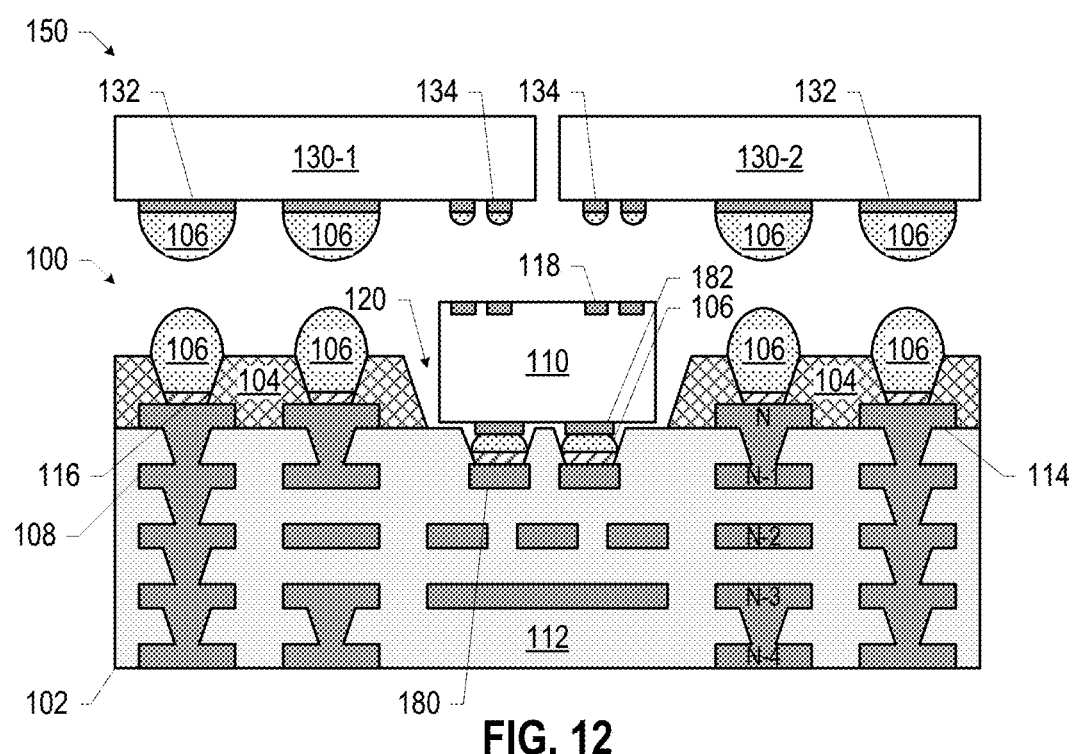
FIG. 12 is a side, cross-sectional, exploded view of an example microelectronic assembly, in accordance with various embodiments.

As noted above, in some embodiments, the bridge component 110 may include conductive contacts other than the conductive contacts 118 at its "top" face; for example, the bridge component 110 may include conductive contacts 182 at its "bottom" face, as shown in a number of the accompanying drawings. For example, FIG. 12 illustrates an embodiment of a microelectronic structure 100 similar to that of FIG. 1, but in which conductive contacts 182 of the bridge component 110 are coupled to conductive contacts 180 of the substrate 102 by solder 106. In a microelectronic structure 11, the conductive contacts 182 of the bridge component 110 may be conductively coupled to conductive contacts 180 at the bottom of the cavity 120 of the substrate 102 (e.g., by solder 106 or another type of interconnect). One or more of the conductive contacts 182 of a bridge component 110 may be coupled to one or more conductive contacts 118 of the bridge component 110 by conductive pathways through the bridge component 110 (including, e.g., one or more through-silicon vias (TSVs)), and/or the conductive contacts 182 of a bridge component 110 may be coupled to electrical elements (e.g., transistors, diodes, resistors, capacitors, inductors, etc.) within the bridge component 110, when present. In some embodiments, the conductive contacts 180 may be at the bottom of corresponding cavities in the dielectric material 112, as shown. The conductive contacts 180 may include a surface finish 116 at their exposed surfaces, as shown. Direct electrical connections between the substrate 102 and the bridge component 110 (i.e., electrical connections that do not go through a microelectronic component 130) may enable direct power and/or input/output (I/O) pathways between the substrate 102 and the bridge component 110, which may result in power delivery benefits and/or signal latency benefits. In some embodiments, the pitch of the conductive contacts 182 may be between 40 microns and 1 millimeter (e.g., between 40 microns and 50 microns, or between 100 microns and 1 millimeter). In embodiments in which the bridge component 110 includes conductive contacts 182 at its "bottom" face to couple to conductive contacts 180 at the bottom of the cavity 120 of the substrate 102, a dielectric material (e.g., a capillary underfill material) may support these connections; such a material is not shown in various ones of the accompanying drawings for clarity of illustration.

Figure 13:
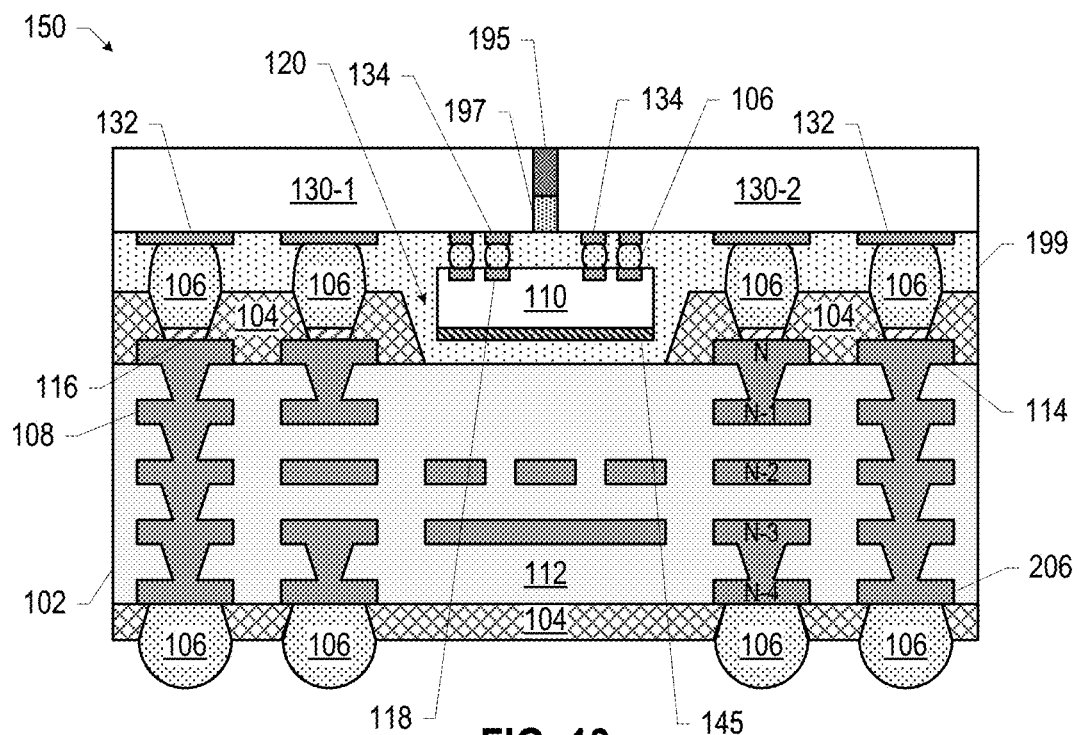
FIGS. 13-14 are side, cross-sectional views of example microelectronic assemblies, in accordance with various embodiments.
Figure 14:
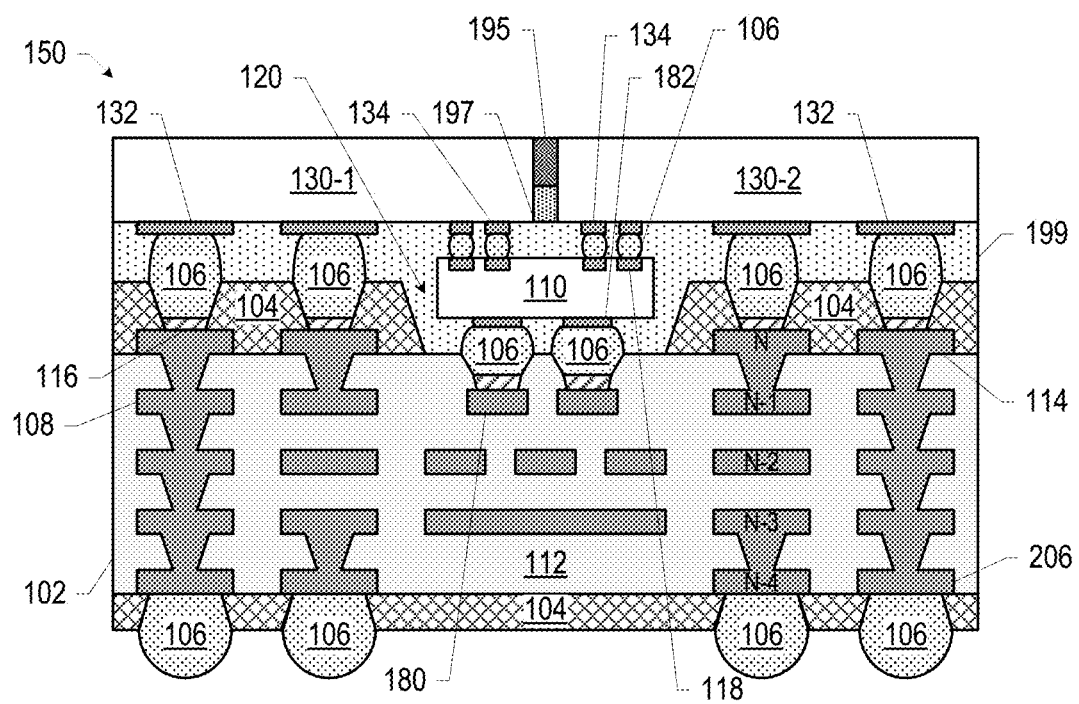

In some embodiments, multiple microelectronic components 130 may be assembled together into a complex that is then coupled to a bridge component 110 and to a substrate 102. Such a complex of microelectronic components 130 may take any of a number of forms. For example, FIGS. 13-14 are side, cross-sectional views of example microelectronic assemblies 150 in which the microelectronic components 130 are mechanically secured together by a dielectric material 195 and a dielectric material 197, in accordance with various embodiments. The dielectric material 195 and the dielectric material 197 may extend around the peripheries of the microelectronic components 130, even though various ones of the accompanying drawings illustrate only a narrower portion of a microelectronic assembly 150. The dielectric material 195 may include a polymer matrix with filler particles therein (e.g., silica). In some embodiments, the dielectric material 195 may have a filler content that is greater than 80 weight-percent (e.g., between 80 weight-percent and 90 weight-percent); in some such embodiments, the dielectric material 195 may be a mold material, and may be provided at the wafer level, as discussed below with reference to FIGS. 15-22. The dielectric material 197 may have a different material composition than the dielectric material 195. The dielectric material 197 may include a polymer matrix with filler particles therein (e.g., silica), but may have a lesser filler content than the dielectric material 195. In some embodiments, the dielectric material 197 may have a filler content that is less than 80 weight-percent (e.g., between 65 weight-percent and 80 weight-percent); in some such embodiments, the dielectric material 197 may be an underfill material, and may be provided at the wafer level, as discussed below with reference to FIGS. 15-22. Another dielectric material 199 may be disposed between the microelectronic components 130 and the substrate 102. The dielectric material 199 may have a different material composition than the dielectric material 197, and a different material composition than the dielectric material 195. The dielectric material 199 may include a polymer matrix with filler particles therein (e.g., silica), but may have a lesser filler content than the dielectric material 197. In some embodiments, the dielectric material 199 may have a filler content that is less than 65 weight-percent (e.g., between 50 weight-percent and 65 weight-percent); in some such embodiments, the dielectric material 199 may be an underfill material, and may be provided at the package level, as discussed below with reference to FIGS. 15-22.

In the embodiment of FIG. 13, the bridge component 110 may be disposed in the cavity 120 of the substrate 102, but may not include conductive contacts 182 at its "bottom" face, and may or may not be in contact with the dielectric material 112 of the substrate 102; instead, as shown, the dielectric material 199 may mechanically secure the bridge component 110 to the substrate 102. In some embodiments, the dielectric material 199 may extend between the bridge component 110 and the dielectric material 112 of the substrate 102, may extend around the side faces of the bridge component 110, and/or may extend between the bridge component 110 and the dielectric material 197, as shown. In the embodiment of FIG. 13, a dielectric material 145 may be present at the "bottom" face of the bridge component 110; the dielectric material 145 may have a same material composition or a different material composition than the dielectric material 199. In some embodiments, the dielectric material 145 may take the form of any of the embodiments of the dielectric material 195 disclosed herein. The dielectric material 145 may serve to provide mechanical support to the bridge component 110 and/or control the warpage of the bridge component 110, and any suitable ones of the bridge components 110 disclosed herein may include such dielectric material. In some embodiments, the dielectric material 145 may have a thickness between 15 microns and 50 microns. In some embodiments, a dielectric material 145 may be present at the "top" face of the bridge component 110, in addition to or instead of at the "bottom" face of the bridge component 110. When conductive contacts of the bridge component 110 are located at a same face as the dielectric material 145, the dielectric material 145 may be overmolded over the conductive contacts, and then the dielectric material 145 may be ground back to expose the conductive contacts.

The embodiment of FIG. 14 has many features in common with the embodiment of FIG. 13, but the bridge component 110 of FIG. 14 may include conductive contacts 182 at its "bottom" face, and these conductive contacts 182 may be coupled to conductive contacts 180 of the substrate 102 by intervening solder 106. As shown in FIG. 14, the dielectric material 199 may at least partially surround the solder 106 between the conductive contacts 180 and the conductive contacts 182. The microelectronic assemblies 150 of FIGS. 13 and 14 may achieve good coplanarity of relevant features without expensive planarization operations (e.g., without chemical mechanical planarization (CMP)) or other difficult and/or expensive fabrication techniques.

Microelectronic assemblies 150 like those illustrated in FIGS. 13 and 14 may be manufactured using any suitable techniques. For example, FIGS. 15-22 are side, cross-sectional views of various stages in an example process for the manufacture of the microelectronic assembly 150 of FIG. 13, in accordance with various embodiments.

Figure 15:
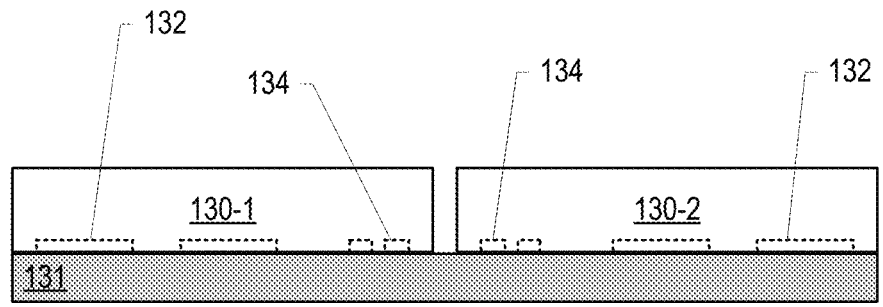
FIGS. 15-22 are side, cross-sectional views of various stages in an example process for the manufacture of the microelectronic assembly of FIG. 13, in accordance with various embodiments.

FIG. 15 illustrates an assembly including a carrier 131 having the microelectronic components 130 thereon. The microelectronic components 130 may be aligned on the carrier 131 so that the desired locations for the conductive contacts 132/134 (indicated with dotted lines in FIG. 15) are aligned with corresponding alignment marks (not shown) on the carrier 131 so as to achieve desired spacing between the microelectronic components 130. In some embodiments, the carrier 131 may be a wafer, and may have one or more release layers (not shown) at the interface between the carrier 131 and the material on the carrier 131. Although the microelectronic components 130 illustrated in FIG. 15 (and others of the accompanying drawings) are depicted as having the same thickness, this is simply for ease of illustration, and the microelectronic components 130 need not have the same thickness. In some embodiments, the microelectronic components 130 of the assembly of FIG. 15 may have been tested prior to their inclusion in the assembly of FIG. 15, and thus may represent "known good" components (e.g., "known good dies"). The assembly of FIG. 15 may be a portion of a "wafer-level" assembly in which multiple units like that illustrated in FIG. 15 are formed together, and then singulated at a later operation into "package-level" units (e.g., as discussed below with reference to FIG. 21).

Figure 16:
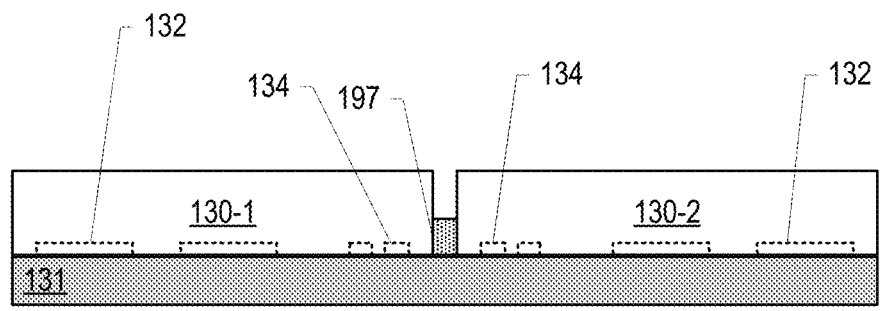

FIG. 16 illustrates an assembly subsequent to providing a dielectric material 197 around the microelectronic components 130 of the assembly of FIG. 15. The dielectric material 197 may help secure the microelectronic components 130 in position relative to each other to mitigate the risk of movement during subsequent manufacturing operations. In some embodiments, a thickness of the dielectric material 197 in the assembly of FIG. 16 (and thus in the microelectronic assemblies of FIGS. 13 and 14) may be between 50 microns and 200 microns. In some embodiments, the dielectric material 197 may be a wafer-level underfill material, as discussed above.

Figure 17:
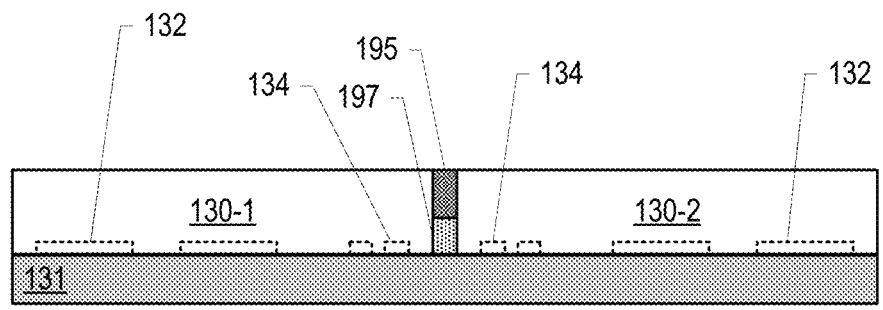

FIG. 17 illustrates an assembly subsequent to providing a dielectric material 195 around the microelectronic components 130 and on the dielectric material 195 of the assembly of FIG. 16. The dielectric material 195 may further secure the microelectronic components 130 in position relative to each other to mitigate the risk of movement during subsequent manufacturing operations. In some embodiments, the dielectric material 195 may be planarized (e.g., using a grinding operation) to remove some or all of the dielectric material 195 on the microelectronic components 130; thus, in some embodiments of the microelectronic assemblies 150 of FIGS. 13-14, dielectric material 195 may be present on the "back" faces of the microelectronic components 130 (e.g., such that the microelectronic components 130 are between some of the dielectric material 195 and the substrate 102). In some embodiments, the dielectric material 195 may be a wafer-level mold material, as discussed above.

Figure 18:
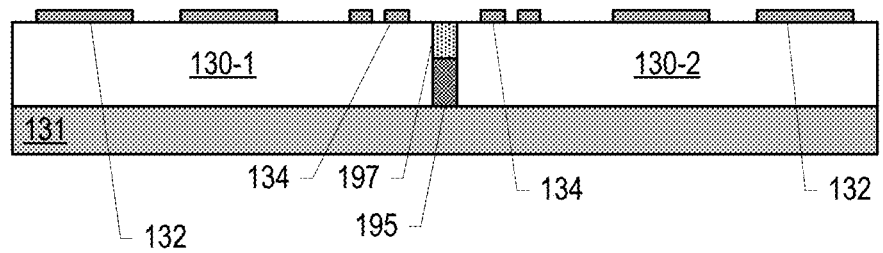

FIG. 18 illustrates an assembly subsequent to removing the carrier 131 from the assembly of FIG. 17, "flipping" the result, attaching another carrier 131 to the planarized surface proximate to the "back" faces of the microelectronic components 130, and then forming the conductive contacts 132/134 thereon. In some embodiments, the conductive contacts 132/134 may include copper and may take the form of conductive pillars (e.g., copper pillars).

Figure 19:
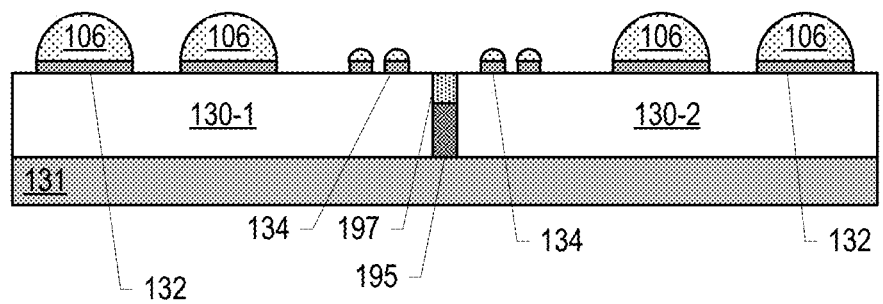

FIG. 19 illustrates an assembly subsequent to providing solder 106 on the conductive contacts 132/134 of the assembly of FIG. 18. In some embodiments, the solder 106 may be provided as solder bumps.

Figure 20:
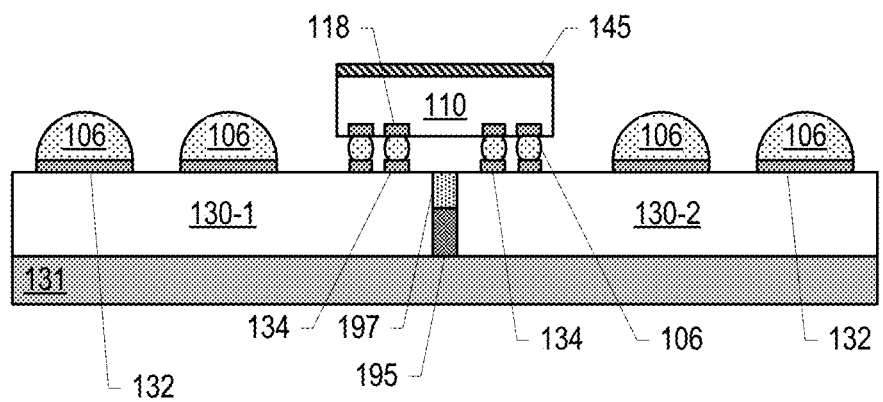

FIG. 20 illustrates an assembly subsequent to bonding a bridge component 110 (with dielectric material 145 thereon) to the assembly of FIG. 19 by bonding conductive contacts 118 of the bridge component 110 to the conductive contacts 134 of the microelectronic components 103 via the intervening solder 106. In some embodiments, an underfill material (not shown) may be provided between the bridge component 110 and the microelectronic components 130; such a material may be present in any of the embodiments disclosed herein, and in some embodiments, may take the form of any of the embodiments of the dielectric material 197 disclosed herein, or may be an epoxy flux.

Figure 21:
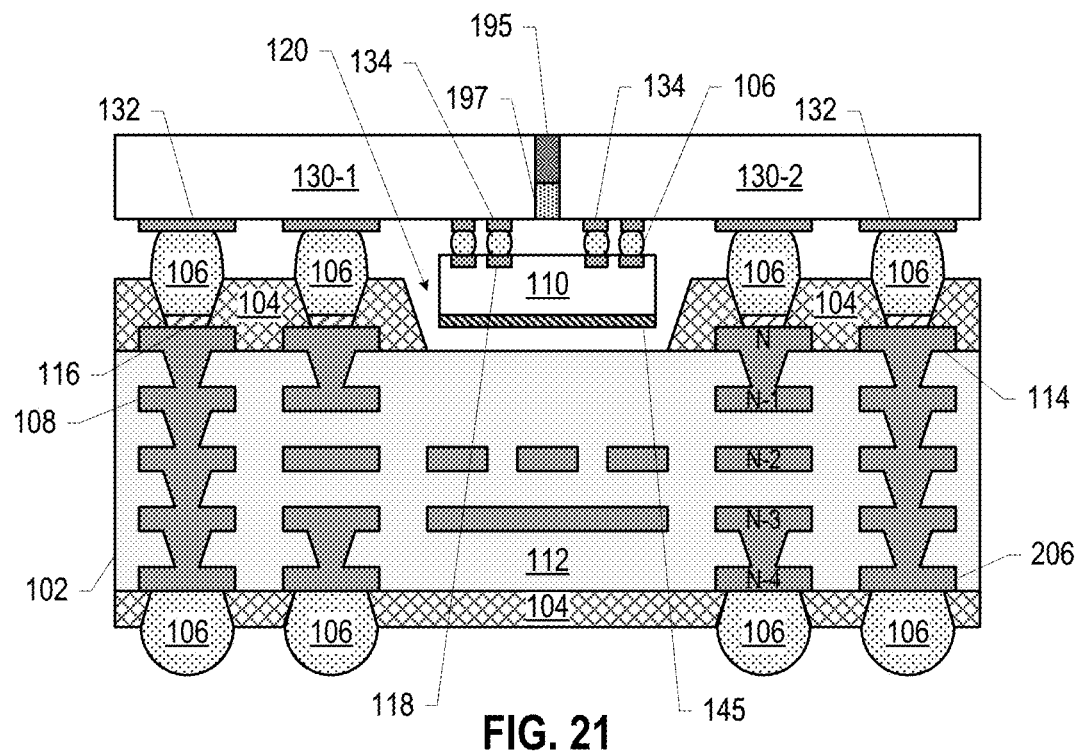

FIG. 21 illustrates an assembly subsequent to removing the carrier 131 of FIG. 20 and coupling the result to the substrate 102. In embodiments in which multiple ones of the microelectronic assemblies 150 of FIG. 13 are being manufactured simultaneously, the different microelectronic assemblies 150 may be singulated into "package-level" components as part of the operations of FIG. 21. In the assembly of FIG. 21, the conductive contacts 132 may be bonded to the conductive contacts 114 by intervening solder 106. In some embodiments, this bonding may include a mass reflow operation, and the forces between the solder 106 and the conductive contacts 118 and 134 may be adequate to hold the bridge component 110 in place during the mass reflow.

Figure 22:
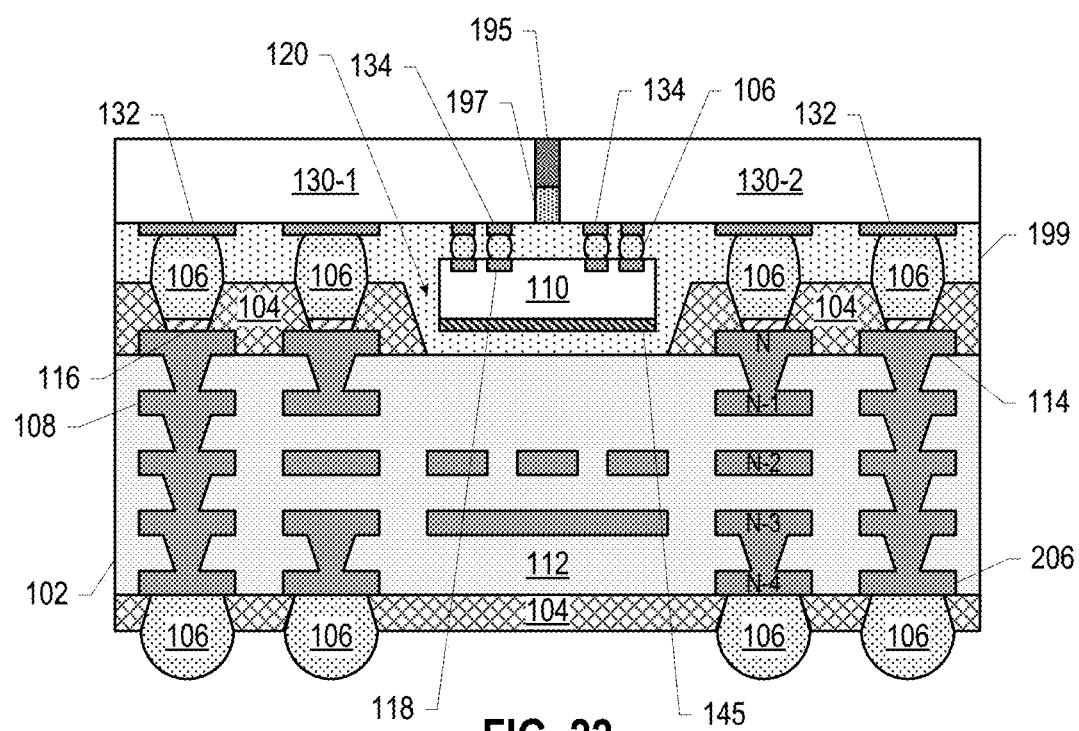

FIG. 22 illustrates an assembly subsequent to providing the dielectric material 199 between the substrate 102, the bridge component 110, and the microelectronic components 130. In some embodiments, the spacing between the bridge component 110 and the proximate materials of the substrate 102 may be at least 10 microns to permit the dielectric material 199 to reach these spaces. Similarly, in some embodiments, the spacing between the bridge component 110 and the microelectronic components 130 may be at least 10 microns to permit the dielectric material 199 to reach these spaces. In some embodiments, the dielectric material 199 may be a package-level underfill material, as discussed above. The assembly of FIG. 22 may take the form of the microelectronic assembly 150 of FIG. 13. The microelectronic assembly 150 of FIG. 14 may be manufactured using a process similar to that illustrated in FIGS. 15-22, but in which the bonding operations discussed above with reference to FIG. 21 (e.g., the mass reflow) may also include bonding the conductive contacts 182 of the bridge component 110 to the conductive contacts 180 of the substrate 102 by intervening solder 106.

Figure 23:
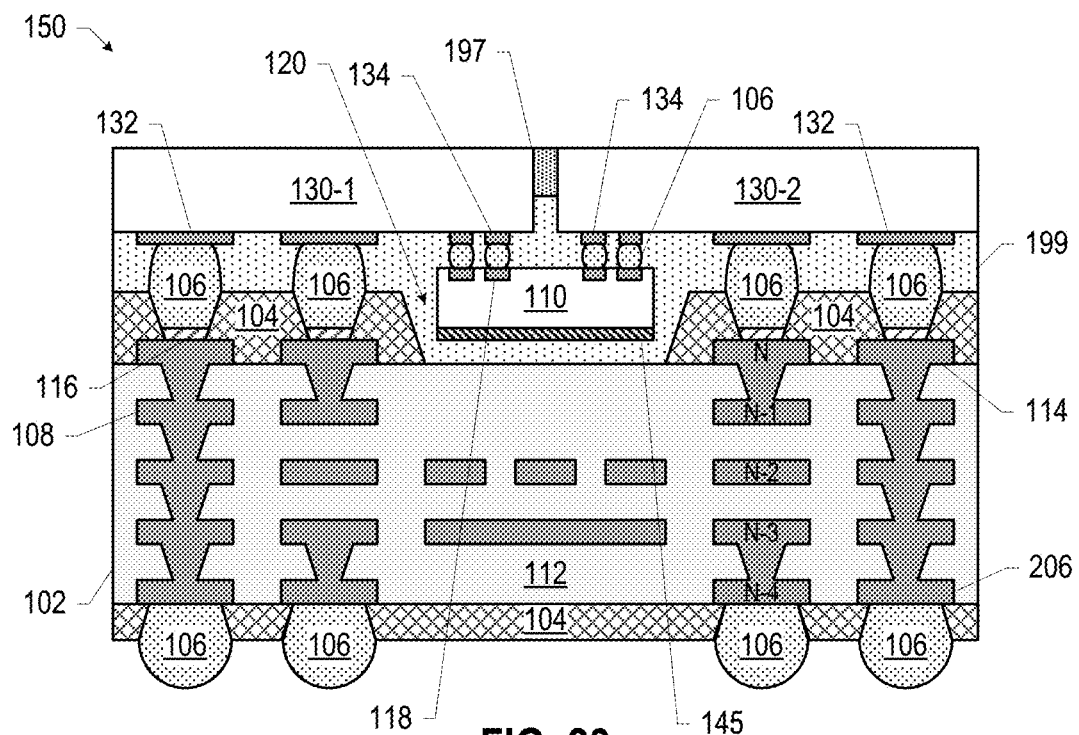
FIGS. 23-24 are side, cross-sectional views of example microelectronic assemblies, in accordance with various embodiments.
Figure 24:
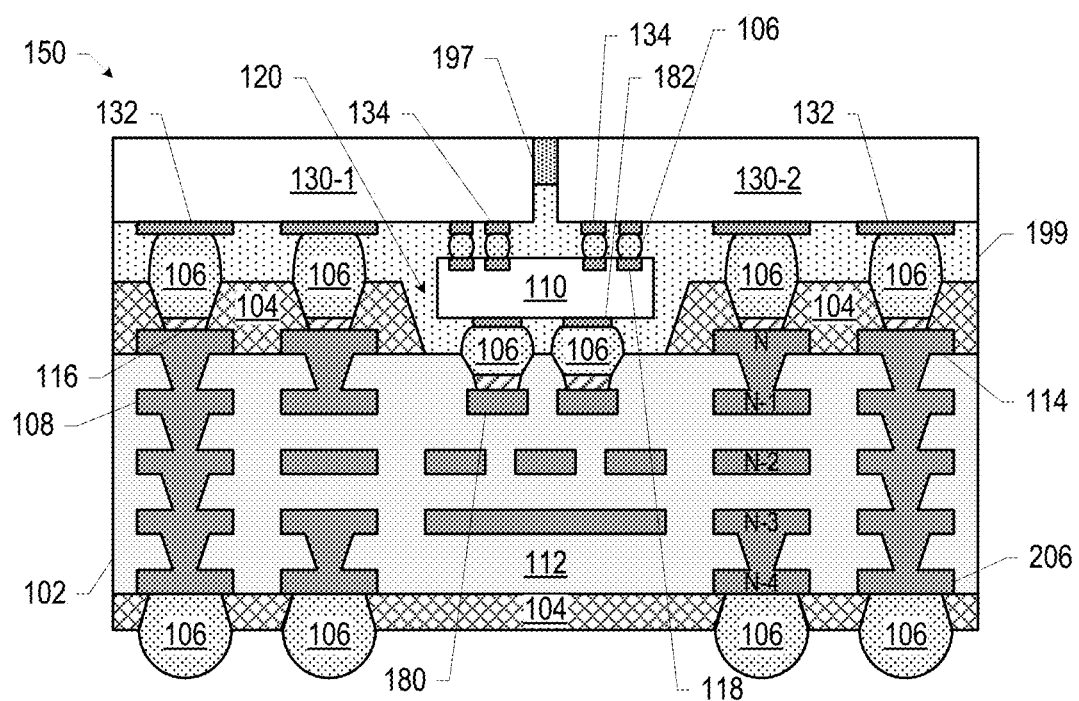

FIGS. 23-24 illustrate other examples of microelectronic assemblies 150 in which multiple microelectronic components 130 are assembled into a complex. In particular, FIGS. 23-24 are side, cross-sectional views of example microelectronic assemblies 150 in which the microelectronic components 130 are mechanically secured together by a dielectric material 197, in accordance with various embodiments. The dielectric material 197 may extend around the peripheries of the microelectronic components 130, even though various ones of the accompanying drawings illustrate only a narrower portion of a microelectronic assembly 150. The dielectric material 197 of FIGS. 23-24 may take any of the forms disclosed herein (e.g., any of the forms of the dielectric material 197 discussed above with reference to FIGS. 13-14). Another dielectric material 199 may be disposed between the microelectronic components 130 and the substrate 102, and may extend into the volume between the microelectronic components 130. Further, the dielectric material 199 may extend around the peripheries of the microelectronic components 130 (not shown). The dielectric material 199 of FIGS. 23-24 may take any of the forms disclosed herein (e.g., any of the forms of the dielectric material 199 discussed above with reference to FIGS. 13-14).

In the embodiment of FIG. 23, the bridge component 110 may be disposed in the cavity 120 of the substrate 102, but may not include conductive contacts 182 at its "bottom" face, and may or may not be in contact with the dielectric material 112 of the substrate 102; instead, as shown, the dielectric material 199 may mechanically secure the bridge component 110 to the substrate 102. The embodiment of FIG. 23 shares many features with the embodiment of FIG. 13, and a discussion of these features will not be repeated for ease of illustration.

The embodiment of FIG. 24 has many features in common with the embodiment of FIG. 23, but the bridge component 110 of FIG. 24 may include conductive contacts 182 at its "bottom" face, and these conductive contacts 182 may be coupled to conductive contacts 180 of the substrate 102 by intervening solder 106. The embodiment of FIG. 24 shares many features with the embodiment of FIG. 14, and a discussion of these features will not be repeated for ease of illustration. Like the microelectronic assemblies 150 of FIGS. 13 and 14, the microelectronic assemblies 150 of FIGS. 23 and 24 may achieve good coplanarity of relevant features without expensive planarization operations (e.g., without CMP) or other difficult and/or expensive fabrication techniques.

Microelectronic assemblies 150 like those illustrated in FIGS. 23 and 24 may be manufactured using any suitable techniques. For example, FIGS. 25-27 are side, cross-sectional views of various stages in an example process for the manufacture of the microelectronic assembly 150 of FIG. 23, in accordance with various embodiments.

Figure 25:
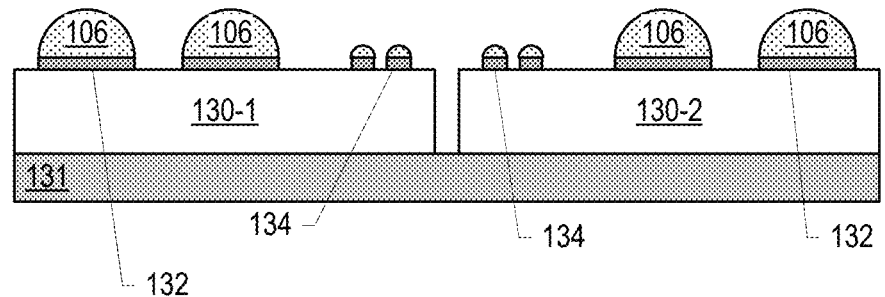
FIGS. 25-27 are side, cross-sectional views of various stages in an example process for the manufacture of the microelectronic assembly of FIG. 23, in accordance with various embodiments.

FIG. 25 illustrates an assembly including a carrier 131 having the microelectronic components 130 thereon. The microelectronic components 130 may be "face up" on the carrier 131 so that the conductive contacts 132/134 are exposed. The carrier 131 may take any of the forms disclosed herein. The conductive contacts 132/134 may have solder 106 disposed thereon prior to coupling the microelectronic components 130 to the carrier 131, or the solder 106 may be disposed on the conductive contacts 132/134 after the microelectronic components 130 are secured to the carrier 131. In some embodiments, the microelectronic components 130 of the assembly of FIG. 25 may have been tested prior to their inclusion in the assembly of FIG. 25, and thus may represent "known good" components (e.g., "known good dies"). The assembly of FIG. 25 may be a portion of a "wafer-level" assembly in which multiple units like that illustrated in FIG. 25 are formed together, and then singulated at a later operation into "package-level" units.

Figure 26:
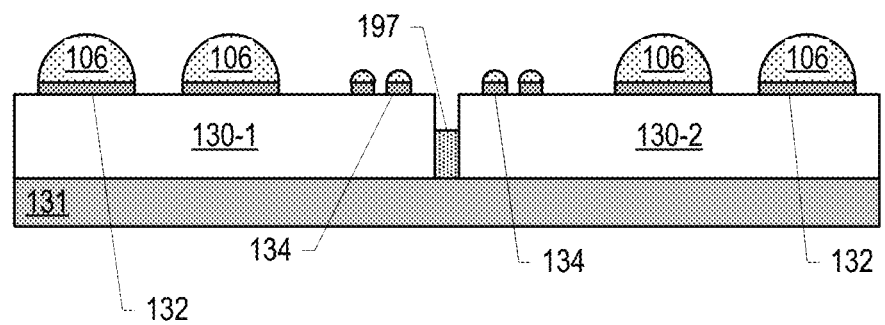

FIG. 26 illustrates an assembly subsequent to providing a dielectric material 197 around the microelectronic components 130 of the assembly of FIG. 25. The dielectric material 197 may help secure the microelectronic components 130 in position relative to each other to mitigate the risk of movement during subsequent manufacturing operations. In some embodiments, a thickness of the dielectric material 197 in the assembly of FIG. 26 (and thus in the microelectronic assemblies of FIGS. 23 and 24) may be between 50 microns and 200 microns. In some embodiments, the dielectric material 197 may be a wafer-level underfill material, as discussed above.

Figure 27:
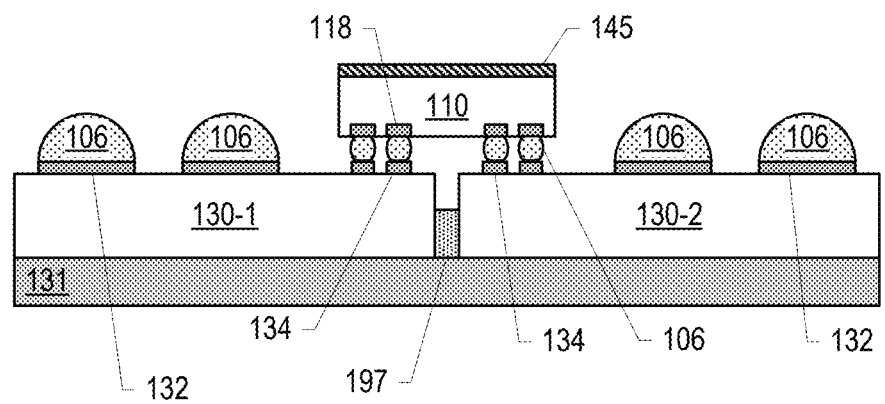

FIG. 27 illustrates an assembly subsequent to bonding a bridge component 110 (with dielectric material 145 thereon) to the assembly of FIG. 26 by bonding conductive contacts 118 of the bridge component 110 to the conductive contacts 134 of the microelectronic components 103 via the intervening solder 106. Fabrication may continue by performing the operations discussed above with reference to FIGS. 21-22 on the assembly of FIG. 27, resulting in an assembly that may take the form of the microelectronic assembly 150 of FIG. 23. The microelectronic assembly 150 of FIG. 24 may be manufactured using a process similar to that discussed with reference to FIGS. 25-27 and 21-22, but in which the bonding operations discussed above with reference to FIG. 21 (e.g., the mass reflow) may also include bonding the conductive contacts 182 of the bridge component 110 to the conductive contacts 180 of the substrate 102 by intervening solder 106.

Figure 28:
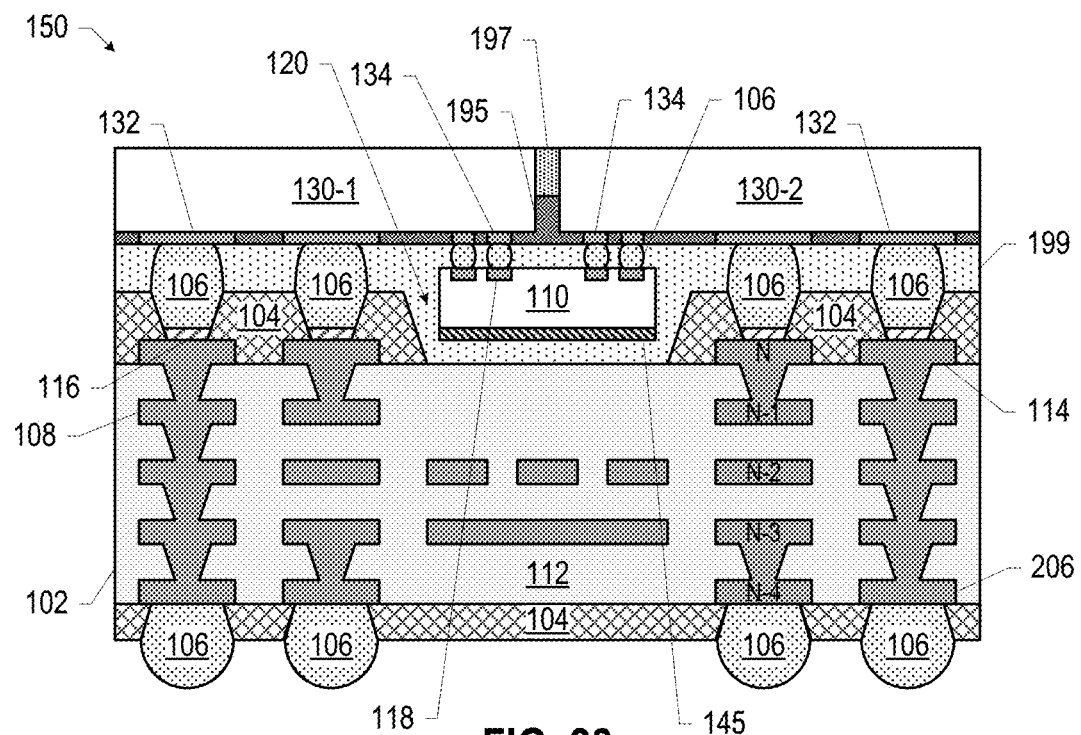
FIGS. 28-29 are side, cross-sectional views of example microelectronic assemblies, in accordance with various embodiments.
Figure 29:
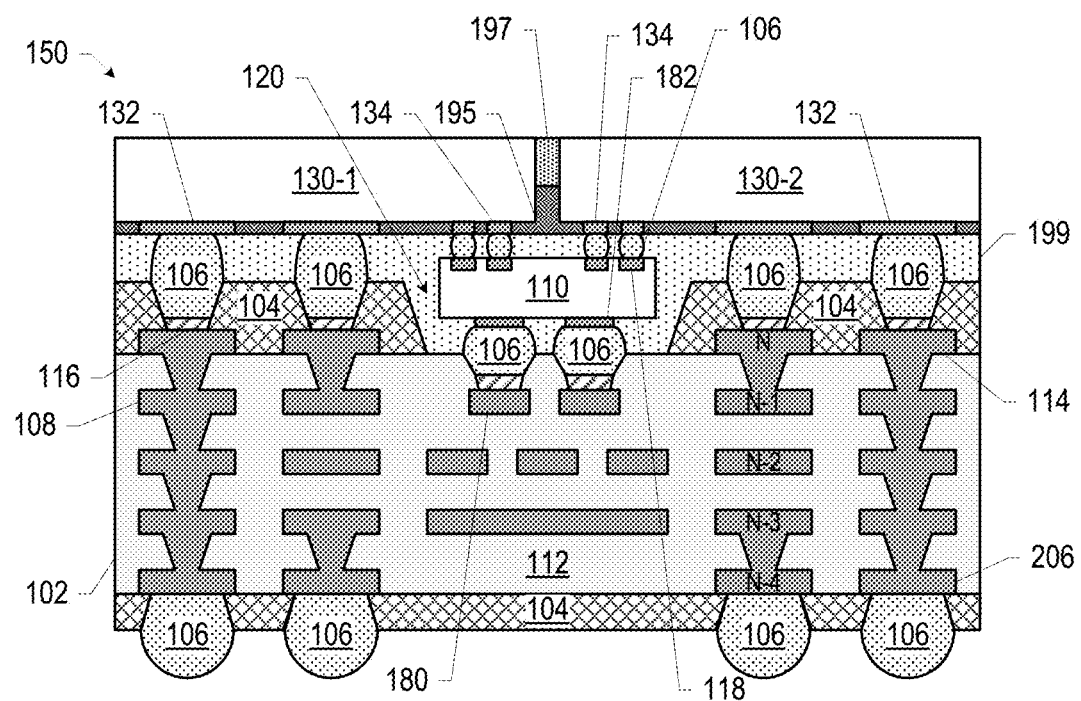

FIGS. 28-29 illustrate other examples of microelectronic assemblies 150 in which multiple microelectronic components 130 are assembled into a complex. In particular, FIGS. 23-24 are side, cross-sectional views of example microelectronic assemblies 150 in which the microelectronic components 130 are mechanically secured together by a dielectric material 197 and a dielectric material 195, in accordance with various embodiments. The dielectric material 197 and the dielectric material 195 may extend around the peripheries of the microelectronic components 130, even though various ones of the accompanying drawings illustrate only a narrower portion of a microelectronic assembly 150. The dielectric material 197 may take any of the forms disclosed herein (e.g., any of the forms of the dielectric material 197 discussed above with reference to FIGS. 13-14), and the dielectric material 195 may take any of the forms disclosed herein (e.g., any of the forms of the dielectric material 195 discussed above with reference to FIGS. 13-14). In contrast to the embodiment of FIGS. 13-14 (in which the dielectric material 197 is between the dielectric material 195 and the substrate 102), in the microelectronic assemblies 150 of FIGS. 28-29, the dielectric material 195 may be between the dielectric material 197 and the substrate 102. Further, in some embodiments, the dielectric material 195 may extend onto the "bottom" faces of the microelectronic components 130 so as to be adjacent to the conductive contacts 132/134, as shown. In some embodiments, a thickness of the dielectric material 195 on the "bottom" faces of the microelectronic components 130 may be between 2 microns and 20 microns. Another dielectric material 199 may be disposed between the microelectronic components 130 and the substrate 102. The dielectric material 199 may take any of the forms disclosed herein (e.g., any of the forms of the dielectric material 199 discussed above with reference to FIGS. 13-14).

In the embodiment of FIG. 28, the bridge component 110 may be disposed in the cavity 120 of the substrate 102, but may not include conductive contacts 182 at its "bottom" face, and may or may not be in contact with the dielectric material 112 of the substrate 102; instead, as shown, the dielectric material 199 may mechanically secure the bridge component 110 to the substrate 102. The embodiment of FIG. 28 shares many features with the embodiment of FIG. 13, and a discussion of these features will not be repeated for ease of illustration.

The embodiment of FIG. 29 has many features in common with the embodiment of FIG. 28, but the bridge component 110 of FIG. 29 may include conductive contacts 182 at its "bottom" face, and these conductive contacts 182 may be coupled to conductive contacts 180 of the substrate 102 by intervening solder 106. The embodiment of FIG. 29 shares many features with the embodiment of FIG. 14, and a discussion of these features will not be repeated for ease of illustration. Like the microelectronic assemblies 150 of FIGS. 13-14 and 23-24, the microelectronic assemblies 150 of FIGS. 28 and 29 may achieve good coplanarity of relevant features without expensive planarization operations (e.g., without CMP) or other difficult and/or expensive fabrication techniques.

Microelectronic assemblies 150 like those illustrated in FIGS. 28 and 29 may be manufactured using any suitable techniques. For example, FIGS. 30-32 are side, cross-sectional views of various stages in an example process for the manufacture of the microelectronic assembly 150 of FIG. 28, in accordance with various embodiments.

Figure 30:
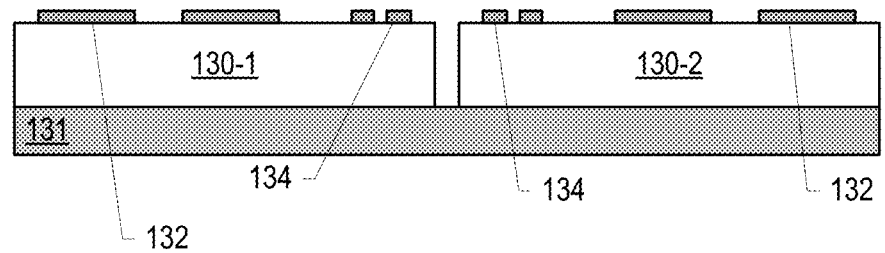
FIGS. 30-32 are side, cross-sectional views of various stages in an example process for the manufacture of the microelectronic assembly of FIG. 28, in accordance with various embodiments.

FIG. 30 illustrates an assembly including a carrier 131 having the microelectronic components 130 thereon. The microelectronic components 130 may be "face up" on the carrier 131 so that the conductive contacts 132/134 are exposed. The carrier 131 may take any of the forms disclosed herein. In some embodiments, the microelectronic components 130 of the assembly of FIG. 30 may have been tested prior to their inclusion in the assembly of FIG. 30, and thus may represent "known good" components (e.g., "known good dies"). The assembly of FIG. 30 may be a portion of a "wafer-level" assembly in which multiple units like that illustrated in FIG. 30 are formed together, and then singulated at a later operation into "package-level" units.

Figure 31:
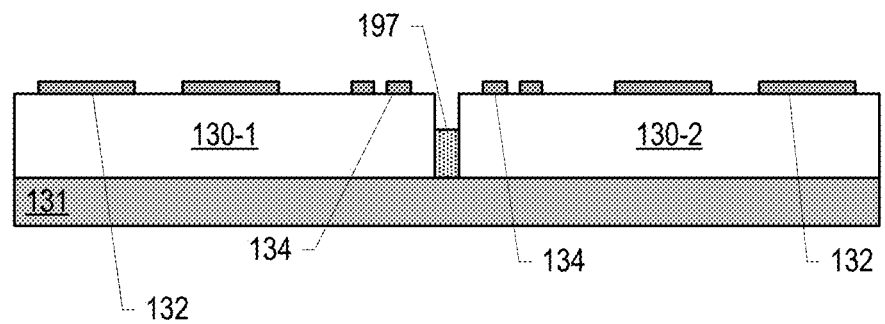

FIG. 31 illustrates an assembly subsequent to providing a dielectric material 197 around the microelectronic components 130 of the assembly of FIG. 30. The dielectric material 197 may help secure the microelectronic components 130 in position relative to each other to mitigate the risk of movement during subsequent manufacturing operations. In some embodiments, a thickness of the dielectric material 197 in the assembly of FIG. 26 (and thus in the microelectronic assemblies of FIGS. 28 and 29) may be between 50 microns and 200 microns. In some embodiments, the dielectric material 197 may be a wafer-level underfill material, as discussed above.

Figure 32:
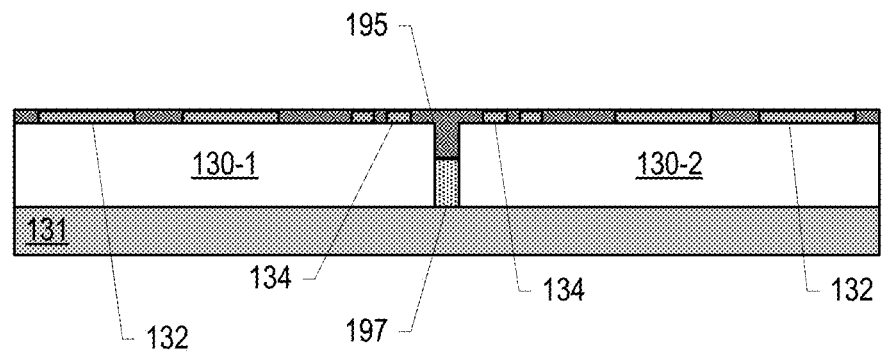

FIG. 32 illustrates an assembly subsequent to providing a dielectric material 195 around the microelectronic components 130 of the assembly of FIG. 31. The dielectric material 195 may further help secure the microelectronic components 130 in position relative to each other to mitigate the risk of movement during subsequent manufacturing operations. In some embodiments, the dielectric material 195 may be a wafer-level mold material, as discussed above. As shown in FIG. 32, the dielectric material 195 may extend up onto the exposed faces of the microelectronic components 130 so as to be laterally adjacent to the conductive contacts 132/134. In some embodiments, the dielectric material 195 may be deposited and then ground back to reveal the conductive contacts 132/134, resulting in an exposed surface of the dielectric material 195 that is coplanar with the exposed surfaces of the conductive contacts 132/134. Fabrication may continue by performing the operations discussed above with reference to FIGS. 20-22 on the assembly of FIG. 32, resulting in an assembly that may take the form of the microelectronic assembly 150 of FIG. 28. The microelectronic assembly 150 of FIG. 29 may be manufactured using a process similar to that discussed with reference to FIGS. 30-32 and 20-22, but in which the bonding operations discussed above with reference to FIG. 21 (e.g., the mass reflow) may also include bonding the conductive contacts 182 of the bridge component 110 to the conductive contacts 180 of the substrate 102 by intervening solder 106.

Figure 33:
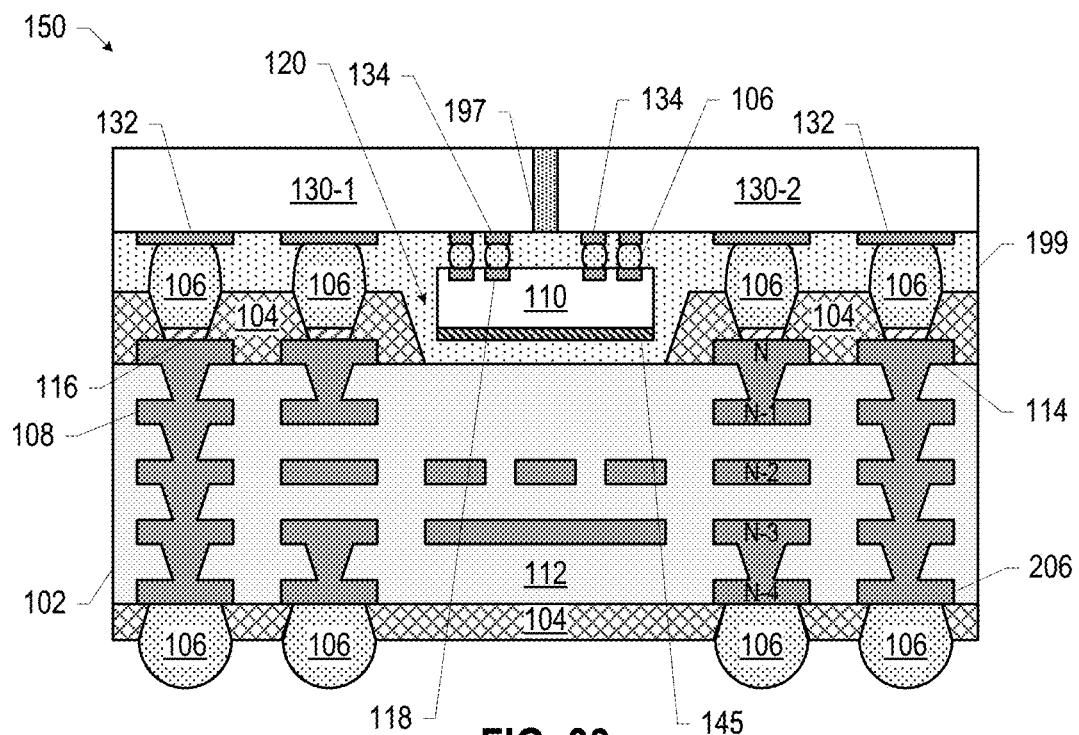
FIGS. 33-40 are side, cross-sectional views of example microelectronic assemblies, in accordance with various embodiments.
Figure 34:
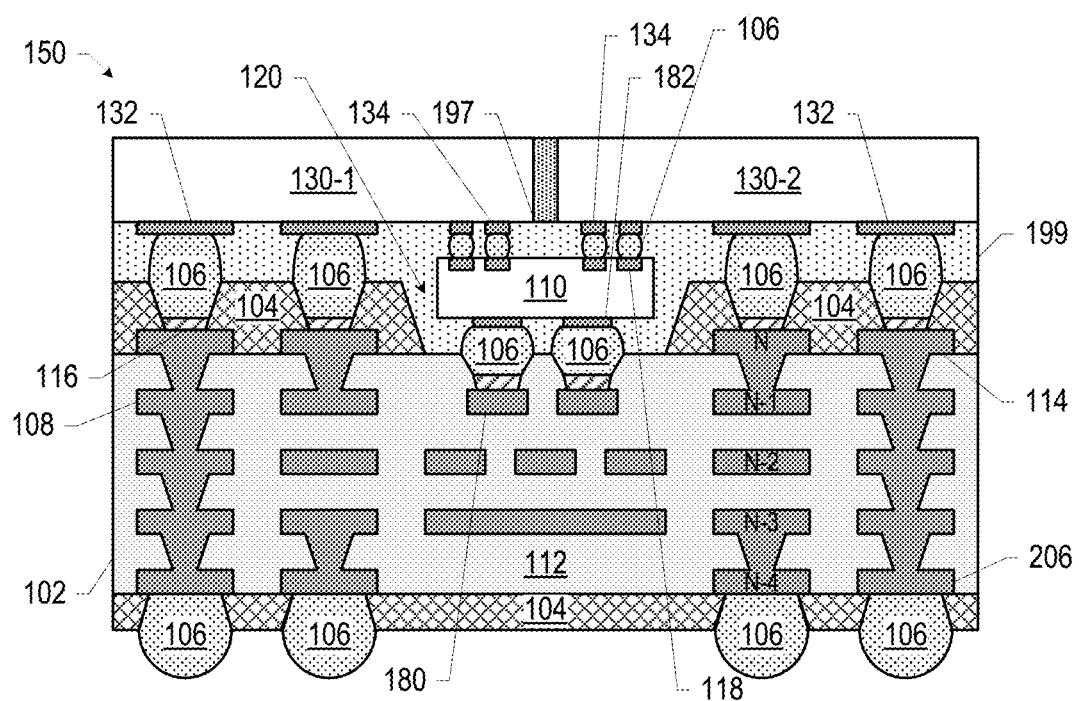

FIGS. 33-34 illustrate other examples of microelectronic assemblies 150 in which multiple microelectronic components 130 are assembled into a complex. In particular, FIGS. 33-34 are side, cross-sectional views of example microelectronic assemblies 150 in which the microelectronic components 130 are mechanically secured together by a dielectric material 197, in accordance with various embodiments. The dielectric material 197 may extend around the peripheries of the microelectronic components 130, even though various ones of the accompanying drawings illustrate only a narrower portion of a microelectronic assembly 150. The dielectric material 197 may take any of the forms disclosed herein (e.g., any of the forms of the dielectric material 197 discussed above with reference to FIGS. 13-14). Another dielectric material 199 may be disposed between the microelectronic components 130 and the substrate 102. The dielectric material 199 may take any of the forms disclosed herein (e.g., any of the forms of the dielectric material 199 discussed above with reference to FIGS. 13-14).

The embodiments of FIGS. 33-34 may be similar to the embodiments of FIGS. 13-14, respectively, but may differ in that the embodiments of FIGS. 33-34 may not include a dielectric material 195, and instead, the dielectric material 197 may fill the volume between the microelectronic components 130 and may have a "bottom" face that is coplanar with "bottom" faces of the microelectronic components 130, as shown. Like the microelectronic assemblies 150 of FIGS. 13-14, 23-24, and 28-29, the microelectronic assemblies 150 of FIGS. 33 and 34 may achieve good coplanarity of relevant features without expensive planarization operations (e.g., without CMP) or other difficult and/or expensive fabrication techniques. Microelectronic assemblies 150 like those illustrated in FIGS. 33 and 34 may be manufactured using any suitable techniques. For example, the microelectronic assemblies 150 of FIGS. 33-34 may be manufactured using a process like that of FIGS. 15-22, but in which the dielectric material 197 is deposited and ground so as to have a "top" surface coplanar with the "top" surfaces of the microelectronic components 130 in the assembly of FIG. 16, and in which the operations related to the dielectric material 195 are omitted.

Figure 35:
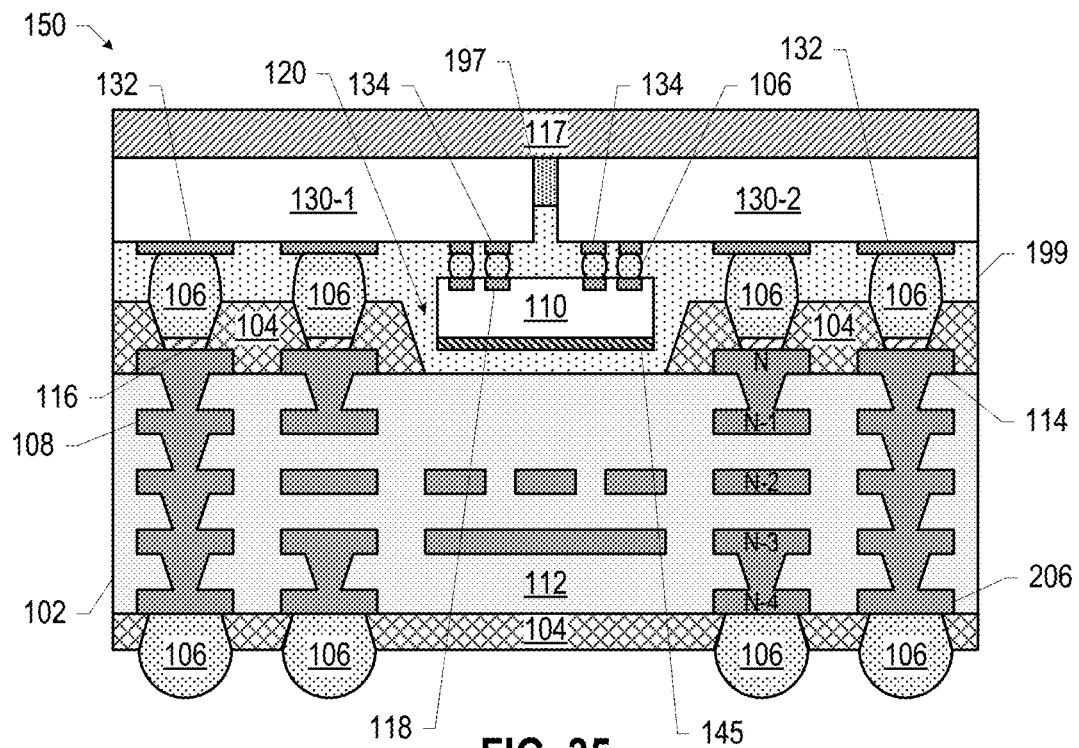
Figure 36:
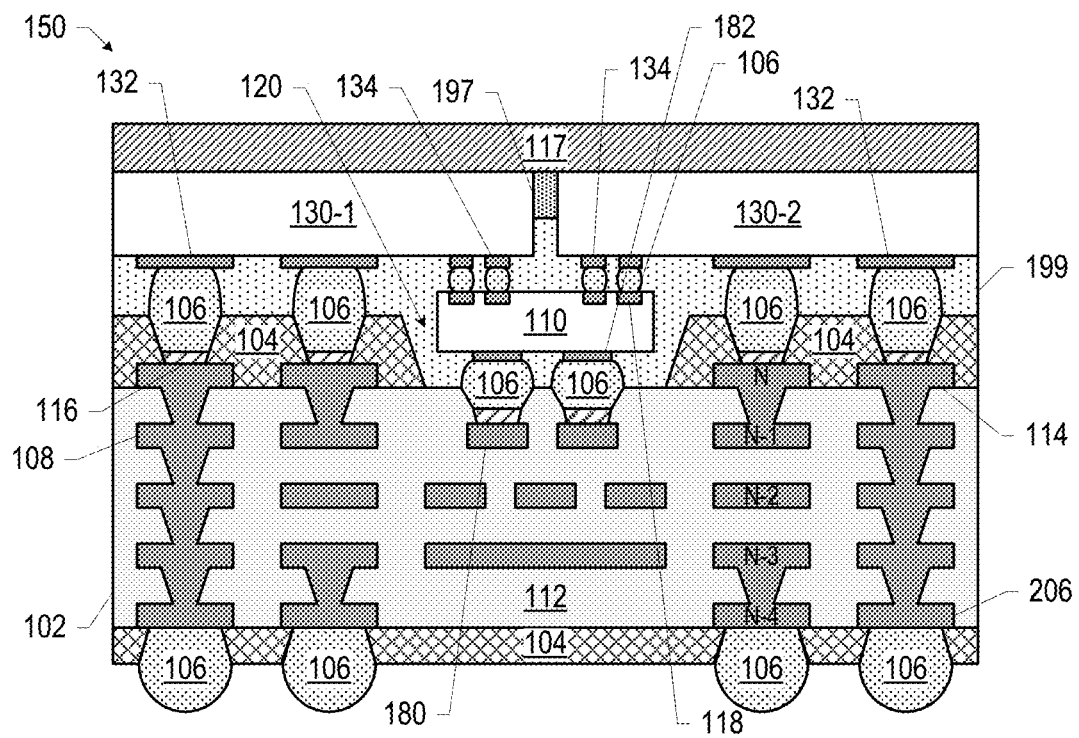
Figure 37:
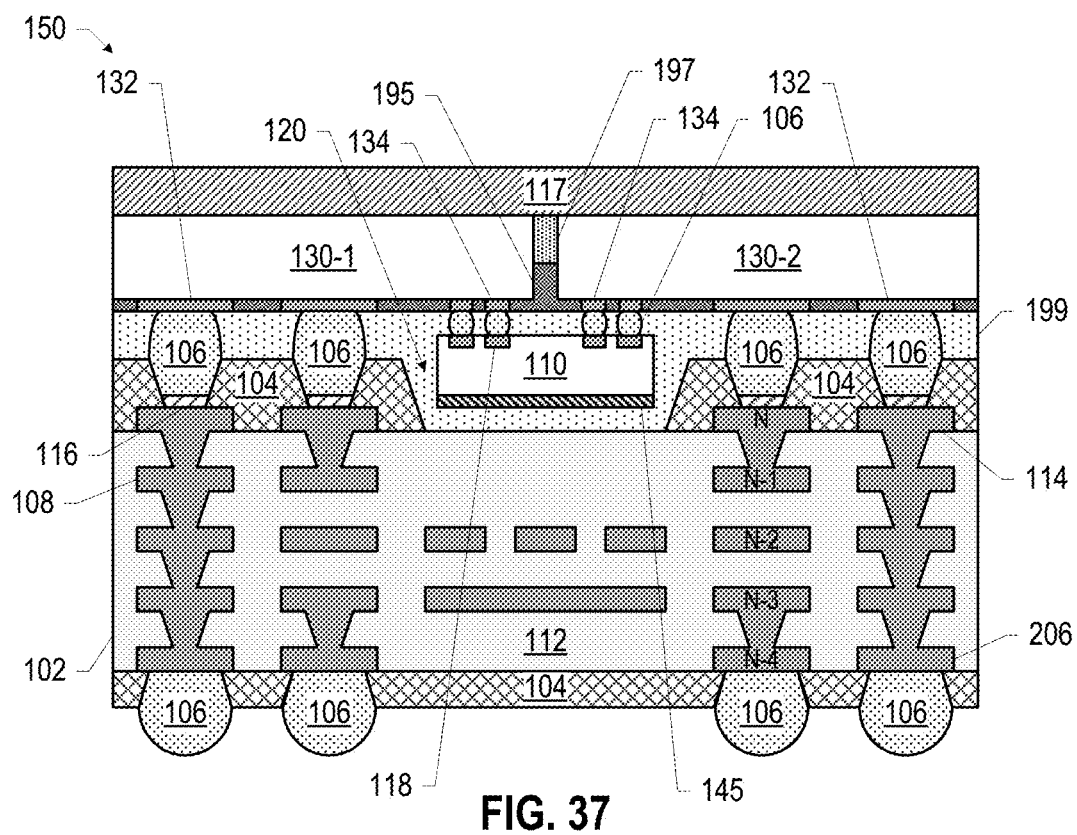
Figure 38:
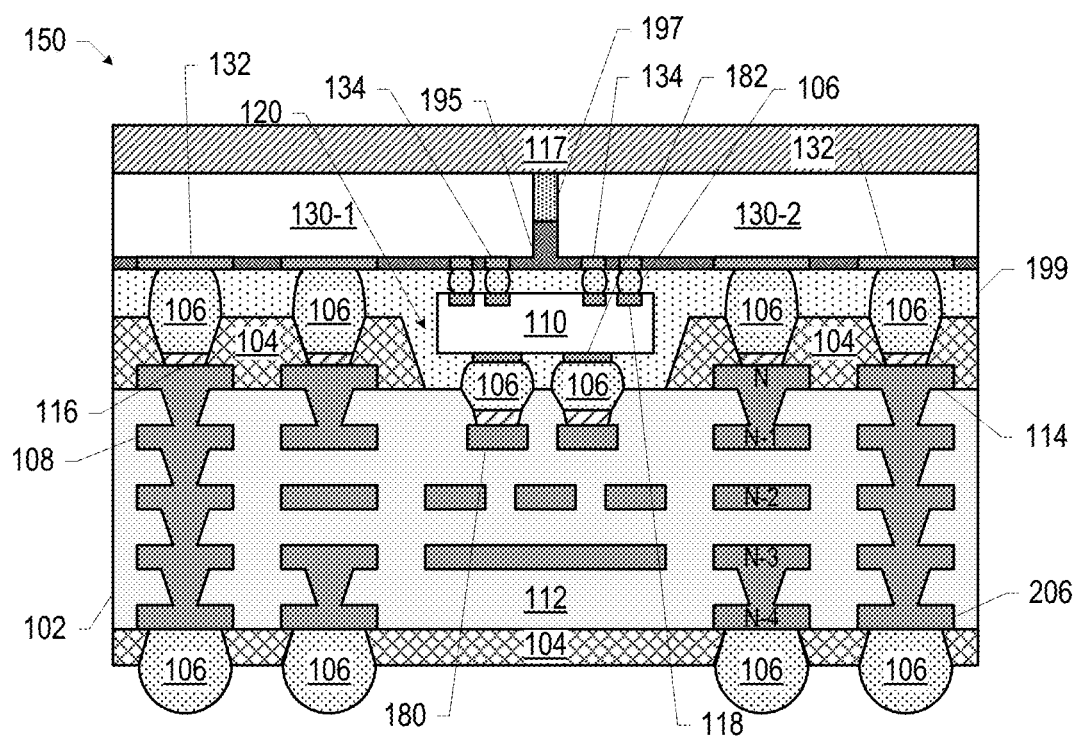

In some embodiments, a microelectronic assembly 150 may include a support material at the "top" faces of the microelectronic components 130 to provide further mechanical support. For example, FIGS. 35-36 are side, cross-sectional views of example microelectronic assemblies 150 sharing many features with the microelectronic assemblies 150 illustrated in FIGS. 23-24, respectively, and in which a support material 117 is present so that the microelectronic components 130 are between the support material 117 and the substrate 102. Further, FIGS. 37-38 are side, cross-sectional views of example microelectronic assemblies 150 sharing many features with the microelectronic assemblies 150 illustrated in FIGS. 28-29, respectively, and in which a support material 117 is present so that the microelectronic components 130 are between the support material 117 and the substrate 102. The support material 117 of the microelectronic assemblies of FIGS. 35-38 may serve as a base for "reconstitution" of the microelectronic components 130 into a complex that can then be further processed, and as such, the support material 117 may include any suitable material for providing a reconstitution base for the microelectronic components 130. In some embodiments, the support material 117 may include silicon (and may, for example, be bonded to the microelectronic components 130 via oxide-to-oxide bonding). In some embodiments, the support material 117 may include glass. In some embodiments, the support material 117 may include a metal, such as copper. In some embodiments, the microelectronic components 130 may be secured to the support material 117 by an adhesive, such as a DAF. In some embodiments, the microelectronic components 130 may be secured to the support material 117 by a solder thermal interface material (STIM). In some embodiments, the microelectronic components 130 may be secured to the support material 117 by a sinterable epoxy. Any one or more of these attachment materials may be selected to provide adequate thermal conductivity as well as adequate mechanical support. In some embodiments, the support material 117 may have a thickness between 100 microns and 500 microns (e.g., between 100 microns and 400 microns).

In the particular embodiments illustrated in FIGS. 35-38 (and in others of the drawings including a support material 117), the support material 117 is depicted as a unitary portion of material that contacts the "top" faces of multiple microelectronic components 130. This is simply illustrative, and any of the microelectronic assemblies 150 disclosed herein may include support materials 117 in which the support material 117 is present in different, individual portions coupled to the "top" face of the associated different, individual microelectronic component 130.

Microelectronic assemblies 150 like those illustrated in FIGS. 35-38 may be manufactured using any suitable techniques. For example, the microelectronic assemblies 150 of FIGS. 35-36 may be manufactured substantially as discussed above with reference to the manufacture of FIGS. 23-24, respectively, but the assembly of FIG. 25 may have the support material 117 disposed between the carrier 131 and the microelectronic components 130; in some embodiments, the carrier 131 may be coupled to the support material 117 by a release layer. In another example, the microelectronic assemblies 150 of FIGS. 37-38 may be manufactured substantially as discussed above with reference to the manufacture of FIGS. 28-29, respectively, but the assembly of FIG. 30 may have the support material 117 disposed between the carrier 131 and the microelectronic components 130; in some embodiments, the carrier 131 may be coupled to the support material 117 by a release layer. In embodiments in which the support material 117 is provided in different portions for each different microelectronic component 130, the support material 117 may be attached to the microelectronic component 130 before the microelectronic component 130 is brought into the assembly.

Figure 39:
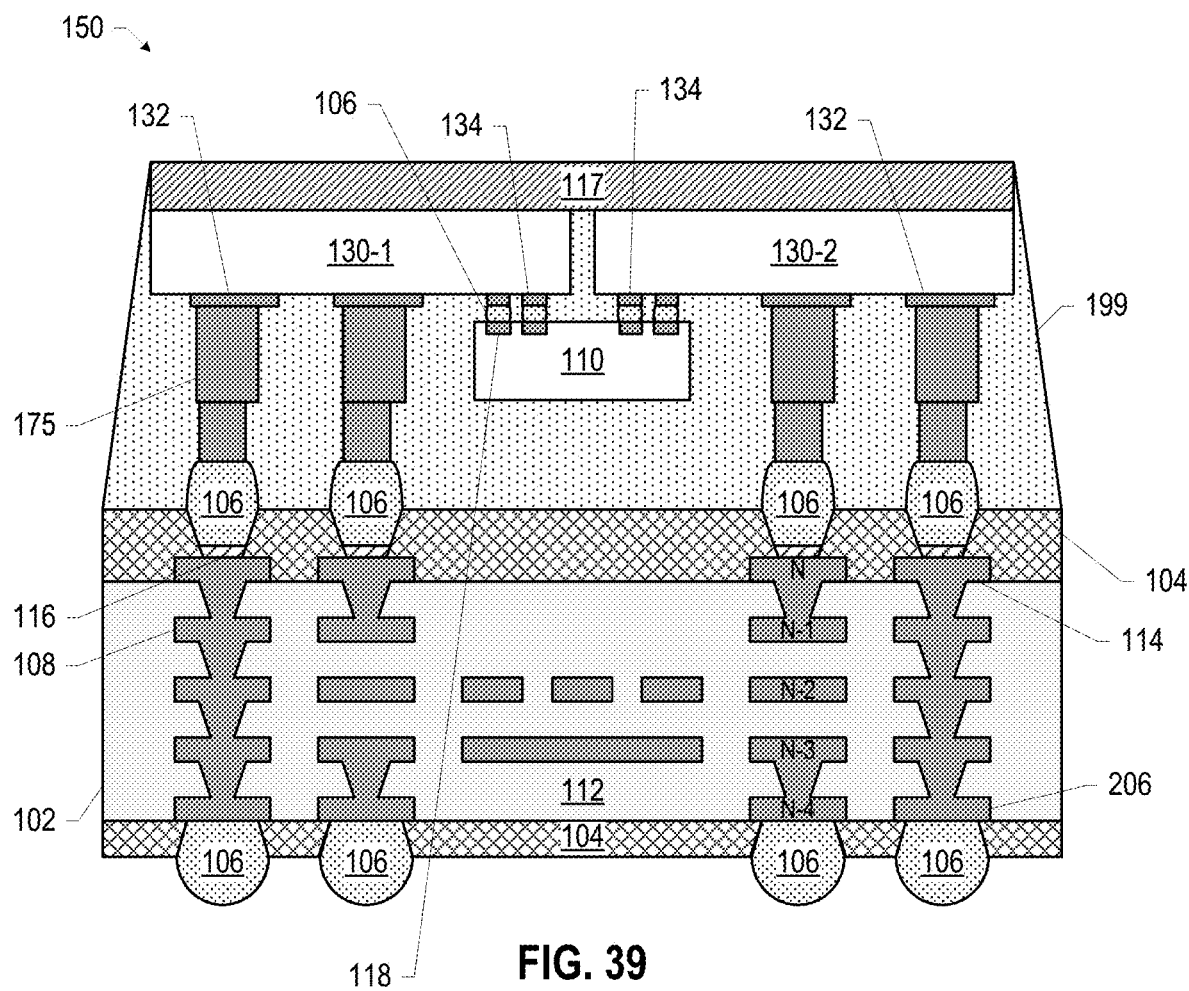
Figure 40:
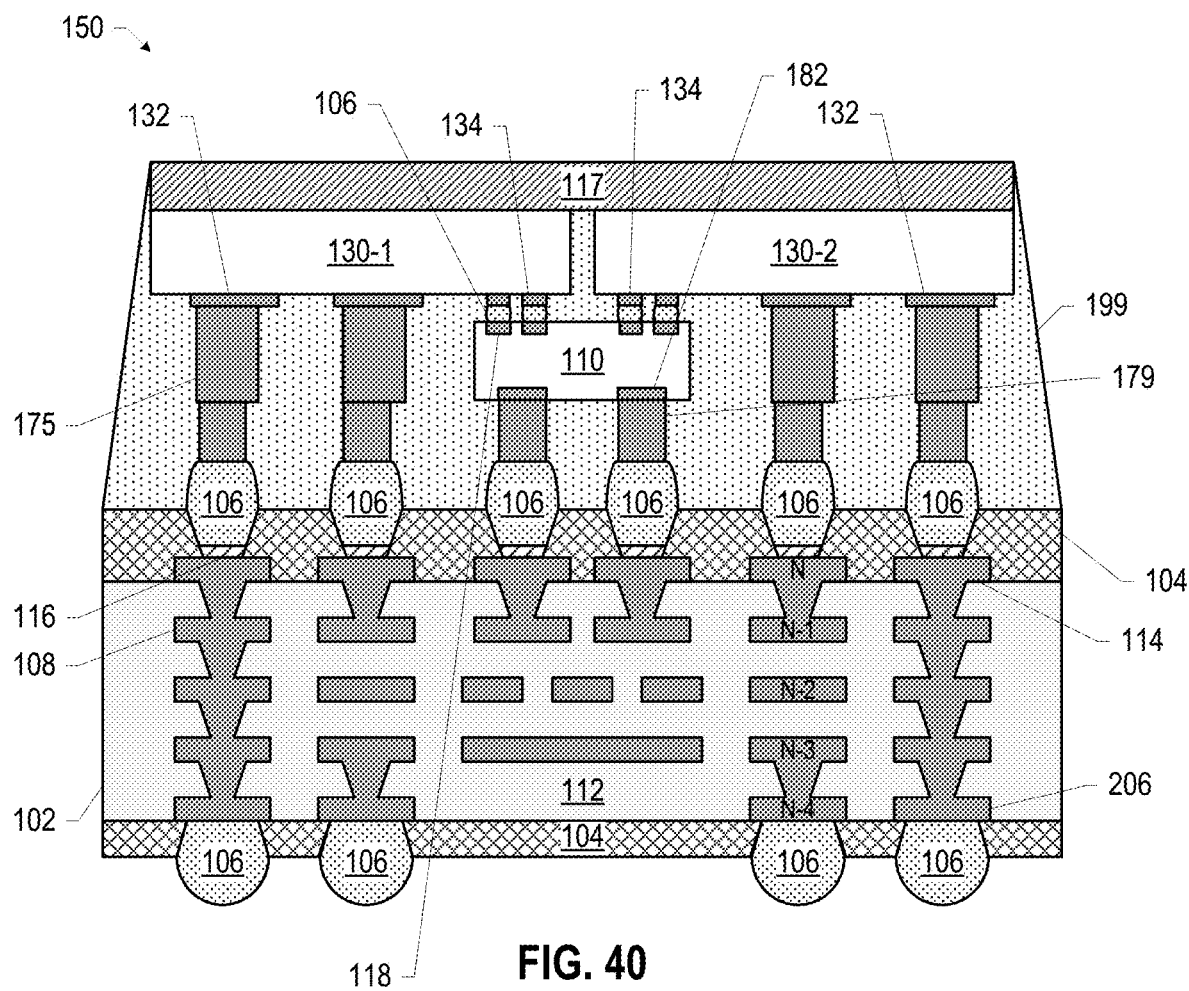

In some embodiments, a microelectronic assembly 150 may include conductive pillars to electrically couple the microelectronic components 130 and/or the bridge component 110 to the substrate 102. For example, FIGS. 39-40 are side, cross-sectional views of example microelectronic assemblies 150 including conductive pillars 175, in accordance with various embodiments. A stack of one or more conductive pillars 175 may be in contact with each of the conductive contacts 132 of the microelectronic components 130, and the conductive pillars 175 may be conductively coupled to the conductive contacts 114 of the substrate 102 by solder 106. In the embodiments of FIGS. 39-40, the solder 106 may be closer to the substrate 102 than to the microelectronic components 130. As illustrated in FIGS. 39-40, an individual conductive pillar 175 in a stack may have a smaller diameter than another individual conductive pillar 175 in the stack that is closer to the substrate 102; a stack of conductive pillars 175 may thus have a "stepped" structure in which conductive pillars 175 closer to the substrate 102 are narrower than conductive pillars 175 farther from the substrate 102. The conductive pillars 175 may extend through a dielectric material 199, which may take the form of any of the dielectric materials 199 disclosed herein. As shown in FIGS. 39-40, the dielectric material 199 may contact side faces of a support material 117 at the "top" faces of the microelectronic components 130. The support material 117 may take the form of any of the support materials 117 disclosed herein, and in some embodiments, the dielectric material 199 may have angled side faces, with the dielectric material 199 widening toward the substrate 102, as shown. The dielectric material 199 may also contact side faces of the microelectronic components 130, and may be disposed between the microelectronic components 130, as shown.

In the embodiment of FIG. 39, the bridge component 110 may not include conductive contacts 182 at its "bottom" face, and dielectric material 199 may be disposed between the bridge component 110 and the substrate 102. In the embodiment of FIG. 40, the bridge component 110 may include conductive contacts 182 at its "bottom" face, and these conductive contacts 182 may be coupled to conductive contacts 114 of the substrate 102 by an intervening stack of one or more conductive pillars 179 (in contact with the conductive contacts 182 and extending through the dielectric material 199) and solder 106. The solder 106 coupling the conductive contacts 114 to the conductive pillars 175/179 may be in contact with the dielectric material 199. In some embodiments, the "bottom" surfaces of the "bottom-most" conductive pillars 175/179 in a microelectronic assembly 150 may be coplanar, as shown.

The microelectronic assemblies 150 of FIGS. 39 and 40 (and the microelectronic assemblies of FIGS. 46 and 49, discussed further below) may advantageously include a single dielectric material 199 securing the microelectronic components 130, the bridge component 110, and the substrate 102, and may be manufactured using low cost processes. Microelectronic assemblies 150 like those illustrated in FIGS. 39-40 may be manufactured using any suitable techniques. FIGS. 41-45 are side, cross-sectional views of various stages in an example process for the manufacture of the microelectronic assembly 150 of FIG. 39, in accordance with various embodiments.

Figure 41:
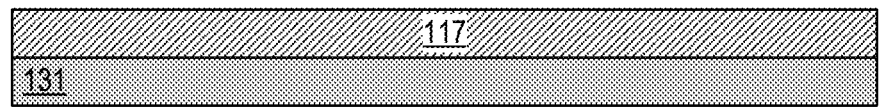
FIGS. 41-45 are side, cross-sectional views of various stages in an example process for the manufacture of the microelectronic assembly of FIG. 39, in accordance with various embodiments.

FIG. 41 illustrates an assembly including a carrier 131 and support material 117 on the carrier 131. As discussed above, the support material 117 may be coupled to the carrier 131 by a release layer (not shown). The support material 117 and the carrier 131 may take any suitable form. The assembly of FIG. 41 may be a portion of a "wafer-level" assembly in which multiple units like that illustrated in FIG. 41 are formed together, and then singulated at a later operation into "package-level" units (e.g., as discussed below with reference to FIG. 44).

Figure 42:
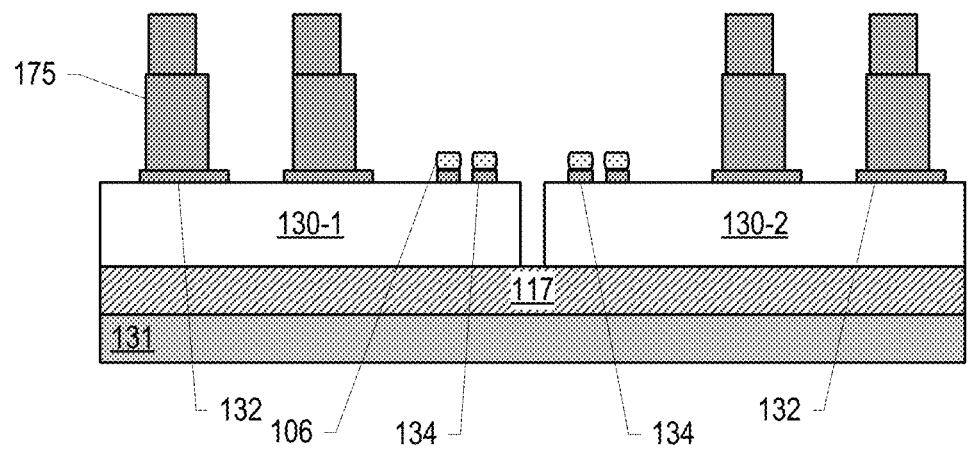

FIG. 42 illustrates an assembly subsequent to coupling the microelectronic components 130 to the support material 117 of the assembly of FIG. 41, forming conductive pillars 175 on the conductive contacts 132 of the microelectronic components 130, and providing solder 106 on the conductive contacts 134 of the microelectronic components 130. In some embodiments, the conductive pillars 175 may be plated on to the conductive contacts 134, with the number of plating operations depending upon the number of conductive pillars 175 in a stack (e.g., two plating operations to form the conductive pillars 175 of the assembly of FIG. 42). As shown in FIG. 42, the diameter of the conductive pillars 175 formed in subsequent plating operations may decrease relative to previous plating operations. In some embodiments, the operations of FIG. 42 may include performing a "fly cut" of the conductive pillars 175 to improve coplanarity of the "tops" of the stacks of conductive pillars 175.

Figure 43:
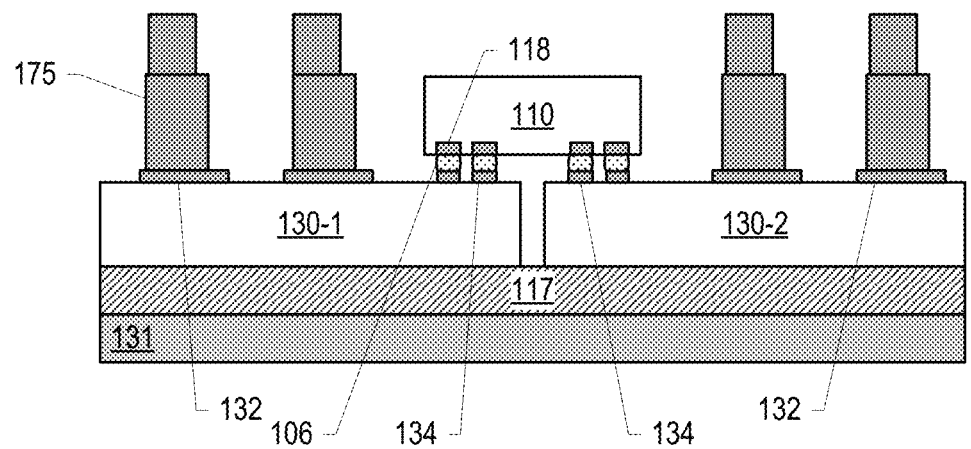

FIG. 43 illustrates an assembly subsequent to coupling conductive contacts 118 of the bridge component 110 to the conductive contacts 134 of the microelectronic components 130 of the assembly of FIG. 42 via the solder 106. The coupling between the conductive contacts 118 and the conductive contacts 134 may be the tightest pitch interconnects that will be made in the microelectronic assembly 150, and forming them at this stage in manufacturing may allow the bridge component 110 to self-align or to otherwise achieve minimal misalignment with the microelectronic components 130. In some embodiments, the operations of FIG. 43 may include performing a "fly cut" of the conductive pillars 175 to improve coplanarity of the "tops" of the stacks of conductive pillars 175.

Figure 44:
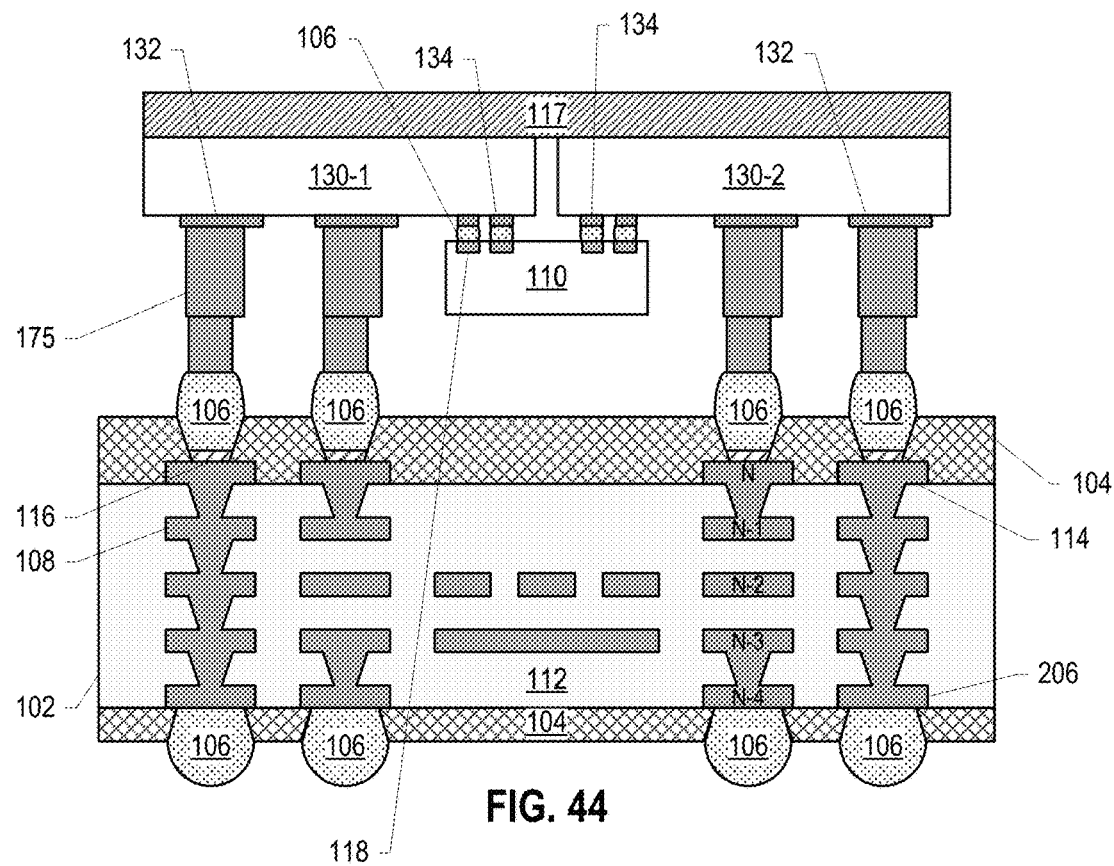

FIG. 44 illustrates an assembly subsequent to removing the carrier 131 from the assembly of FIG. 43, and bonding the conductive pillars 175 of the result to a substrate 102 via solder 106. In embodiments in which multiple ones of the microelectronic assemblies 150 of FIG. 39 are being manufactured simultaneously, the different microelectronic assemblies 150 may be singulated into "package-level" components as part of the operations of FIG. 44.

Figure 45:
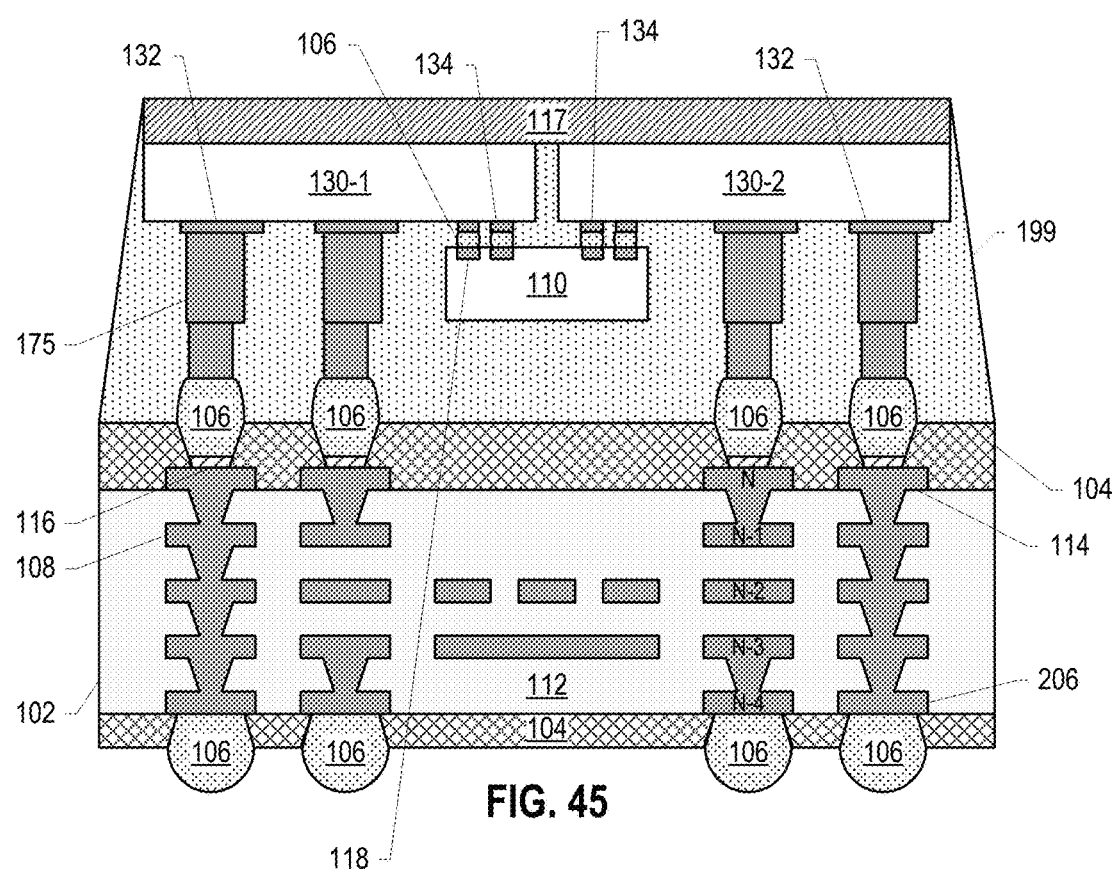

FIG. 45 illustrates an assembly subsequent to providing the dielectric material 199 between the microelectronic components 130 and the substrate 102, as well as around the microelectronic components 130 and onto the support material 117, as shown. The assembly of FIG. 45 may take the form of the microelectronic assembly 150 of FIG. 39. The microelectronic assembly 150 of FIG. 40 may be manufactured using a process similar to that discussed with reference to FIGS. 41-45, but in which the conductive pillars 179 may be plated on the conductive contacts 182 of the bridge component 110 prior to bonding the bridge component 110 to the microelectronic components 130 (such conductive pillars 179 may be surrounded by a dielectric material, such as the dielectric material 195, to provide mechanical support to the conductive pillars 179), and in which the bonding operations discussed above with reference to FIG. 44 may also include bonding the conductive pillars 179 to the conductive contacts 114 of the substrate 102 by intervening solder 106.

Figure 46:
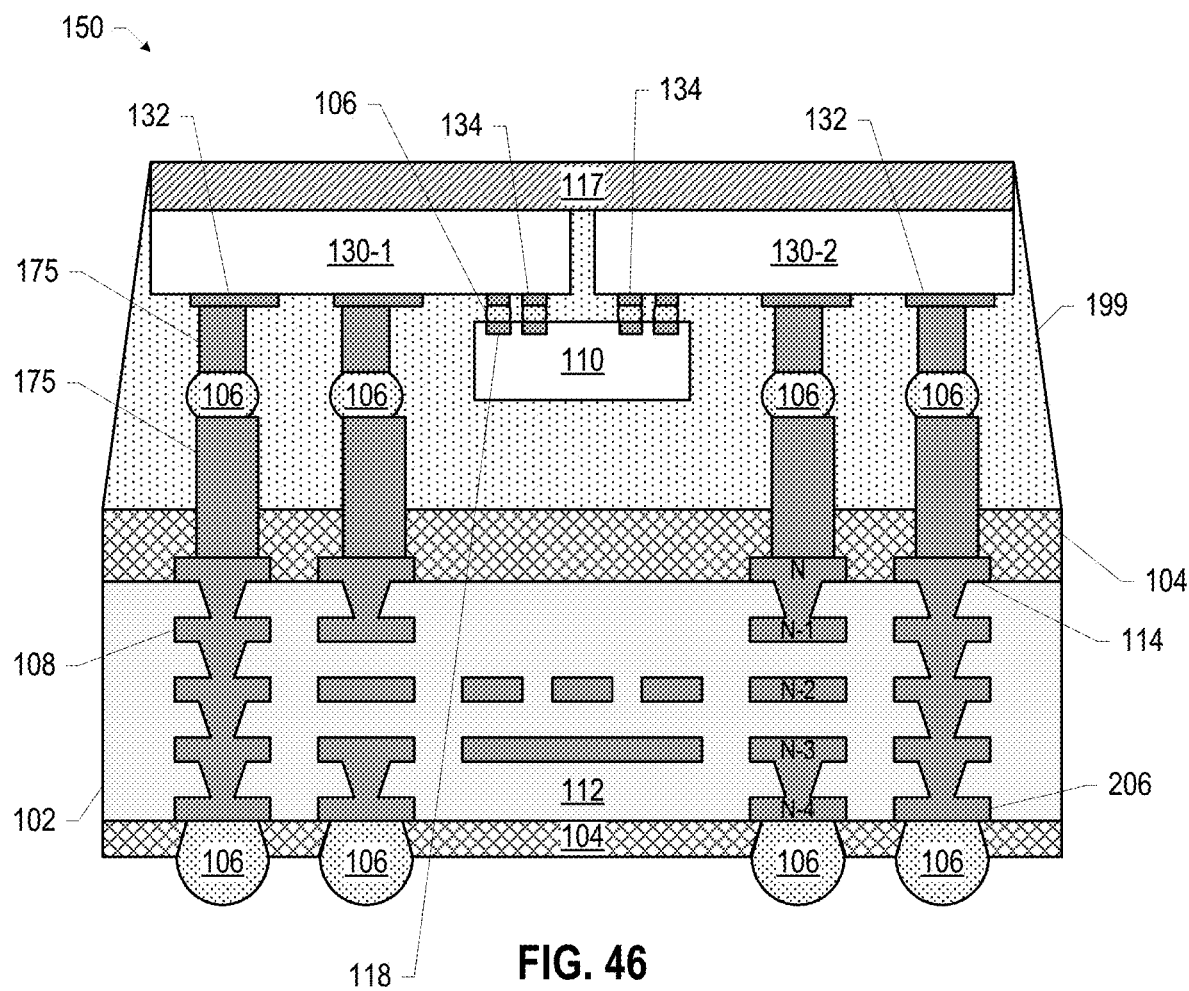
FIG. 46 is a side, cross-sectional view of an example microelectronic assembly, in accordance with various embodiments.

In some embodiments of microelectronic assemblies 150 like those illustrated in FIGS. 39-40, the solder 106 coupling the microelectronic components 130 to the substrate 102 may be between conductive pillars 175. For example, FIG. 46 illustrates a microelectronic assembly 150 sharing many features with the microelectronic assembly 150 of FIG. 39, but in which solder 106 between a conductive contact 132 and a conductive contact 114 is between one or more conductive pillars 175 in contact with the conductive contact 132 and one or more conductive pillars 175 in contact with the conductive contacts 132. Although FIG. 46 illustrates a microelectronic assembly 150 in which only a single conductive pillar 175 is disposed between the solder 106 and a conductive contact 132, and only a single conductive pillar 175 is disposed between the solder 106 and a conductive contact 114, this is simply for ease of illustration, and more than one conductive pillar 175 may be disposed "above" and/or "below" the solder 106. In embodiments in which more than one conductive pillar 175 is disposed "above" and/or "below" the solder 106, the diameters of the multiple conductive pillars 175 may decrease toward the solder 106 (e.g., as discussed above with reference to the diameters of different ones of the conductive pillars 175 in a stack in the microelectronic assemblies 150 of FIGS. 39-40).

Figure 47:
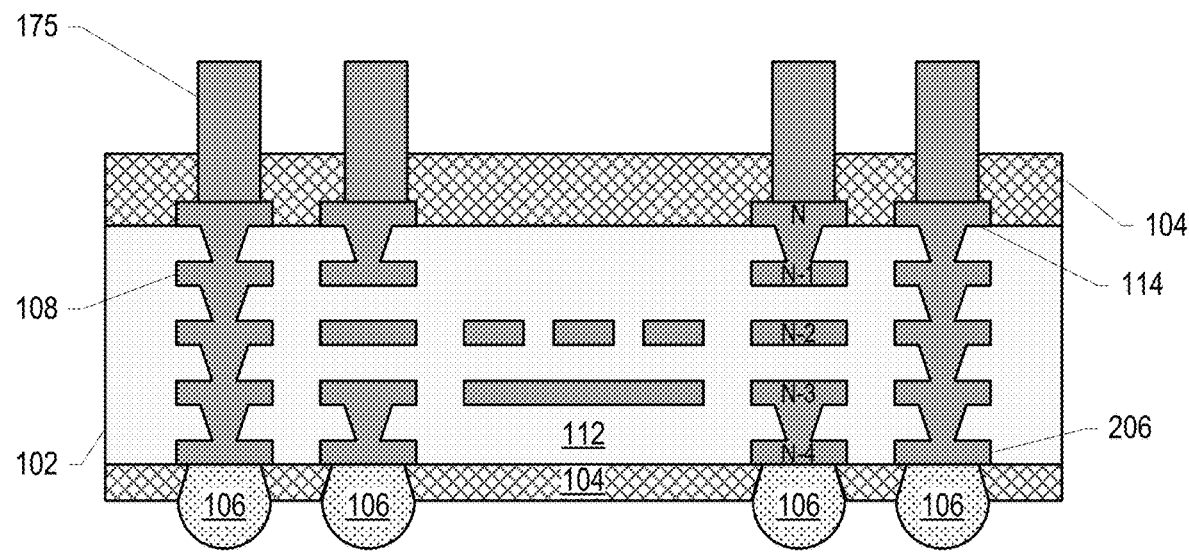
FIGS. 47-48 are side, cross-sectional views of various stages in an example process for the manufacture of the microelectronic assembly of FIG. 46, in accordance with various embodiments.
Figure 48:
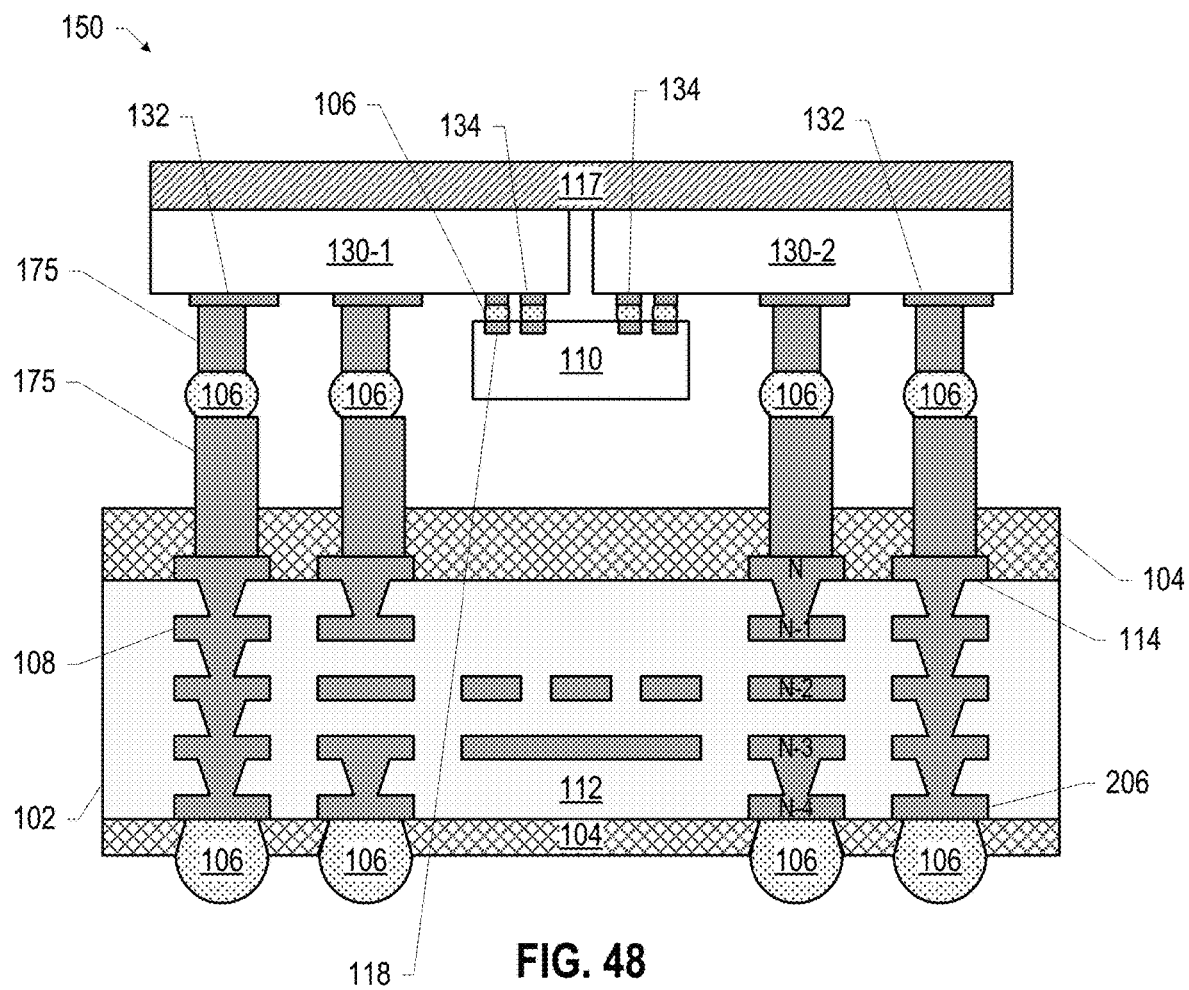

Microelectronic assemblies 150 like that illustrated in FIG. 46 may be manufactured using any suitable techniques. FIGS. 47-48 are side, cross-sectional views of various stages in an example process for the manufacture of the microelectronic assembly 150 of FIG. 46, in accordance with various embodiments.

FIG. 47 illustrates an assembly subsequent to forming conductive pillars 175 on the conductive contacts 114 of a substrate 102. In some embodiments, the conductive pillars 175 may be plated on to the conductive contacts 114, with the number of plating operations depending upon the number of conductive pillars 175 in a stack (e.g., one plating operation to form the conductive pillars 175 of the assembly of FIG. 47). The diameter of the conductive pillars 175 formed in subsequent plating operations may decrease relative to previous plating operations.

FIG. 48 illustrates an assembly subsequent to removing the carrier 131 from an assembly like that of FIG. 43, and bonding the conductive pillars 175 of the result to the conductive pillars of the substrate 102 of the assembly of FIG. 47 by solder 106. Fabrication may continue by performing the operations discussed above with reference to FIG. 45 on the assembly of FIG. 48, resulting in an assembly that may take the form of the microelectronic assembly 150 of FIG. 46. In embodiments in which multiple ones of the microelectronic assemblies 150 of FIG. 45 are being manufactured simultaneously, the different microelectronic assemblies 150 may be singulated into "package-level" components as part of the operations of FIG. 48.

Figure 49:
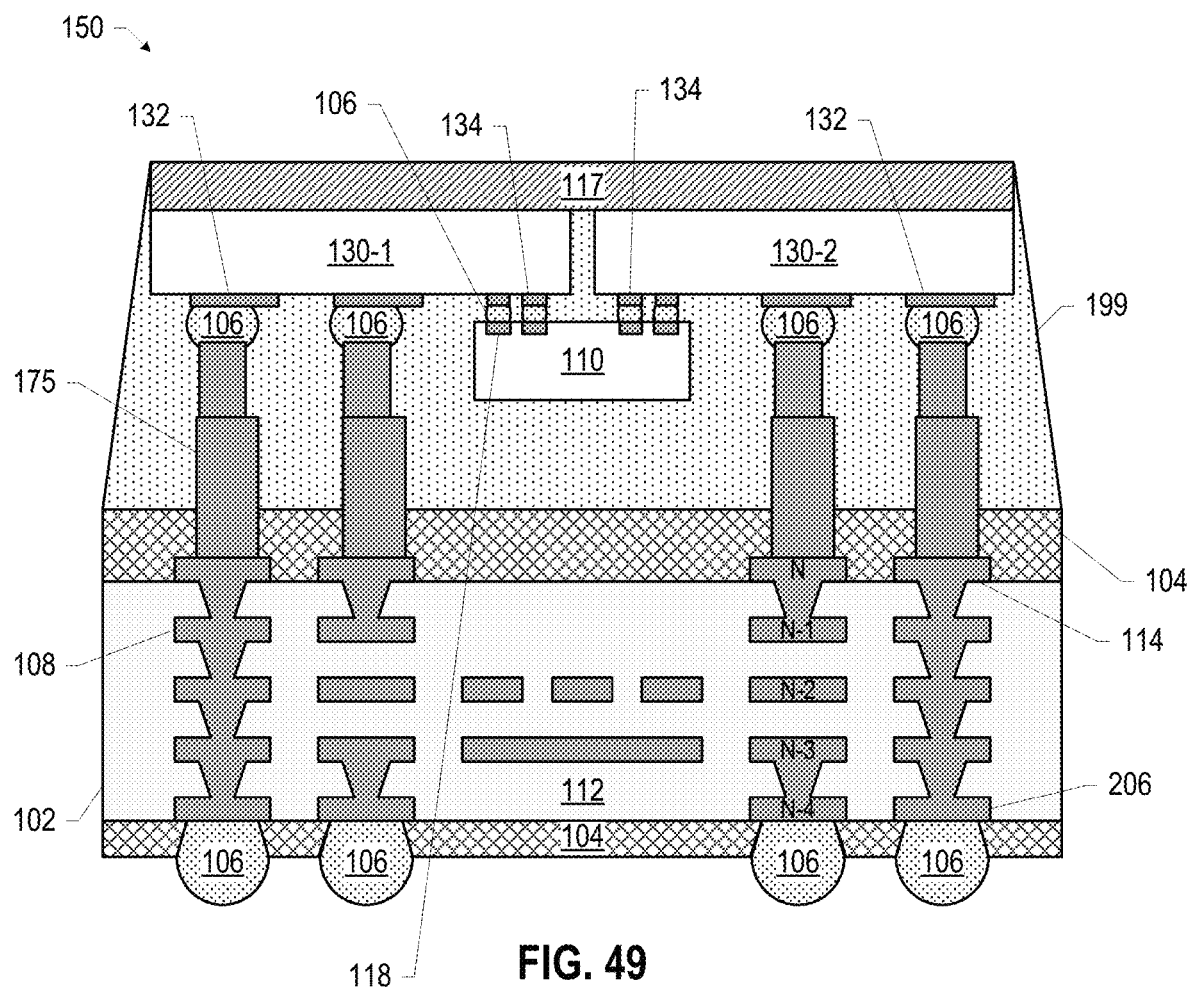
FIGS. 49-51 are side, cross-sectional views of example microelectronic assemblies, in accordance with various embodiments.

In some embodiments, a microelectronic assembly 150 may include conductive pillars 175 in contact with the conductive contacts 114 of the substrate 102. For example, FIG. 49 illustrates a microelectronic assembly 150 sharing many features with the microelectronic assembly 150 of FIG. 39, but in which a stack of one or more conductive pillars 175 may be in contact with each of the conductive contacts 114 of the substrate 102, and the conductive pillars 175 may be conductively coupled to the conductive contacts 132 of the microelectronic components 130 by solder 106. In the embodiment of FIG. 49, the solder 106 may be closer to the microelectronic components 130 than to the substrate 102. As illustrated in FIG. 49, an individual conductive pillar 175 in a stack may have a smaller diameter than another individual conductive pillar 175 in the stack that is closer to the microelectronic components 130; a stack of conductive pillars 175 may thus have a "stepped" structure in which conductive pillars 175 farther from the substrate 102 are narrower than conductive pillars 175 closer to the substrate 102.

Microelectronic assemblies 150 like that illustrated in FIG. 49 may be manufactured using any suitable techniques. For example, the microelectronic assembly 150 of FIG. 49 may be manufactured substantially as described above with reference to FIGS. 47-48, but in which the microelectronic components 130 may have no conductive pillars 175 plated on the conductive contacts 114.

Figure 50:
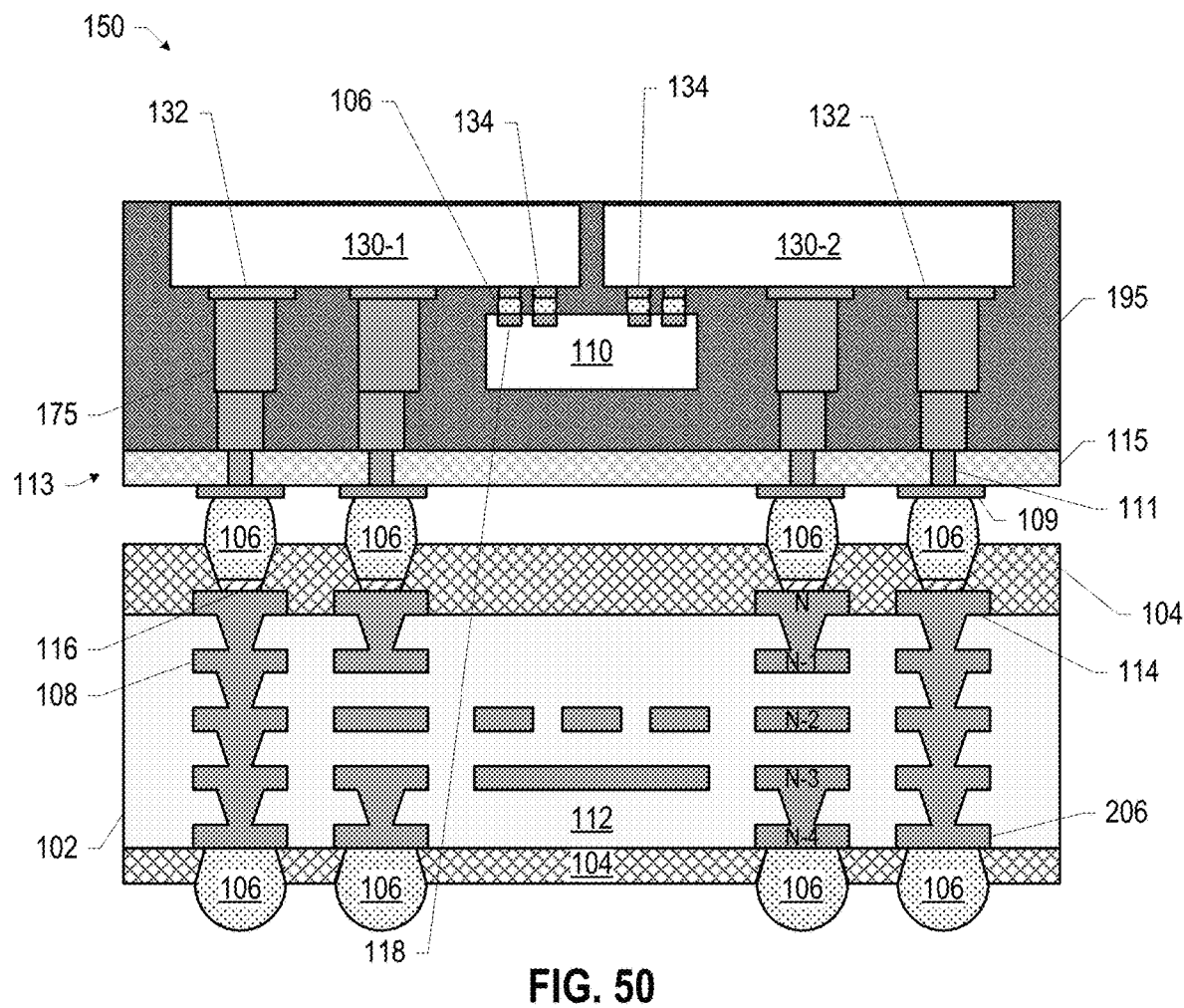
Figure 51:
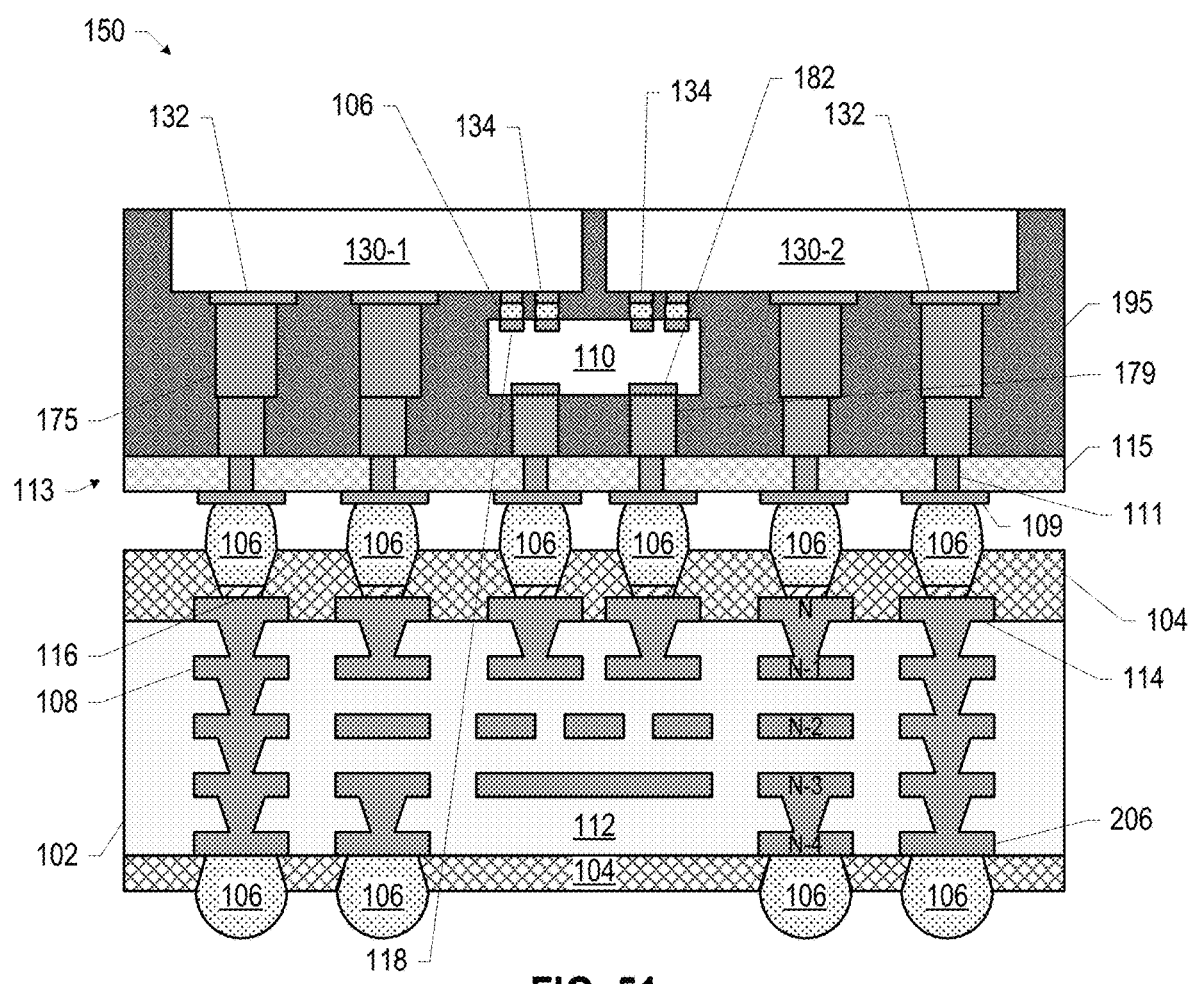

In some embodiments, a microelectronic assembly 150 including conductive pillars 175 may have a metallization region 113 between the conductive pillars 175 and the substrate 102. For example, FIGS. 50-51 are side, cross-sectional views of example microelectronic assemblies 150 including conductive pillars 175 and a metallization region 113, in accordance with various embodiments. A stack of one or more conductive pillars 175 may be in contact with each of the conductive contacts 132 of the microelectronic components 130, and the conductive pillars 175 may be in contact with conductive vias 111 and conductive contacts 109 of a metallization region 113. The metallization region 113 may include a dielectric material 115, which may include any suitable material, such as a polyimide, polybenzoxazole, silicon nitride, or silicon oxide. The conductive contacts 109 may be conductively coupled to the conductive contacts 114 of the substrate 102 by solder 106. In the embodiments of FIGS. 50-51, the solder 106 may be closer to the substrate 102 than to the microelectronic components 130. Although the metallization region 113 is depicted in FIGS. 50-51 (and others of the accompanying drawings) as having a single metallization layer, this is simply for ease of illustration, and a metallization region 113 may have one or more metallization layers including conductive vias and/or conductive lines arranged as desired into conductive pathways. As illustrated in FIGS. 50-51, an individual conductive pillar 175 in a stack may have a smaller diameter than another individual conductive pillar 175 in the stack that is closer to the substrate 102; a stack of conductive pillars 175 may thus have a "stepped" structure in which conductive pillars 175 closer to the substrate 102 are narrower than conductive pillars 175 farther from the substrate 102. The conductive pillars 175 may extend through a dielectric material 195, which may take the form of any of the dielectric materials 195 disclosed herein. The dielectric material 195 may also contact side faces of the microelectronic components 130, and may be disposed between the microelectronic components 130, as shown. The dielectric material 195 may also contact all faces of the bridge component 110, and may be present in the volumes between the solder 106 that couples the conductive contacts 118 to the conductive contacts 134.

In the embodiment of FIG. 50, the bridge component 110 may not include conductive contacts 182 at its "bottom" face, and dielectric material 195 may be disposed between the bridge component 110 and the metallization region 113. In the embodiment of FIG. 51, the bridge component 110 may include conductive contacts 182 at its "bottom" face, and these conductive contacts 182 may be coupled to conductive contacts 114 of the substrate 102 by an intervening stack of one or more conductive pillars 179 (in contact with the conductive contacts 182 and extending through the dielectric material 195), conductive vias 111, conductive contacts 109, and solder 106. In some embodiments, the "bottom" surfaces of the "bottom-most" conductive pillars 175/179 in a microelectronic assembly 150 may be coplanar, as shown.

In some embodiments, the microelectronic components 130 of the microelectronic assemblies 150 of FIGS. 50-51 (and the microelectronic assemblies 150 of FIGS. 59-64, discussed further below) may have been tested prior to their inclusion in the microelectronic assembly 150, and thus may represent "known good" components (e.g., "known good dies"). The microelectronic assemblies 150 of FIGS. 50 and 51 (and the microelectronic assemblies 150 of FIGS. 59-64, discussed further below) may advantageously be manufactured using low cost processes. Microelectronic assemblies 150 like those illustrated in FIGS. 50-51 may be manufactured using any suitable techniques. FIGS. 52-58 are side, cross-sectional views of various stages in an example process for the manufacture of the microelectronic assembly 150 of FIG. 50, in accordance with various embodiments.

Figure 52:
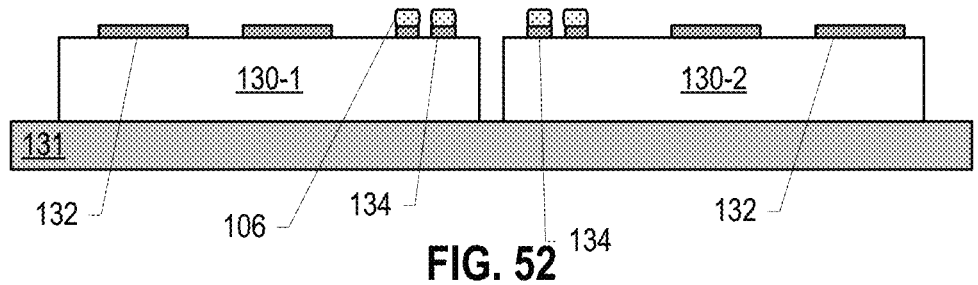
FIGS. 52-58 are side, cross-sectional views of various stages in an example process for the manufacture of the microelectronic assembly of FIG. 50, in accordance with various embodiments.

FIG. 52 illustrates an assembly including a carrier 131 coupled to the microelectronic components 130, with solder 106 on the conductive contacts 134 of the microelectronic components 130. The assembly of FIG. 52 may be a portion of a "wafer-level" assembly in which multiple units like that illustrated in FIG. 52 are formed together, and then singulated at a later operation into "package-level" units (e.g., as discussed below with reference to FIG. 56).

Figure 53:
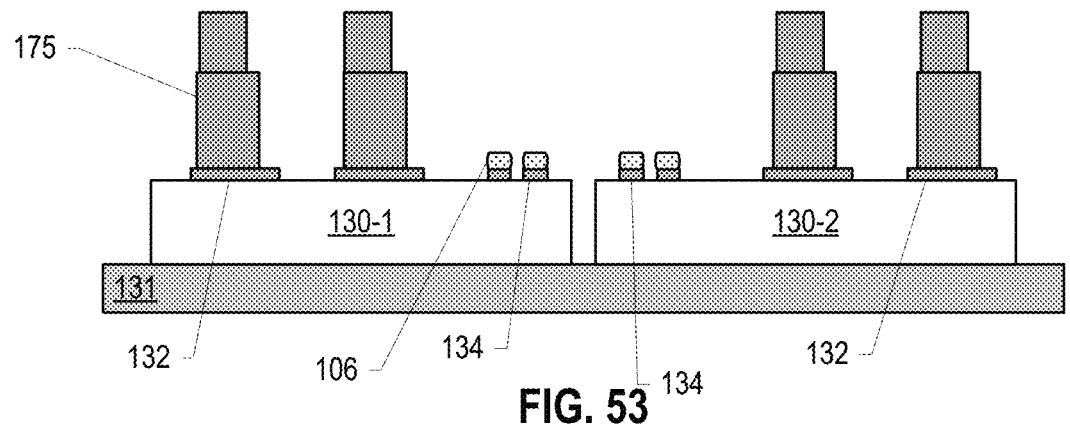

FIG. 53 illustrates an assembly subsequent to forming conductive pillars 175 on the conductive contacts 132 of the microelectronic components 130 of the assembly of FIG. 52. In some embodiments, the conductive pillars 175 may be plated on to the conductive contacts 134, with the number of plating operations depending upon the number of conductive pillars 175 in a stack (e.g., two plating operations to form the conductive pillars 175 of the assembly of FIG. 53). As shown in FIG. 53, the diameter of the conductive pillars 175 formed in subsequent plating operations may decrease relative to previous plating operations. In some embodiments in which the microelectronic components 130 have different thicknesses, a "fly cut" operation may be performed on the conductive pillars 175 to planarize the "tops" of the stacks of conductive pillars 175; in such embodiments, the "tops" of the stacks of conductive pillars 175 may be coplanar, even when the microelectronic components 130 are of different thicknesses. In some embodiments, solder 106 may be plated onto the "tops" of the stacks of conductive pillars 175 after fly cutting (not shown).

Figure 54:
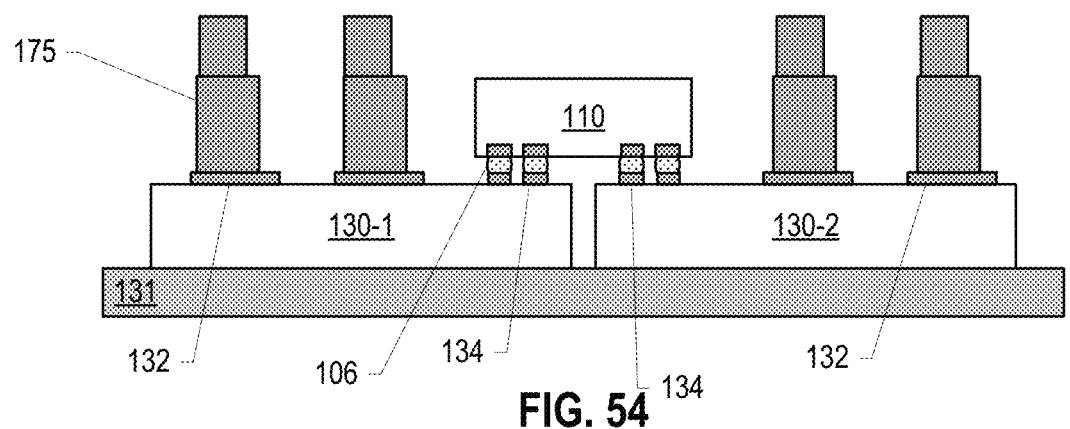

FIG. 54 illustrates an assembly subsequent to coupling conductive contacts 118 of the bridge component 110 to the conductive contacts 134 of the microelectronic components 130 of the assembly of FIG. 54 via the solder 106. The coupling between the conductive contacts 118 and the conductive contacts 134 may be the tightest pitch interconnects that will be made in the microelectronic assembly 150, and forming them at this stage in manufacturing may allow the bridge component 110 to self-align or to otherwise achieve minimal misalignment with the microelectronic components 130.

Figure 55:
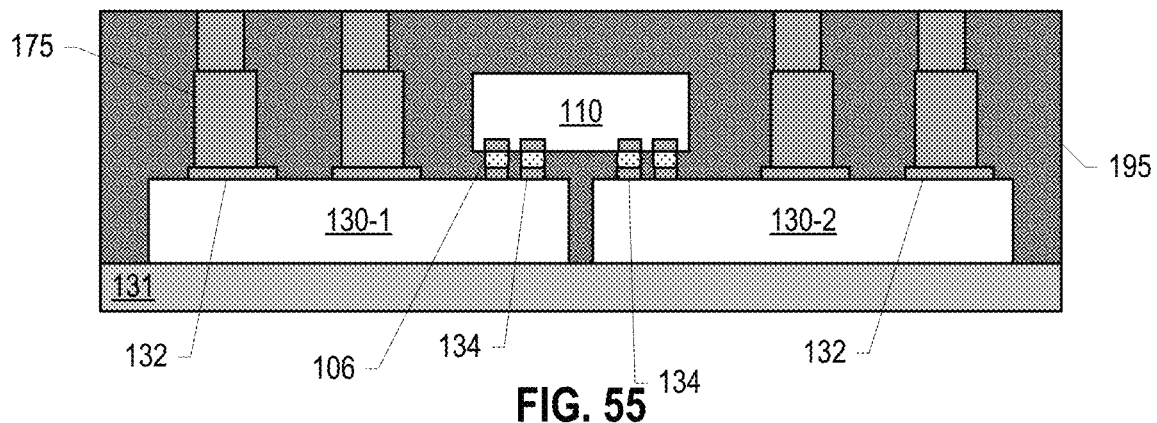

FIG. 55 illustrates an assembly subsequent to providing a dielectric material 195 around the microelectronic components 130 of the assembly of FIG. 54. The dielectric material 195 may secure the microelectronic components 130 and the bridge component 110 in position relative to each other to mitigate the risk of movement during subsequent manufacturing operations. In some embodiments, the dielectric material 195 may be planarized (e.g., using a grinding operation) to remove the dielectric material 195 above the conductive pillars 175. In some embodiments, the dielectric material 195 may be a wafer-level mold material, as discussed above. In some embodiments, the dielectric material 195 may be a package-level mold material, as discussed above.

Figure 56:
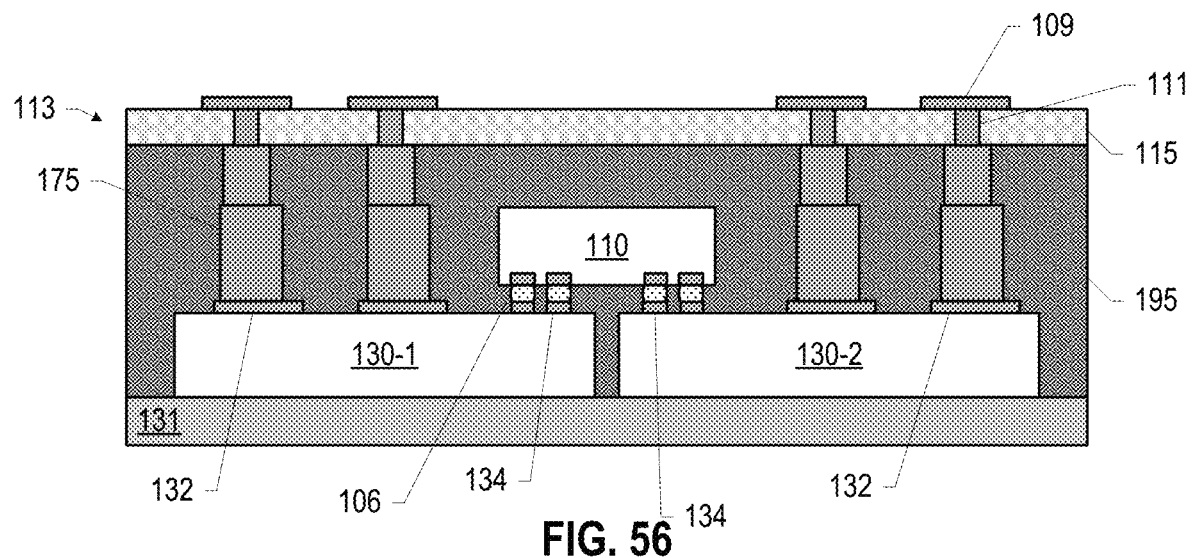

FIG. 56 illustrates an assembly subsequent to forming a metallization region 113 on the assembly of FIG. 55. In some embodiments, the positions of the conductive vias 111 and the conductive contacts 109 may be selected to "correct" for any misalignment between the conductive pillars 175 and the conductive contacts 114 of the substrate 102; in some embodiments, no metallization region 113 may be included in a microelectronic assembly 150 (e.g., as discussed below with reference to FIGS. 61-62).

Figure 57:
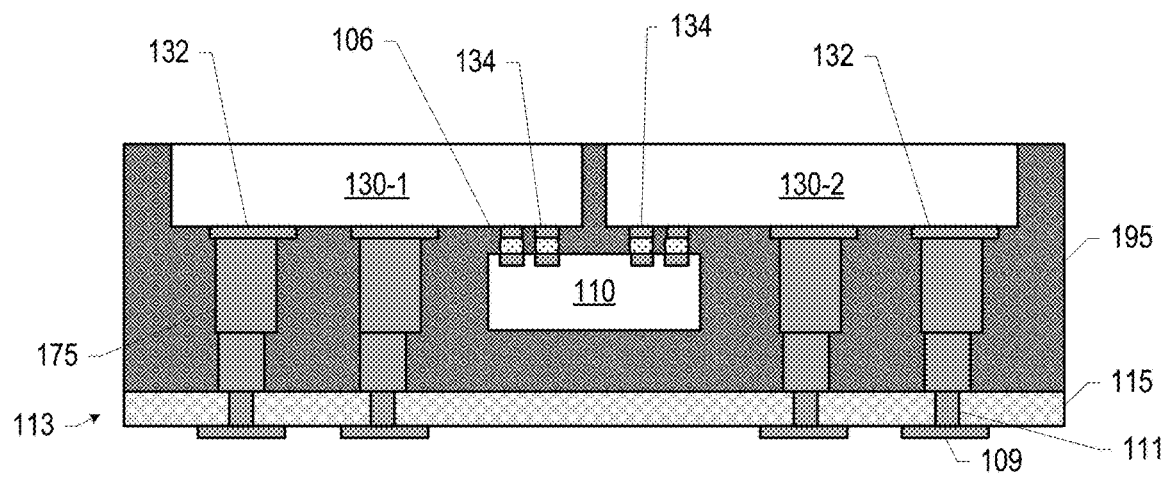

FIG. 57 illustrates an assembly subsequent to removing the carrier 131 from the assembly of FIG. 56, and "flipping" the result. In embodiments in which multiple ones of the microelectronic assemblies 150 of FIG. 50 are being manufactured simultaneously, the different microelectronic assemblies 150 may be singulated into "package-level" components as part of the operations of FIG. 57.

Figure 58:
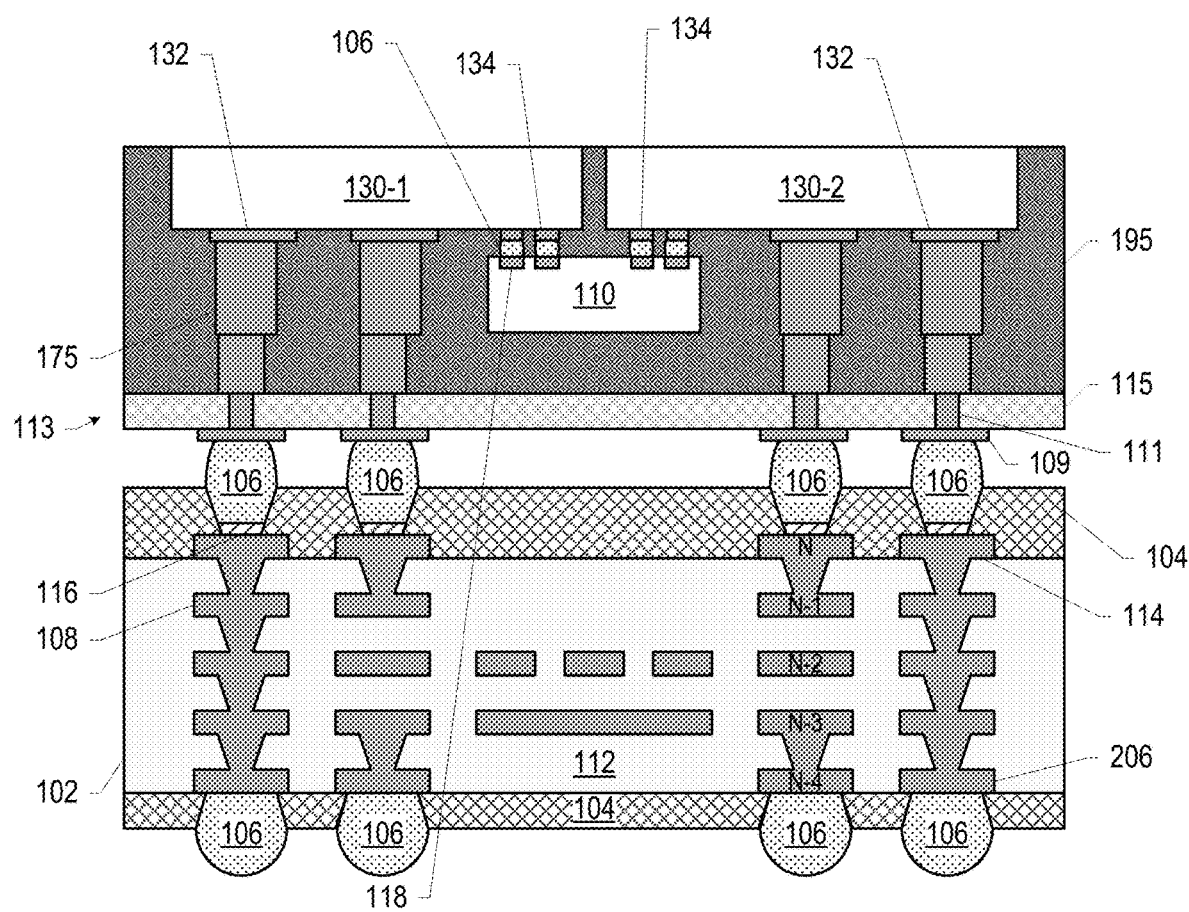

FIG. 58 illustrates an assembly subsequent to bonding the conductive contacts 109 of the assembly of FIG. 57 to a substrate 102 via solder 106. The resulting assembly may take the form of the microelectronic assembly 150 of FIG. 50. The microelectronic assembly 150 of FIG. 51 may be manufactured using a process similar to that discussed with reference to FIGS. 52-58, but in which the conductive pillars 179 may be plated on the conductive contacts 182 of the bridge component 110 prior to bonding the bridge component 110 to the microelectronic components 130 (such conductive pillars 179 may be surrounded by a dielectric material, such as the dielectric material 195, to provide mechanical support to the conductive pillars 179).

Figure 59:
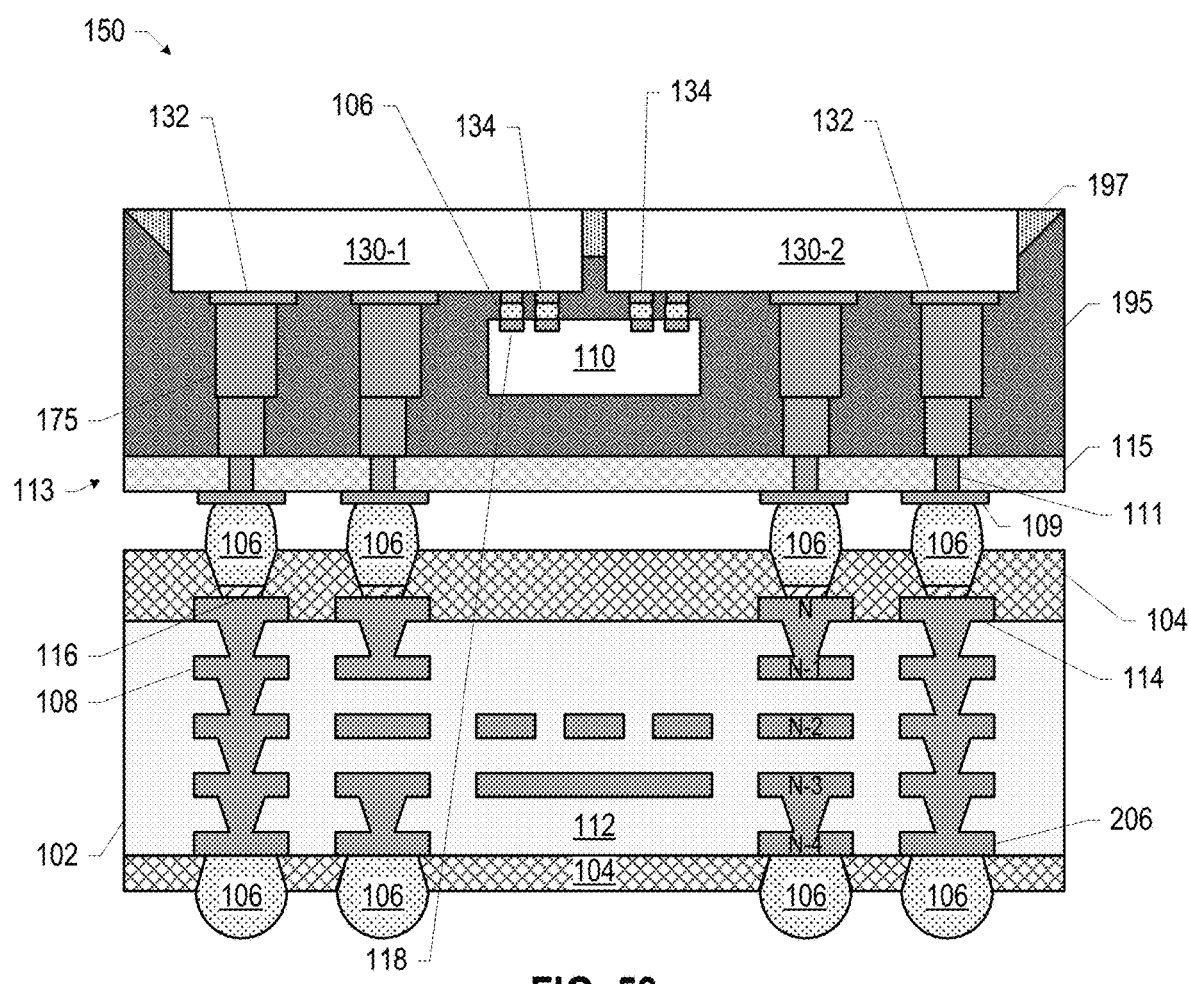
FIGS. 59-64 are side, cross-sectional views of example microelectronic assemblies, in accordance with various embodiments.
Figure 60:
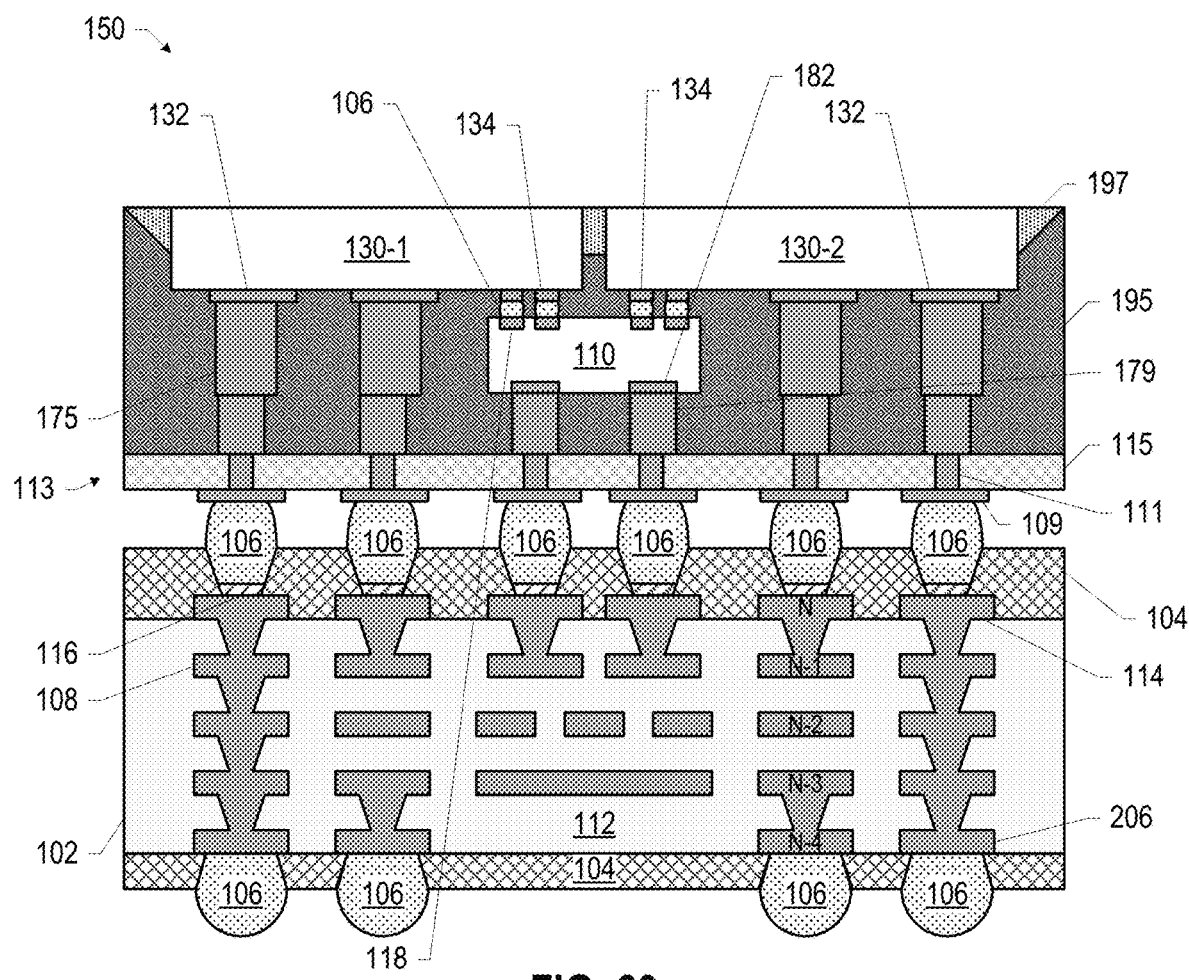

In some embodiments, microelectronic assemblies 150 similar to those of FIGS. 50-51 may include an additional dielectric material around side faces of the microelectronic components 130. For example, FIGS. 59-60 illustrate microelectronic assemblies 150 similar to the microelectronic assemblies 150 of FIGS. 50-51, respectively, but in which a dielectric material 197 may be disposed around side faces of the microelectronic components 130. The dielectric material 197 of FIGS. 59-60 may take the form of any of the dielectric materials 197 disclosed herein. In some embodiments, the dielectric material 197 may have angled side faces, with the dielectric material 197 narrowing toward the substrate 102. The microelectronic assemblies 150 of FIGS. 59-60 may be fabricated substantially as described above with reference to FIGS. 52-58, but with the dielectric material 197 (e.g., an wafer-level underfill material) provided before the provision of the dielectric material 175 as discussed above with reference to FIG. 55. In some embodiments, a maximum thickness of the dielectric material 197 in the microelectronic assemblies 150 of FIGS. 59-60 may be between 50 microns and 200 microns. In some embodiments, a maximum thickness of the dielectric material 197 in the microelectronic assemblies 150 of FIGS. 59-60 may be equal to a thickness of one or more of the microelectronic components 130. Any of the microelectronic assemblies 150 disclosed herein may include such dielectric material 197.

Figure 61:
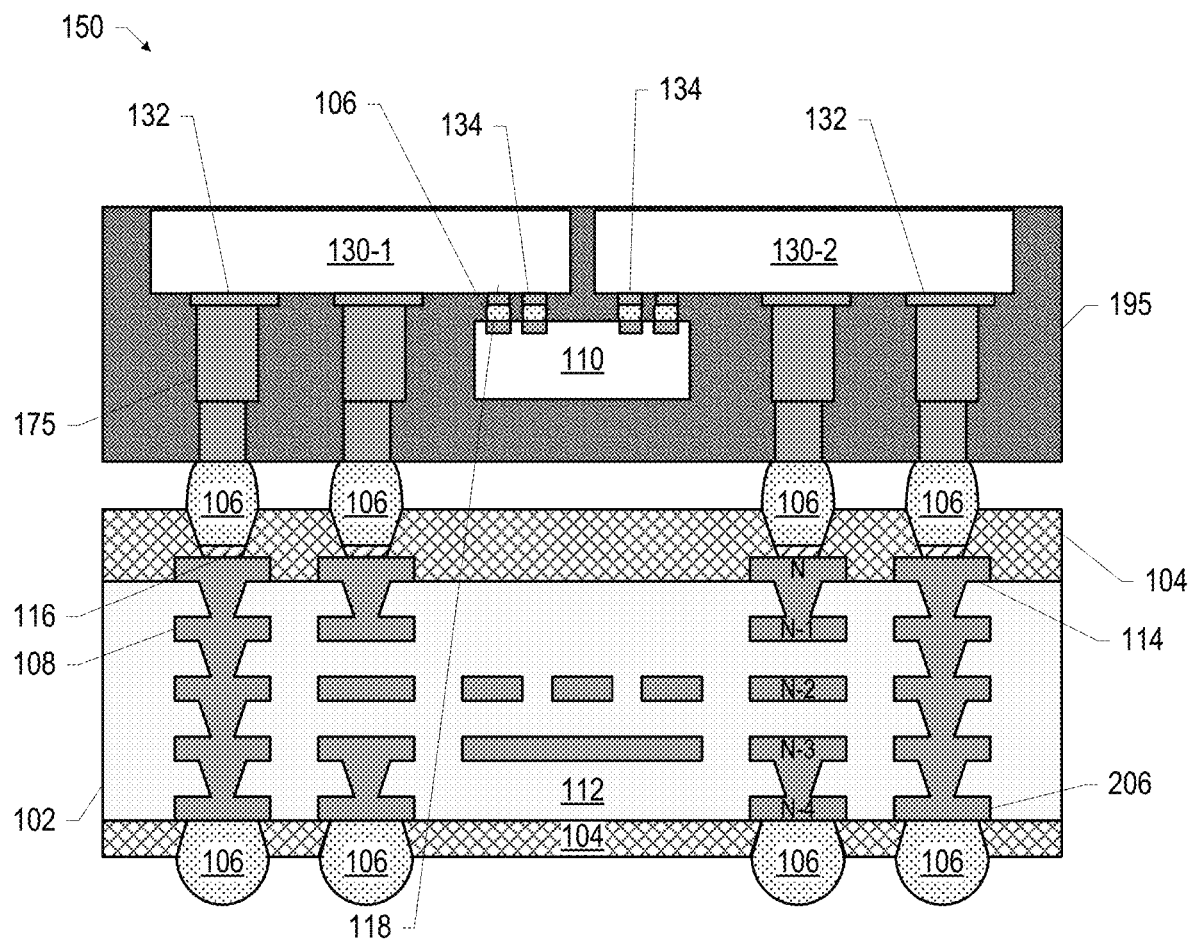
Figure 62:
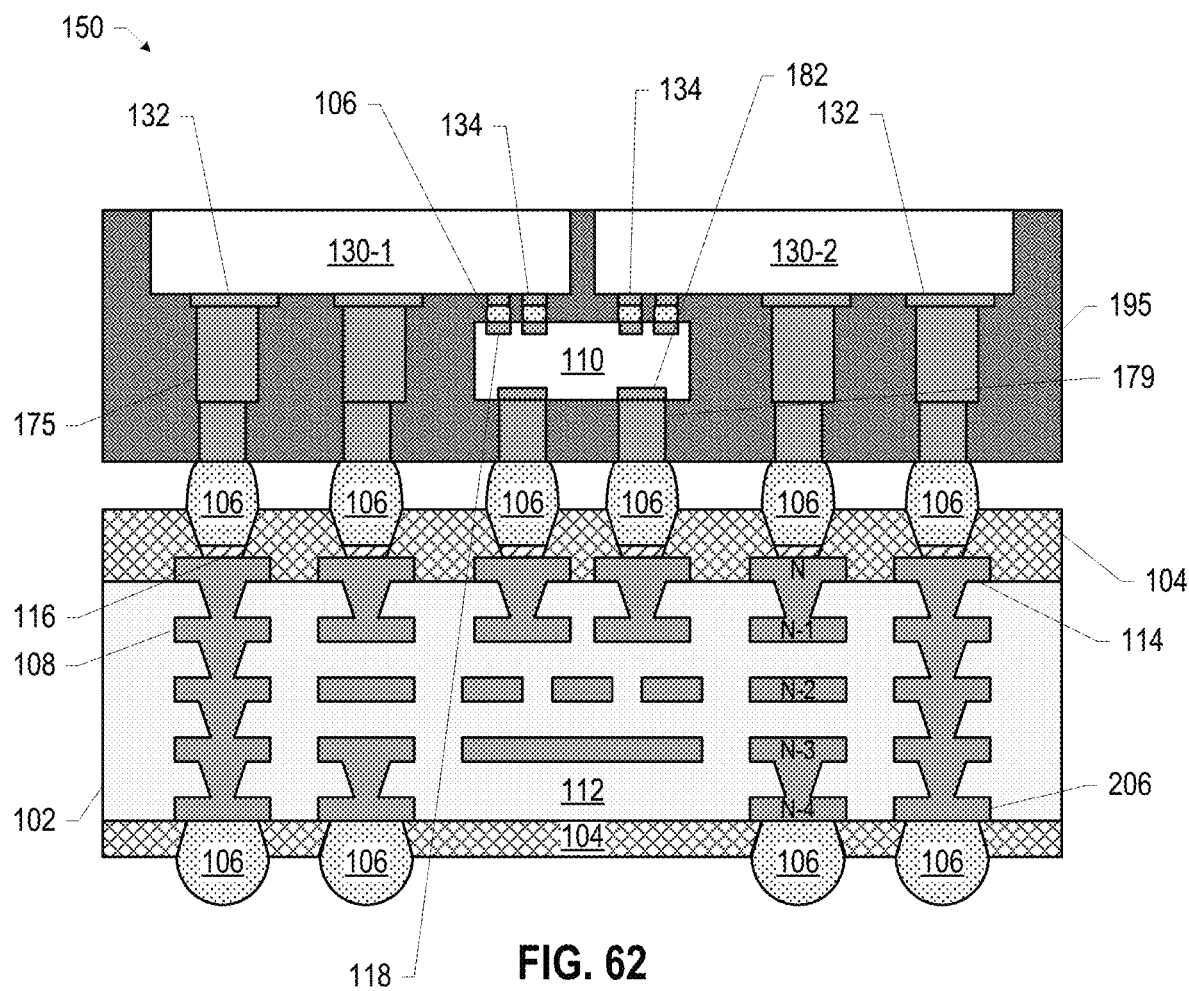

In some embodiments, microelectronic assemblies 150 similar to those of FIGS. 50-51 may not include a metallization region 113. For example, FIGS. 61-62 illustrate microelectronic assemblies 150 similar to the microelectronic assemblies 150 of FIGS. 50-51, respectively, but in which the metallization region 113 is not present, and the solder 106 in contact with the conductive contacts 114 also contacts the conductive pillars 175 and 179. Any of the microelectronic assemblies 150 disclosed herein may or may not include a metallization region 113.

Figure 63:
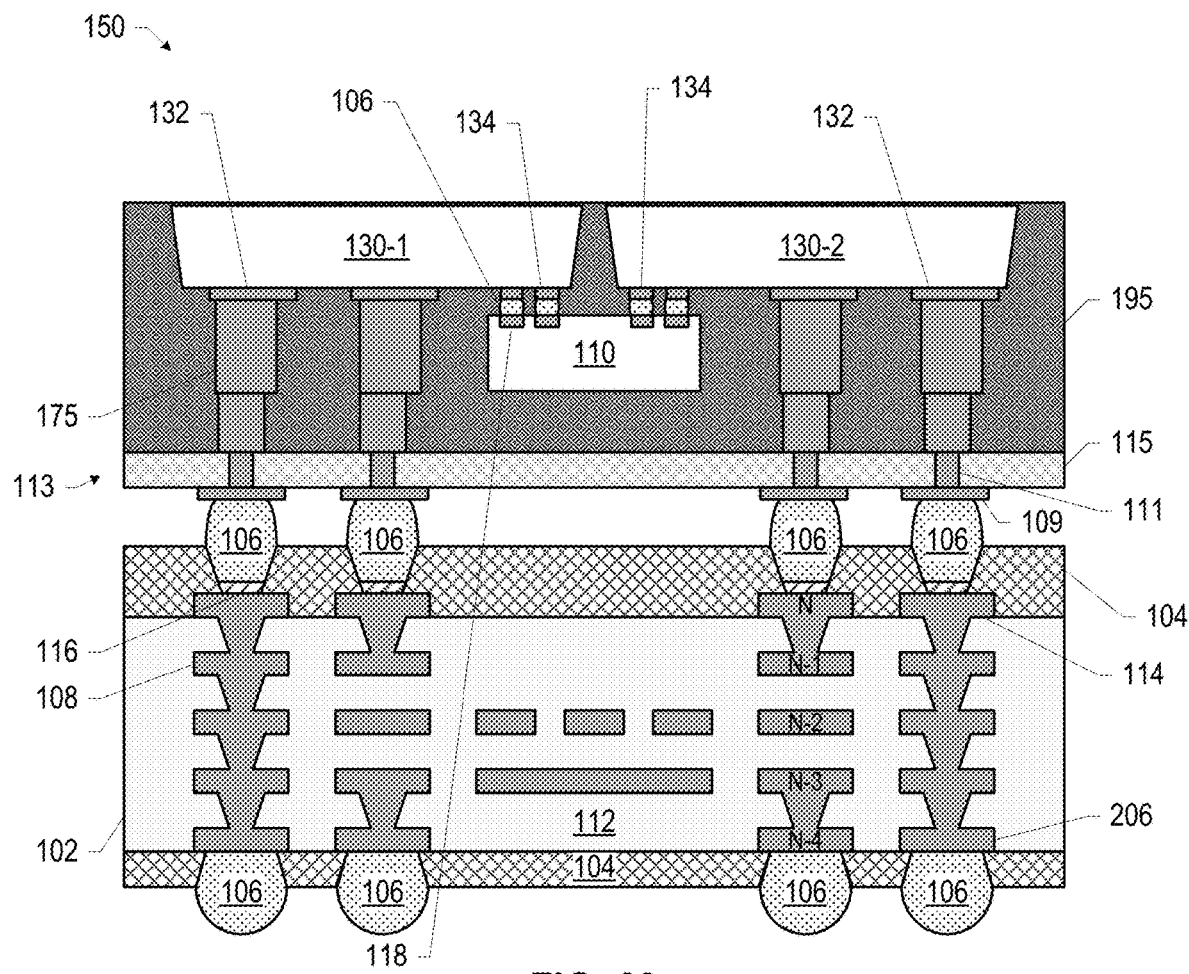
Figure 64:
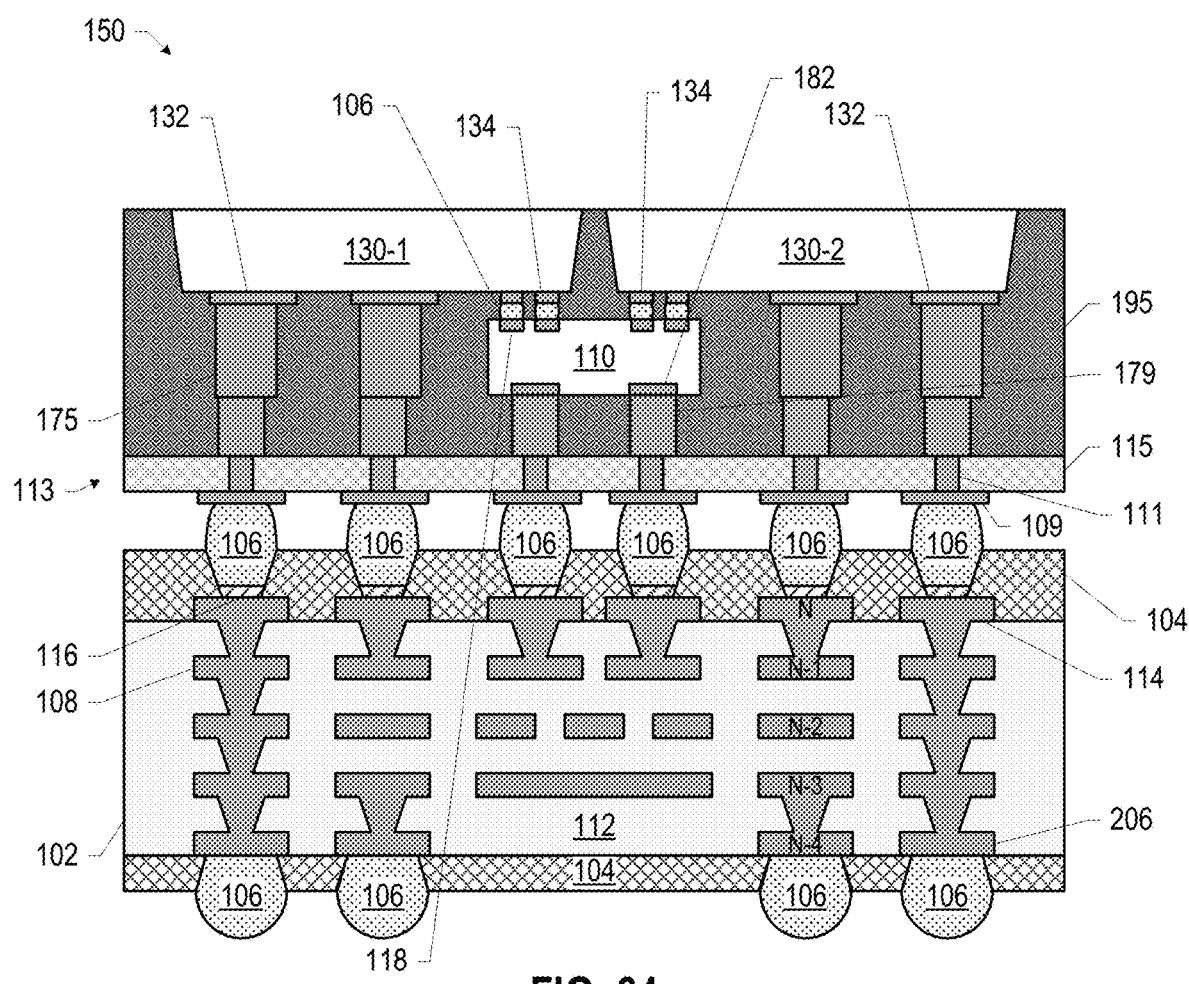

In some embodiments, the side faces of one or more of the microelectronic components 130 included in a microelectronic assembly 150 may be angled, with the microelectronic components 130 narrowing toward the substrate 102. Such tapering may enable better seed coverage and seed removal during plating operations, when the microelectronic components 130 are thick and/or close to each other. For example, FIGS. 63-64 illustrate microelectronic assemblies 150 similar to the microelectronic assemblies 150 of FIGS. 50-51, respectively, but in which the side faces of the microelectronic components 130 are angled. Further, in some embodiments, some but not all of the side faces of a microelectronic component 130 may be angled. For example, the "outer" side faces of the microelectronic components 130 in a microelectronic assembly 150 may be angled, while the "inner" side faces (i.e., the side faces of a microelectronic component 130 that "face" a side face of another microelectronic component 130) may not be angled. Any of the microelectronic assemblies 150 disclosed herein may include microelectronic components 130 with one or more angled side faces.

Although various ones of the embodiments disclosed herein have been illustrated for embodiments in which the conductive contacts 118 at the "top" face of the bridge component 110 are exposed in the microelectronic structure 100 (i.e., an "open cavity" arrangement), any suitable ones of the embodiments disclosed herein may be utilized in embodiments in which additional layers of the substrate 102 are built up over the bridge component 110, enclosing the bridge component 110 (i.e., an "embedded" arrangement). For example, FIG. 65 illustrates a microelectronic assembly 150 having a number of features in common with various ones of the embodiments disclosed herein, but in which additional dielectric material 112 and metal layers are disposed "above" the bridge component 110. As shown in FIG. 65, conductive pads and vias through this "additional" material may be used to allow microelectronic components 130 to conductively couple to the conductive contacts 118 via the intervening material of the substrate 102. Similarly, any suitable ones of the embodiments disclosed herein may be utilized in such an embedded arrangement.

The microelectronic structures 100 and microelectronic assemblies 150 disclosed herein may be included in any suitable electronic component. FIGS. 66-69 illustrate various examples of apparatuses that may include any of the microelectronic structures 100 and microelectronic assemblies 150 disclosed herein, or may be included in microelectronic structures 100 and microelectronic assemblies 150 disclosed herein, as appropriate.

Figure 66:
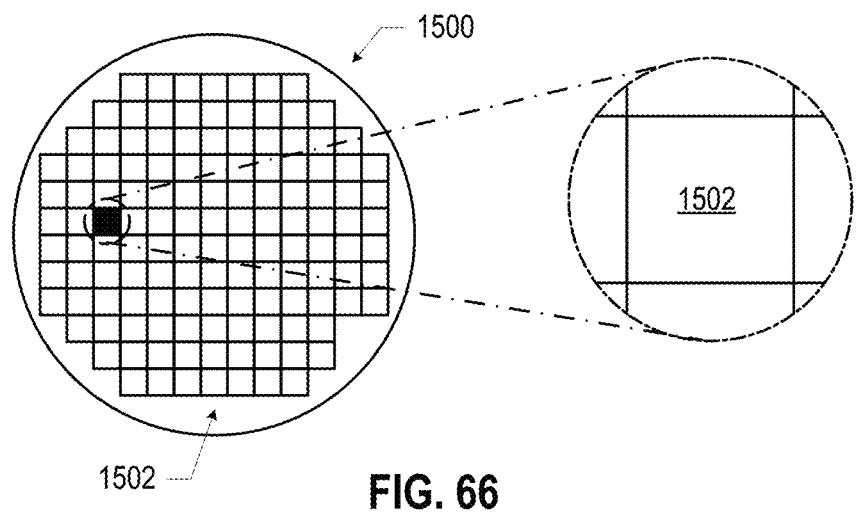
FIG. 66 is a top view of a wafer and dies that may be included in a microelectronic structure or microelectronic assembly in accordance with any of the embodiments disclosed herein.

FIG. 66 is a top view of a wafer 1500 and dies 1502 that may be included in any of the microelectronic structures 100 and microelectronic assemblies 150 disclosed herein. For example, a die 1502 may be included in a microelectronic structure 100/microelectronic assembly 150 as (or part of) a bridge component 110 and/or a microelectronic component 130. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 67, discussed below), one or more diodes, and/or supporting circuitry to route electrical signals to the transistors, as well as any other IC components. In some embodiments, a die 1502 may be a "passive" die in that it includes no active components (e.g., transistors), while in other embodiments, a die 1502 may be an "active" die in that it includes active components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 69) or other logic that is configured to store information in the memory devices or execute instructions stored in the memory array.

Figure 67:
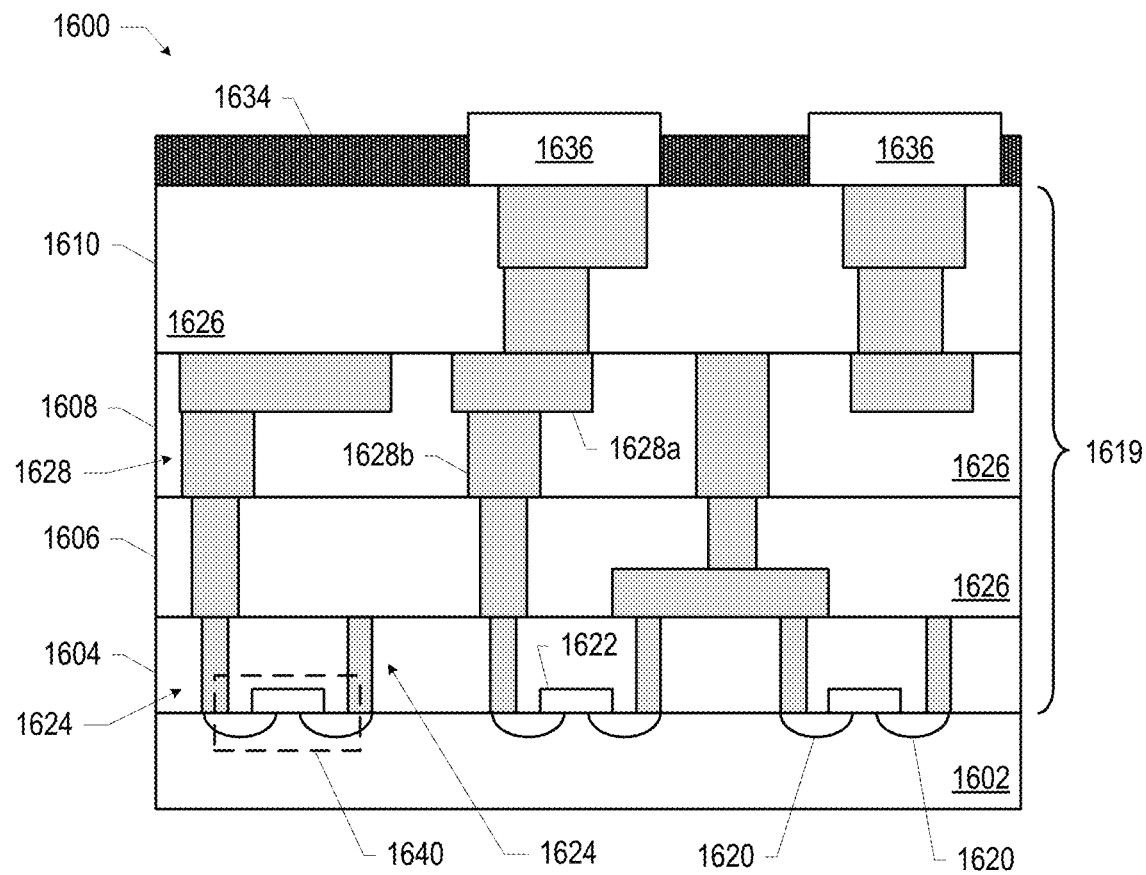
FIG. 67 is a side, cross-sectional view of an integrated circuit (IC) device that may include be included in a microelectronic structure or microelectronic assembly in accordance with any of the embodiments disclosed herein.

FIG. 67 is a side, cross-sectional view of an IC device 1600 that may be included in a microelectronic structure 100 and/or a microelectronic assembly 150. For example, an IC device 1600 may be included in a microelectronic structure 100/microelectronic assembly 150 as (or part of) a bridge component 110 and/or a microelectronic component 130. An IC device 1600 may be part of a die 1502 (e.g., as discussed above with reference to FIG. 66). One or more of the IC devices 1600 may be included in one or more dies 1502 (FIG. 66). The IC device 1600 may be formed on a substrate 1602 (e.g., the wafer 1500 of FIG. 66) and may be included in a die (e.g., the die 1502 of FIG. 66). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 66) or a wafer (e.g., the wafer 1500 of FIG. 66).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 67 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or I/O signals, may be routed to and/or from the devices (e.g., the transistors 1640) of the device layer 1604 through one or more interconnect layers disposed on the device layer 1604 (illustrated in FIG. 67 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600. In some embodiments, an IC device 1600 may be a "passive" device in that it includes no active components (e.g., transistors), while in other embodiments, a die 1502 may be an "active" die in that it includes active components.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 67). Although a particular number of interconnect layers 1606-1610 is depicted in FIG. 67, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 67. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 67. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a surface insulation material 1634 (e.g., polyimide or similar material) and one or more conductive contacts 1636 formed on the interconnect layers 1606-1610. In FIG. 67, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 68:
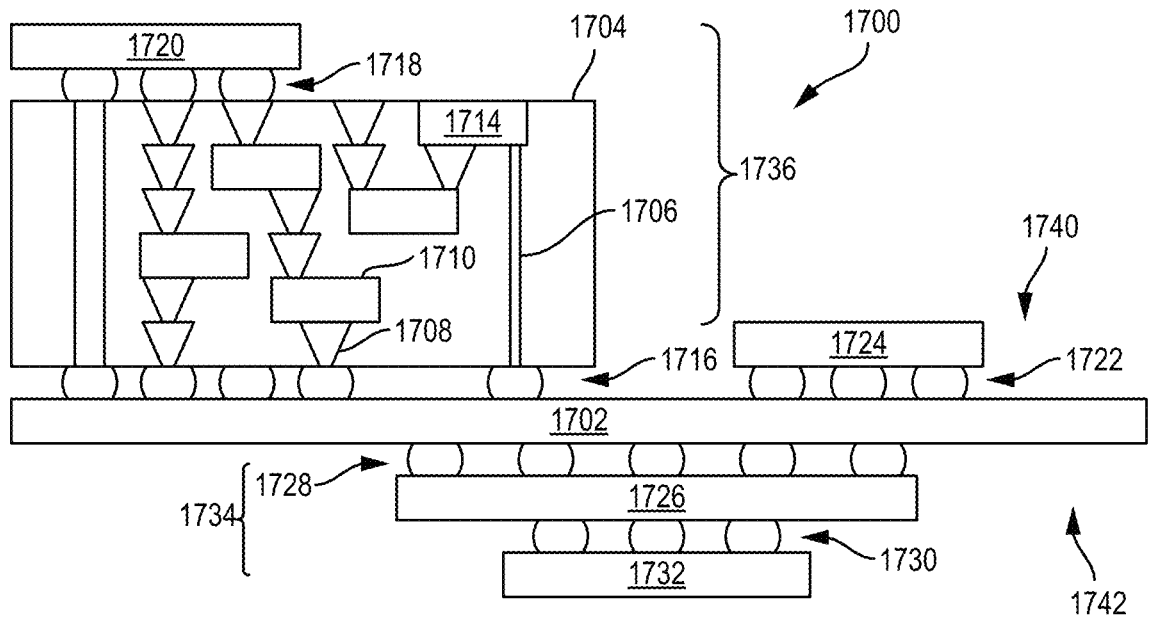
FIG. 68 is a side, cross-sectional view of an IC device assembly that may include a microelectronic structure or microelectronic assembly in accordance with any of the embodiments disclosed herein.

FIG. 68 is a side, cross-sectional view of an IC device assembly 1700 that may include one or more microelectronic structures 100 and/or microelectronic assemblies 150, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the microelectronic assemblies 150 discussed herein, or may otherwise include any of the microelectronic structures 100 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 68 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 68), male and female portions of a socket, an adhesive, an underfill material, and/or any other suitable electrical and/or mechanical coupling structure.

The package-on-interposer structure 1736 may include an IC package 1720 coupled to an package interposer 1704 by coupling components 1718. The coupling components 1718 may take any suitable form for the application, such as the forms discussed above with reference to the coupling components 1716. Although a single IC package 1720 is shown in FIG. 68, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 66), an IC device (e.g., the IC device 1600 of FIG. 67), or any other suitable component. Generally, the package interposer 1704 may spread a connection to a wider pitch or reroute a connection to a different connection. For example, the package interposer 1704 may couple the IC package 1720 (e.g., a die) to a set of ball grid array (BGA) conductive contacts of the coupling components 1716 for coupling to the circuit board 1702. In the embodiment illustrated in FIG. 68, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more microelectronic structures 100 and/or microelectronic assemblies 150.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 68 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 69:
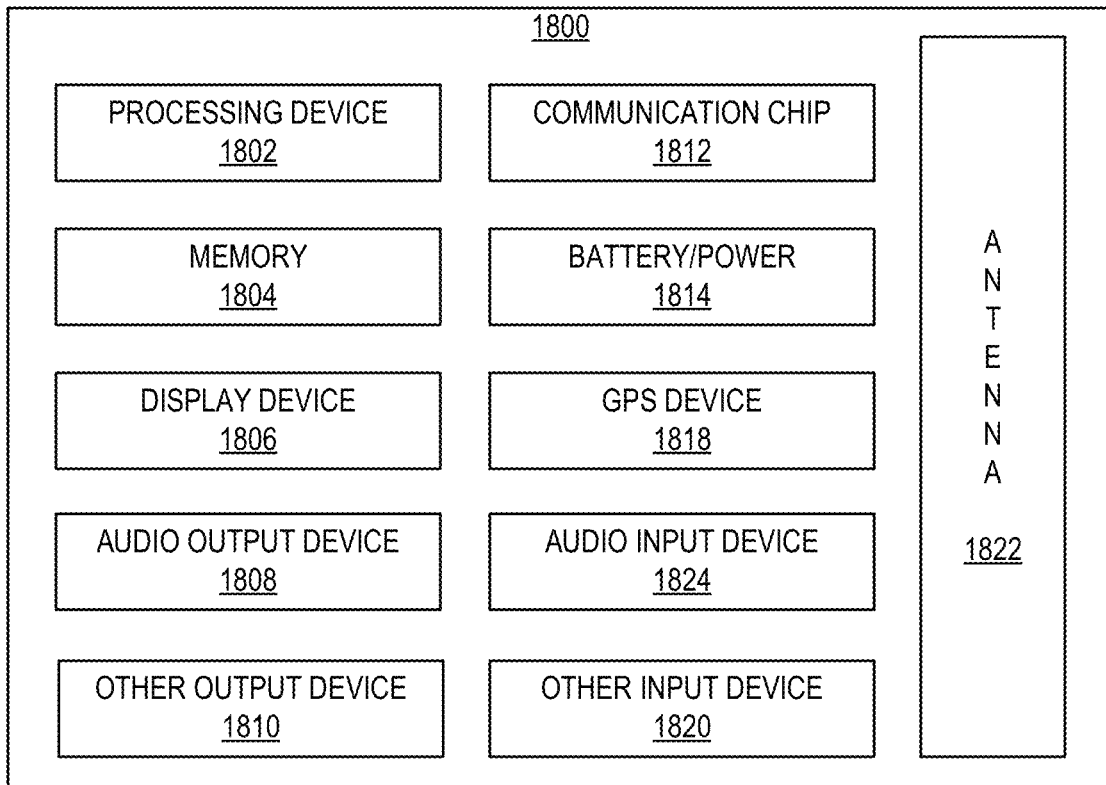
FIG. 69 is a block diagram of an example electrical device that may include a microelectronic structure or microelectronic assembly in accordance with any of the embodiments disclosed herein.

FIG. 69 is a block diagram of an example electrical device 1800 that may include one or more microelectronic structures 100 and/or microelectronic assemblies 150 in accordance with any of the embodiments disclosed herein. For example, any suitable ones of the components of the electrical device 1800 may include one or more of the microelectronic structures 100, microelectronic assemblies 150, IC device assemblies 1700, IC devices 1600, or dies 1502 disclosed herein. A number of components are illustrated in FIG. 69 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 69, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example A1 is a microelectronic assembly, including: a substrate having first conductive contacts and second conductive contacts at a face of the substrate; a first microelectronic component having third conductive contacts and fourth conductive contacts at a face of the first microelectronic component, wherein the third conductive contacts are coupled to the first conductive contacts; a second microelectronic component having fifth conductive contacts and sixth conductive contacts at a face of the second microelectronic component, wherein the fifth conductive contacts are coupled to the second conductive contacts; and a bridge component having seventh conductive contacts and eighth conductive contacts at a face of the bridge component, wherein the fourth conductive contacts are coupled to the seventh conductive contacts, the sixth conductive contacts are coupled to the eighth conductive contacts, the seventh conductive contacts have a smaller pitch than the first conductive contacts, and the eighth conductive contacts have a smaller pitch than the second conductive contacts; wherein: the microelectronic assembly further includes a first dielectric material between the first microelectronic component and the second microelectronic component; the first dielectric material has a first filler content weight-percentage; the microelectronic assembly further includes a second dielectric material between the first microelectronic component and the second microelectronic component; the second dielectric material is between the first dielectric material and the substrate; and the second dielectric material has a second filler content weight-percentage that is different than the first filler content weight-percentage.

Example A2 includes the subject matter of Example A1, and further specifies that the first filler content weight-percentage is greater than the second filler content weight-percentage.

Example A3 includes the subject matter of Example A2, and further specifies that the first filler content weight-percentage is greater than 80 weight-percent.

Example A4 includes the subject matter of Example A3, and further specifies that the first filler content weight-percentage is between 80 weight-percent and 90 weight-percent.

Example A5 includes the subject matter of any of Examples A2-4, and further specifies that the second filler content weight-percentage is less than 80 weight-percent.

Example A6 includes the subject matter of Example A5, and further specifies that the second filler content weight-percentage is between 65 weight-percent and 80 weight-percent.

Example A7 includes the subject matter of any of Examples A5-6, and further includes: a third dielectric material between the first microelectronic component and the substrate, wherein the third dielectric material has a third filler content weight-percentage, and the third filler content weight-percentage is different from the first and second filler content weight-percentages.

Example A8 includes the subject matter of Example A7, and further specifies that the third filler content weight-percentage is less than 65 weight-percent.

Example A9 includes the subject matter of Example A8, and further specifies that the third filler content weight-percentage is between 50 weight-percent and 65 weight-percent.

Example A10 includes the subject matter of any of Examples A7-9, and further specifies that the third dielectric material is an underfill material.

Example A11 includes the subject matter of any of Examples A7-10, and further specifies that the second dielectric material is an underfill material.

Example A12 includes the subject matter of any of Examples A7-11, and further specifies that the first dielectric material is a mold material.

Example A13 includes the subject matter of Example A2, and further specifies that the first filler content weight-percentage is greater than 65 weight-percent.

Example A14 includes the subject matter of Example A13, and further specifies that the first filler content weight-percentage is between 65 weight-percent and 80 weight-percent.

Example A15 includes the subject matter of any of Examples A13-14, and further specifies that the second filler content weight-percentage is less than 65 weight-percent.

Example A16 includes the subject matter of Example A15, and further specifies that the second filler content weight-percentage is between 50 weight-percent and 65 weight-percent.

Example A17 includes the subject matter of any of Examples A13-16, and further specifies that the second dielectric material extends between the first microelectronic component and the substrate.

Example A18 includes the subject matter of any of Examples A13-17, and further specifies that the second dielectric material is an underfill material.

Example A19 includes the subject matter of any of Examples A13-18, and further specifies that the first dielectric material is an underfill material.

Example A20 includes the subject matter of Example A1, and further specifies that the first filler content weight-percentage is less than the second filler content weight-percentage.

Example A21 includes the subject matter of Example A20, and further specifies that the first filler content weight-percentage is less than 80 weight-percent.

Example A22 includes the subject matter of Example A21, and further specifies that the first filler content weight-percentage is between 65 weight-percent and 80 weight-percent.

Example A23 includes the subject matter of any of Examples A21-22, and further specifies that the second filler content weight-percentage is greater than 80 weight-percent.

Example A24 includes the subject matter of Example A23, and further specifies that the second filler content weight-percentage is between 80 weight-percent and 90 weight-percent.

Example A25 includes the subject matter of any of Examples A20-24, and further specifies that the second dielectric material extends between the first microelectronic component and the substrate.

Example A26 includes the subject matter of any of Examples A23-25, and further includes: a third dielectric material between the second dielectric material and the substrate, wherein the third dielectric material has a third filler content weight-percentage, and the third filler content weight-percentage is different from the first and second filler content weight-percentages.

Example A27 includes the subject matter of Example A26, and further specifies that the third filler content weight-percentage is less than 65 weight-percent.

Example A28 includes the subject matter of Example A27, and further specifies that the third filler content weight-percentage is between 50 weight-percent and 65 weight-percent.

Example A29 includes the subject matter of any of Examples A26-28, and further specifies that the third dielectric material is an underfill material.

Example A30 includes the subject matter of any of Examples A26-29, and further specifies that the second dielectric material is a mold material.

Example A31 includes the subject matter of any of Examples A26-30, and further specifies that the first dielectric material is an underfill material.

Example A32 includes the subject matter of any of Examples A1-31, and further specifies that the face of the bridge component is a first face, the bridge component includes a second face opposite to the first face, the bridge component includes ninth conductive contacts at the second face of the bridge component, the substrate includes tenth conductive contacts at the face of the substrate, and the ninth conductive contacts are coupled to the tenth conductive contacts.

Example A33 includes the subject matter of any of Examples A1-32, and further specifies that the substrate includes an organic dielectric material.

Example A34 includes the subject matter of any of Examples A1-33, and further specifies that the first microelectronic component includes a graphics processor.

Example A35 includes the subject matter of any of Examples A1-34, and further specifies that the second microelectronic component includes a server processor.

Example A36 includes the subject matter of any of Examples A1-35, and further specifies that the microelectronic assembly further includes a support material, the first microelectronic component is between the support material and the substrate, and the second microelectronic component is between the support material and the substrate.

Example A37 includes the subject matter of Example A36, and further specifies that the support material has a thickness between 100 microns and 500 microns.

Example A38 includes the subject matter of any of Examples A36-37, and further specifies that the support material includes a first portion and a second portion, the first microelectronic component is between the first portion and the substrate, the second microelectronic component is between the second portion and the substrate, and the first portion does not contact the second portion.

Example A39 includes the subject matter of any of Examples A36-38, and further specifies that the support material includes silicon.

Example A40 includes the subject matter of any of Examples A36-39, and further specifies that the support material includes metal.

Example A41 includes the subject matter of any of Examples A36-40, and further specifies that the support material includes glass.

Example A42 includes the subject matter of any of Examples A36-41, and further includes: an attach material between the support material and the first microelectronic component.

Example A43 includes the subject matter of Example A42, and further specifies that the attach material includes a die-attach film.

Example A44 includes the subject matter of any of Examples A42-43, and further specifies that the attach material includes solder.

Example A45 includes the subject matter of any of Examples A42-44, and further specifies that the attach material includes epoxy.

Example A46 is a microelectronic assembly, including: a substrate having first conductive contacts and second conductive contacts at a face of the substrate; a first microelectronic component having third conductive contacts and fourth conductive contacts at a face of the first microelectronic component, wherein the third conductive contacts are coupled to the first conductive contacts; a second microelectronic component having fifth conductive contacts and sixth conductive contacts at a face of the second microelectronic component, wherein the fifth conductive contacts are coupled to the second conductive contacts; and a bridge component having seventh conductive contacts and eighth conductive contacts at a face of the bridge component, wherein the fourth conductive contacts are coupled to the seventh conductive contacts, the sixth conductive contacts are coupled to the eighth conductive contacts, the seventh conductive contacts have a smaller pitch than the first conductive contacts, and the eighth conductive contacts have a smaller pitch than the second conductive contacts; wherein: the microelectronic assembly further includes a first dielectric material between the first microelectronic component and the second microelectronic component; the first dielectric material has a first filler content weight-percentage that is less than 80 weight-percent; the microelectronic assembly further includes a second dielectric material between the first microelectronic component and the substrate; and the second dielectric material has a second filler content weight-percentage that is less than the first filler content weight-percentage.

Example A47 includes the subject matter of Example A46, and further specifies that the first filler content weight-percentage is between 80 weight-percent and 90 weight-percent.

Example A48 includes the subject matter of any of Examples A46-47, and further specifies that the second filler content weight-percentage is less than 80 weight-percent.

Example A49 includes the subject matter of Example A48, and further specifies that the second filler content weight-percentage is between 65 weight-percent and 80 weight-percent.

Example A50 includes the subject matter of any of Examples A46-49, and further specifies that the second dielectric material is an underfill material.

Example A51 includes the subject matter of any of Examples A46-50, and further specifies that the first dielectric material is an underfill material.

Example A52 includes the subject matter of any of Examples A46-51, and further specifies that the substrate includes an organic dielectric material.

Example A53 includes the subject matter of any of Examples A46-52, and further specifies that the first microelectronic component includes a graphics processor.

Example A54 includes the subject matter of any of Examples A46-53, and further specifies that the second microelectronic component includes a server processor.

Example A55 includes the subject matter of any of Examples A46-54, and further specifies that the face of the bridge component is a first face, the bridge component includes a second face opposite to the first face, the bridge component includes ninth conductive contacts at the second face of the bridge component, the substrate includes tenth conductive contacts at the face of the substrate, and the ninth conductive contacts are coupled to the tenth conductive contacts.

Example A56 includes the subject matter of any of Examples A46-55, and further specifies that the microelectronic assembly further includes a support material, the first microelectronic component is between the support material and the substrate, and the second microelectronic component is between the support material and the substrate.

Example A57 includes the subject matter of Example A56, and further specifies that the support material has a thickness between 100 microns and 500 microns.

Example A58 includes the subject matter of any of Examples A56-57, and further specifies that the support material includes a first portion and a second portion, the first microelectronic component is between the first portion and the substrate, the second microelectronic component is between the second portion and the substrate, and the first portion does not contact the second portion.

Example A59 includes the subject matter of any of Examples A56-58, and further specifies that the support material includes silicon.

Example A60 includes the subject matter of any of Examples A56-59, and further specifies that the support material includes metal.

Example A61 includes the subject matter of any of Examples A56-60, and further specifies that the support material includes glass.

Example A62 includes the subject matter of any of Examples A56-61, and further includes: an attach material between the support material and the first microelectronic component.

Example A63 includes the subject matter of Example A62, and further specifies that the attach material includes a die-attach film.

Example A64 includes the subject matter of any of Examples A62-63, and further specifies that the attach material includes solder.

Example A65 includes the subject matter of any of Examples A62-64, and further specifies that the attach material includes epoxy.

Example A66 is a microelectronic assembly, including: a substrate having first conductive contacts and second conductive contacts at a face of the substrate; a first microelectronic component having third conductive contacts and fourth conductive contacts at a face of the first microelectronic component, wherein the third conductive contacts are coupled to the first conductive contacts; a second microelectronic component having fifth conductive contacts and sixth conductive contacts at a face of the second microelectronic component, wherein the fifth conductive contacts are coupled to the second conductive contacts; and a bridge component having seventh conductive contacts and eighth conductive contacts at a face of the bridge component, wherein the fourth conductive contacts are coupled to the seventh conductive contacts, the sixth conductive contacts are coupled to the eighth conductive contacts, the seventh conductive contacts have a smaller pitch than the first conductive contacts, and the eighth conductive contacts have a smaller pitch than the second conductive contacts; wherein: the microelectronic assembly further includes a dielectric material between the first microelectronic component and the second microelectronic component; and the dielectric material has a filler content weight-percentage between 65 weight-percent and 80 weight-percent.

Example A67 includes the subject matter of Example A66, and further specifies that: the dielectric material is a first dielectric material; the filler content weight-percentage is a first filler content weight-percentage; the microelectronic assembly further includes a second dielectric material between the first microelectronic component and the second microelectronic component; the first dielectric material is between the second dielectric material and the substrate; and the second dielectric material has a second filler content weight-percentage that is different than the first filler content weight-percentage.

Example A68 includes the subject matter of Example A67, and further specifies that the second filler content weight-percentage is greater than the second filler content weight-percentage.

Example A69 includes the subject matter of Example A68, and further specifies that the second filler content weight-percentage is greater than 80 weight-percent.

Example A70 includes the subject matter of Example A69, and further specifies that the second filler content weight-percentage is between 80 weight-percent and 90 weight-percent.

Example A71 includes the subject matter of any of Examples A67-70, and further includes: a third dielectric material between the first microelectronic component and the substrate, wherein the third dielectric material has a third filler content weight-percentage, and the third filler content weight-percentage is different from the first and second filler content weight-percentages.

Example A72 includes the subject matter of Example A71, and further specifies that the third filler content weight-percentage is less than 65 weight-percent.

Example A73 includes the subject matter of Example A72, and further specifies that the third filler content weight-percentage is between 50 weight-percent and 65 weight-percent.

Example A74 includes the subject matter of any of Examples A71-73, and further specifies that the third dielectric material is an underfill material.

Example A75 includes the subject matter of any of Examples A71-74, and further specifies that the second dielectric material is an underfill material.

Example A76 includes the subject matter of any of Examples A71-75, and further specifies that the first dielectric material is a mold material.

Example A77 includes the subject matter of Example A76, and further specifies that: the dielectric material is a first dielectric material; the filler content weight-percentage is a first filler content weight-percentage; the microelectronic assembly further includes a second dielectric material between the first microelectronic component and the second microelectronic component; the second dielectric material is between the first dielectric material and the substrate; and the second dielectric material has a second filler content weight-percentage that is different than the first filler content weight-percentage.

Example A78 includes the subject matter of Example A77, and further specifies that the second filler content weight-percentage is less than the first filler content weight-percentage.

Example A79 includes the subject matter of Example A78, and further specifies that the second filler content weight-percentage is less than 65 weight-percent.

Example A80 includes the subject matter of Example A79, and further specifies that the second filler content weight-percentage is between 50 weight-percent and 65 weight-percent.

Example A81 includes the subject matter of any of Examples A78-80, and further specifies that the second dielectric material extends between the first microelectronic component and the substrate.

Example A82 includes the subject matter of any of Examples A78-81, and further specifies that the second dielectric material is an underfill material.

Example A83 includes the subject matter of any of Examples A78-82, and further specifies that the first dielectric material is an underfill material.

Example A84 includes the subject matter of Example A77, and further specifies that the second filler content weight-percentage is greater than the first filler content weight-percentage.

Example A85 includes the subject matter of Example A84, and further specifies that the second filler content weight-percentage is greater than 80 weight-percent.

Example A86 includes the subject matter of Example A85, and further specifies that the second filler content weight-percentage is between 80 weight-percent and 90 weight-percent.

Example A87 includes the subject matter of any of Examples A84-86, and further specifies that the second dielectric material extends between the first microelectronic component and the substrate.

Example A88 includes the subject matter of any of Examples A84-87, and further includes: a third dielectric material between the second dielectric material and the substrate, wherein the third dielectric material has a third filler content weight-percentage, and the third filler content weight-percentage is different from the first and second filler content weight-percentages.

Example A89 includes the subject matter of Example A88, and further specifies that the third filler content weight-percentage is less than 65 weight-percent.

Example A90 includes the subject matter of Example A89, and further specifies that the third filler content weight-percentage is between 50 weight-percent and 65 weight-percent.

Example A91 includes the subject matter of any of Examples A88-90, and further specifies that the third dielectric material is an underfill material.

Example A92 includes the subject matter of any of Examples A88-91, and further specifies that the second dielectric material is a mold material.

Example A93 includes the subject matter of any of Examples A88-92, and further specifies that the first dielectric material is an underfill material.

Example A94 includes the subject matter of any of Examples A66-93, and further specifies that the face of the bridge component is a first face, the bridge component includes a second face opposite to the first face, the bridge component includes ninth conductive contacts at the second face of the bridge component, the substrate includes tenth conductive contacts at the face of the substrate, and the ninth conductive contacts are coupled to the tenth conductive contacts.

Example A95 includes the subject matter of any of Examples A66-94, and further specifies that the substrate includes an organic dielectric material.

Example A96 includes the subject matter of any of Examples A66-95, and further specifies that the first microelectronic component includes a graphics processor.

Example A97 includes the subject matter of any of Examples A66-96, and further specifies that the second microelectronic component includes a server processor.

Example A98 includes the subject matter of any of Examples A66-97, and further specifies that the microelectronic assembly further includes a support material, the first microelectronic component is between the support material and the substrate, and the second microelectronic component is between the support material and the substrate.

Example A99 includes the subject matter of Example A98, and further specifies that the support material has a thickness between 100 microns and 500 microns.

Example A100 includes the subject matter of any of Examples A98-99, and further specifies that the support material includes a first portion and a second portion, the first microelectronic component is between the first portion and the substrate, the second microelectronic component is between the second portion and the substrate, and the first portion does not contact the second portion.

Example A101 includes the subject matter of any of Examples A98-100, and further specifies that the support material includes silicon.

Example A102 includes the subject matter of any of Examples A98-101, and further specifies that the support material includes metal.

Example A103 includes the subject matter of any of Examples A98-102, and further specifies that the support material includes glass.

Example A104 includes the subject matter of any of Examples A98-103, and further includes: an attach material between the support material and the first microelectronic component.

Example A105 includes the subject matter of Example A104, and further specifies that the attach material includes a die-attach film.

Example A106 includes the subject matter of any of Examples A104-105, and further specifies that the attach material includes solder.

Example A107 includes the subject matter of any of Examples A104-106, and further specifies that the attach material includes epoxy.

Example A108 is an electronic device, including: a circuit board; and a microelectronic assembly conductively coupled to the circuit board, wherein the microelectronic assembly includes any of the microelectronic assemblies of any of Examples A1-107.

Example A109 includes the subject matter of Example A108, and further specifies that the electronic device is a handheld computing device, a laptop computing device, a wearable computing device, or a server computing device.

Example A110 includes the subject matter of any of Examples A108-109, and further specifies that the circuit board is a motherboard.

Example A111 includes the subject matter of any of Examples A108-110, and further includes: a display communicatively coupled to the circuit board.

Example A112 includes the subject matter of Example A111, and further specifies that the display includes a touchscreen display.

Example A113 includes the subject matter of any of Examples A108-112, and further includes: a housing around the circuit board and the microelectronic assembly.

Example B1 is a microelectronic assembly, including: a substrate having first conductive contacts and second conductive contacts at a face of the substrate; a first microelectronic component having third conductive contacts and fourth conductive contacts at a face of the first microelectronic component, wherein the third conductive contacts are coupled to the first conductive contacts; a second microelectronic component having fifth conductive contacts and sixth conductive contacts at a face of the second microelectronic component, wherein the fifth conductive contacts are coupled to the second conductive contacts; and a bridge component having seventh conductive contacts and eighth conductive contacts at a face of the bridge component, wherein the fourth conductive contacts are coupled to the seventh conductive contacts, the sixth conductive contacts are coupled to the eighth conductive contacts, the seventh conductive contacts have a smaller pitch than the first conductive contacts, and the eighth conductive contacts have a smaller pitch than the second conductive contacts; wherein: the microelectronic assembly further includes a support material, the first microelectronic component is between the support material and the substrate, and the second microelectronic component is between the support material and the substrate; the third conductive contacts are coupled to the first conductive contacts by interconnects; and an individual interconnect includes at least one conductive pillar and a single solder region between the associated individual third conductive contact and the associated individual first conductive contact.

Example B2 includes the subject matter of Example B1, and further specifies that the solder region of an individual interconnect is closer to the substrate than to the first microelectronic component.

Example B3 includes the subject matter of Example B2, and further specifies that the solder region of an individual interconnect is between the associated individual first conductive contact and the at least one conductive pillar.

Example B4 includes the subject matter of Example B2, and further specifies that the solder region of an individual interconnect contacts the associated individual first conductive contact.

Example B5 includes the subject matter of Example B1, and further specifies that the solder region of an individual interconnect is closer to the first microelectronic component than to the substrate.

Example B6 includes the subject matter of Example B5, and further specifies that the solder region of an individual interconnect is between the associated individual third conductive contact and the at least one conductive pillar.

Example B7 includes the subject matter of Example B6, and further specifies that the solder region of an individual interconnect contacts the associated individual third conductive contact.

Example B8 includes the subject matter of any of Examples B1-7, and further includes: a dielectric material, wherein the dielectric material extends between the substrate and the first microelectronic component.

Example B9 includes the subject matter of Example B8, and further specifies that the dielectric material extends between the first microelectronic component and the second microelectronic component.

Example B10 includes the subject matter of any of Examples B8-9, and further specifies that the dielectric material extends between the substrate and the bridge component.

Example B11 includes the subject matter of any of Examples B8-10, and further specifies that the dielectric material extends between the first microelectronic component and the bridge component.

Example B12 includes the subject matter of any of Examples B8-11, and further specifies that the dielectric material extends between the substrate and the support material.

Example B13 includes the subject matter of any of Examples B8-12, and further specifies that the dielectric material has a filler content weight-percentage that is less than 80 weight-percent.

Example B14 includes the subject matter of any of Examples B8-12, and further specifies that the dielectric material has a filler content weight-percentage that is less than 65 weight-percent.

Example B15 includes the subject matter of any of Examples B8-14, and further specifies that the dielectric material has angled side faces.

Example B16 includes the subject matter of any of Examples B1-15, and further specifies that the at least one conductive pillar includes two or more conductive pillars.

Example B17 includes the subject matter of Example B16, and further specifies that the solder region of an individual interconnect is between conductive pillars of the individual interconnect.

Example B18 includes the subject matter of any of Examples B1-17, and further specifies that the face of the bridge component is a first face, the bridge component includes a second face opposite to the first face, the bridge component includes ninth conductive contacts at the second face of the bridge component, the substrate includes tenth conductive contacts at the face of the substrate, and the ninth conductive contacts are coupled to the tenth conductive contacts.

Example B19 includes the subject matter of any of Examples B1-18, and further specifies that the substrate includes an organic dielectric material.

Example B20 includes the subject matter of any of Examples B1-19, and further specifies that the first microelectronic component includes a graphics processor.

Example B21 includes the subject matter of any of Examples B1-20, and further specifies that the second microelectronic component includes a server processor.

Example B22 includes the subject matter of any of Examples B1-21, and further specifies that the support material has a thickness between 100 microns and 500 microns.

Example B23 includes the subject matter of any of Examples B1-22, and further specifies that the support material includes a first portion and a second portion, the first microelectronic component is between the first portion and the substrate, the second microelectronic component is between the second portion and the substrate, and the first portion does not contact the second portion.

Example B24 includes the subject matter of any of Examples B1-23, and further specifies that the support material includes silicon.

Example B25 includes the subject matter of any of Examples B1-24, and further specifies that the support material includes metal.

Example B26 includes the subject matter of any of Examples B1-25, and further specifies that the support material includes glass.

Example B27 includes the subject matter of any of Examples B1-26, and further includes: an attach material between the support material and the first microelectronic component.

Example B28 includes the subject matter of Example B27, and further specifies that the attach material includes a die-attach film.

Example B29 includes the subject matter of any of Examples B27-28, and further specifies that the attach material includes solder.

Example B30 includes the subject matter of any of Examples B27-29, and further specifies that the attach material includes epoxy.

Example B31 is a microelectronic assembly, including: a substrate having first conductive contacts and second conductive contacts at a face of the substrate; a first microelectronic component having third conductive contacts and fourth conductive contacts at a face of the first microelectronic component, wherein the third conductive contacts are coupled to the first conductive contacts; a second microelectronic component having fifth conductive contacts and sixth conductive contacts at a face of the second microelectronic component, wherein the fifth conductive contacts are coupled to the second conductive contacts; and a bridge component having seventh conductive contacts and eighth conductive contacts at a face of the bridge component, wherein the fourth conductive contacts are coupled to the seventh conductive contacts, the sixth conductive contacts are coupled to the eighth conductive contacts, the seventh conductive contacts have a smaller pitch than the first conductive contacts, and the eighth conductive contacts have a smaller pitch than the second conductive contacts; wherein: a dielectric material, wherein the dielectric material extends between the substrate and the first microelectronic component; the third conductive contacts are coupled to the first conductive contacts by interconnects; and an individual interconnect includes at least one conductive pillar and a single solder region between the associated individual third conductive contact and the associated individual first conductive contact.

Example B32 includes the subject matter of Example B31, and further specifies that the solder region of an individual interconnect is closer to the substrate than to the first microelectronic component.

Example B33 includes the subject matter of Example B32, and further specifies that the solder region of an individual interconnect is between the associated individual first conductive contact and the at least one conductive pillar.

Example B34 includes the subject matter of Example B32, and further specifies that the solder region of an individual interconnect contacts the associated individual first conductive contact.

Example B35 includes the subject matter of Example B31, and further specifies that the solder region of an individual interconnect is closer to the first microelectronic component than to the substrate.

Example B36 includes the subject matter of Example B35, and further specifies that the solder region of an individual interconnect is between the associated individual third conductive contact and the at least one conductive pillar.

Example B37 includes the subject matter of Example B36, and further specifies that the solder region of an individual interconnect contacts the associated individual third conductive contact.

Example B38 includes the subject matter of any of Examples B31-37, and further specifies that the dielectric material extends between the first microelectronic component and the second microelectronic component.

Example B39 includes the subject matter of any of Examples B31-38, and further specifies that the dielectric material extends between the substrate and the bridge component.

Example B40 includes the subject matter of any of Examples B31-39, and further specifies that the dielectric material extends between the first microelectronic component and the bridge component.

Example B41 includes the subject matter of any of Examples B31-40, and further specifies that the dielectric material has a filler content weight-percentage that is less than 80 weight-percent.

Example B42 includes the subject matter of any of Examples B31-41, and further specifies that the dielectric material has a filler content weight-percentage that is less than 65 weight-percent.

Example B43 includes the subject matter of any of Examples B31-42, and further specifies that the dielectric material has angled side faces.

Example B44 includes the subject matter of any of Examples B31-43, and further specifies that the at least one conductive pillar includes two or more conductive pillars.

Example B45 includes the subject matter of Example B44, and further specifies that the solder region of an individual interconnect is between conductive pillars of the individual interconnect.

Example B46 includes the subject matter of any of Examples B31-45, and further specifies that the face of the bridge component is a first face, the bridge component includes a second face opposite to the first face, the bridge component includes ninth conductive contacts at the second face of the bridge component, the substrate includes tenth conductive contacts at the face of the substrate, and the ninth conductive contacts are coupled to the tenth conductive contacts.

Example B47 includes the subject matter of any of Examples B31-46, and further specifies that the substrate includes an organic dielectric material.

Example B48 includes the subject matter of any of Examples B31-47, and further specifies that the first microelectronic component includes a graphics processor.

Example B49 includes the subject matter of any of Examples B31-48, and further specifies that the second microelectronic component includes a server processor.

Example B50 includes the subject matter of any of Examples B31-49, and further specifies that the microelectronic assembly further includes a support material, the first microelectronic component is between the support material and the substrate, and the second microelectronic component is between the support material and the substrate.

Example B51 includes the subject matter of Example B50, and further specifies that the dielectric material extends between the substrate and the support material.

Example B52 includes the subject matter of any of Examples B50-51, and further specifies that the support material has a thickness between 100 microns and 500 microns.

Example B53 includes the subject matter of any of Examples B50-52, and further specifies that the support material includes a first portion and a second portion, the first microelectronic component is between the first portion and the substrate, the second microelectronic component is between the second portion and the substrate, and the first portion does not contact the second portion.

Example B54 includes the subject matter of any of Examples B50-53, and further specifies that the support material includes silicon.

Example B55 includes the subject matter of any of Examples B50-54, and further specifies that the support material includes metal.

Example B56 includes the subject matter of any of Examples B50-55, and further specifies that the support material includes glass.

Example B57 includes the subject matter of any of Examples B50-56, and further includes: an attach material between the support material and the first microelectronic component.

Example B58 includes the subject matter of Example B57, and further specifies that the attach material includes a die-attach film.

Example B59 includes the subject matter of any of Examples B57-58, and further specifies that the attach material includes solder.

Example B60 includes the subject matter of any of Examples B57-59, and further specifies that the attach material includes epoxy.

Example B61 is a microelectronic assembly, including: a substrate having first conductive contacts and second conductive contacts at a face of the substrate; a first microelectronic component having third conductive contacts and fourth conductive contacts at a face of the first microelectronic component, wherein the third conductive contacts are coupled to the first conductive contacts; a second microelectronic component having fifth conductive contacts and sixth conductive contacts at a face of the second microelectronic component, wherein the fifth conductive contacts are coupled to the second conductive contacts; and a bridge component having seventh conductive contacts and eighth conductive contacts at a face of the bridge component, wherein the fourth conductive contacts are coupled to the seventh conductive contacts, the sixth conductive contacts are coupled to the eighth conductive contacts, the seventh conductive contacts have a smaller pitch than the first conductive contacts, and the eighth conductive contacts have a smaller pitch than the second conductive contacts; wherein: the third conductive contacts are coupled to the first conductive contacts by interconnects; and an individual interconnect includes at least one conductive pillar and a single solder region between the associated individual third conductive contact and the associated individual first conductive contact.

Example B62 includes the subject matter of Example B61, and further specifies that the solder region of an individual interconnect is closer to the substrate than to the first microelectronic component.

Example B63 includes the subject matter of Example B62, and further specifies that the solder region of an individual interconnect is between the associated individual first conductive contact and the at least one conductive pillar.

Example B64 includes the subject matter of Example B62, and further specifies that the solder region of an individual interconnect contacts the associated individual first conductive contact.

Example B65 includes the subject matter of Example B61, and further specifies that the solder region of an individual interconnect is closer to the first microelectronic component than to the substrate.

Example B66 includes the subject matter of Example B65, and further specifies that the solder region of an individual interconnect is between the associated individual third conductive contact and the at least one conductive pillar.

Example B67 includes the subject matter of Example B66, and further specifies that the solder region of an individual interconnect contacts the associated individual third conductive contact.

Example B68 includes the subject matter of any of Examples B61-67, and further includes: a dielectric material, wherein the dielectric material extends between the substrate and the first microelectronic component.

Example B69 includes the subject matter of Example B68, and further specifies that the dielectric material extends between the first microelectronic component and the second microelectronic component.

Example B70 includes the subject matter of any of Examples B68-69, and further specifies that the dielectric material extends between the substrate and the bridge component.

Example B71 includes the subject matter of any of Examples B68-70, and further specifies that the dielectric material extends between the first microelectronic component and the bridge component.

Example B72 includes the subject matter of any of Examples B68-71, and further specifies that the dielectric material has a filler content weight-percentage that is less than 80 weight-percent.

Example B73 includes the subject matter of any of Examples B68-71, and further specifies that the dielectric material has a filler content weight-percentage that is less than 65 weight-percent.

Example B74 includes the subject matter of any of Examples B68-73, and further specifies that the dielectric material has angled side faces.

Example B75 includes the subject matter of any of Examples B61-74, and further specifies that the at least one conductive pillar includes two or more conductive pillars.

Example B76 includes the subject matter of Example B75, and further specifies that the solder region of an individual interconnect is between conductive pillars of the individual interconnect.

Example B77 includes the subject matter of any of Examples B61-76, and further specifies that the face of the bridge component is a first face, the bridge component includes a second face opposite to the first face, the bridge component includes ninth conductive contacts at the second face of the bridge component, the substrate includes tenth conductive contacts at the face of the substrate, and the ninth conductive contacts are coupled to the tenth conductive contacts.

Example B78 includes the subject matter of any of Examples B61-77, and further specifies that the substrate includes an organic dielectric material.

Example B79 includes the subject matter of any of Examples B61-78, and further specifies that the first microelectronic component includes a graphics processor.

Example B80 includes the subject matter of any of Examples B61-79, and further specifies that the second microelectronic component includes a server processor.

Example B81 includes the subject matter of any of Examples B61-80, and further specifies that the microelectronic assembly further includes a support material, the first microelectronic component is between the support material and the substrate, and the second microelectronic component is between the support material and the substrate.

Example B82 includes the subject matter of Example B81, and further specifies that the support material has a thickness between 100 microns and 500 microns.

Example B83 includes the subject matter of any of Examples B81-82, and further specifies that the support material includes a first portion and a second portion, the first microelectronic component is between the first portion and the substrate, the second microelectronic component is between the second portion and the substrate, and the first portion does not contact the second portion.

Example B84 includes the subject matter of any of Examples B61-83, and further specifies that the support material includes silicon.

Example B85 includes the subject matter of any of Examples B61-84, and further specifies that the support material includes metal.

Example B86 includes the subject matter of any of Examples B61-85, and further specifies that the support material includes glass.

Example B87 includes the subject matter of any of Examples B61-86, and further includes: an attach material between the support material and the first microelectronic component.

Example B88 includes the subject matter of Example B87, and further specifies that the attach material includes a die-attach film.

Example B89 includes the subject matter of any of Examples B87-88, and further specifies that the attach material includes solder.

Example B90 includes the subject matter of any of Examples B87-89, and further specifies that the attach material includes epoxy.

Example B91 is an electronic device, including: a circuit board; and a microelectronic assembly conductively coupled to the circuit board, wherein the microelectronic assembly includes any of the microelectronic assemblies of any of Examples B-90.

Example B92 includes the subject matter of Example B91, and further specifies that the electronic device is a handheld computing device, a laptop computing device, a wearable computing device, or a server computing device.

Example B93 includes the subject matter of any of Examples B91-92, and further specifies that the circuit board is a motherboard.

Example B94 includes the subject matter of any of Examples B91-93, and further includes: a display communicatively coupled to the circuit board.

Example B95 includes the subject matter of Example B94, and further specifies that the display includes a touchscreen display.

Example B96 includes the subject matter of any of Examples B91-95, and further includes: a housing around the circuit board and the microelectronic assembly.

Example C1 is a microelectronic assembly, including: a substrate having first conductive contacts and second conductive contacts at a face of the substrate; a first microelectronic component having third conductive contacts and fourth conductive contacts at a face of the first microelectronic component, wherein the third conductive contacts are coupled to the first conductive contacts; a second microelectronic component having fifth conductive contacts and sixth conductive contacts at a face of the second microelectronic component, wherein the fifth conductive contacts are coupled to the second conductive contacts; and a bridge component having seventh conductive contacts and eighth conductive contacts at a face of the bridge component, wherein the fourth conductive contacts are coupled to the seventh conductive contacts, the sixth conductive contacts are coupled to the eighth conductive contacts, the seventh conductive contacts have a smaller pitch than the first conductive contacts, and the eighth conductive contacts have a smaller pitch than the second conductive contacts; wherein: the third conductive contacts are coupled to the first conductive contacts by interconnects; an individual interconnect includes at least one conductive pillar in contact with the associated individual third conductive contact and a single solder region between the at least one conductive pillar and the associated individual first conductive contact; and a dielectric material between the substrate and the first microelectronic component.

Example C2 includes the subject matter of Example C1, and further specifies that the at least one conductive pillar includes a stack of multiple conductive pillars.

Example C3 includes the subject matter of Example C2, and further specifies that a diameter of a first conductive pillar in the stack is less than a diameter of a second conductive pillar in the stack, and the first conductive pillar is between the second conductive pillar and the substrate.

Example C4 includes the subject matter of any of Examples C2-3, and further specifies that the stack of multiple conductive pillars has a stepped profile.

Example C5 includes the subject matter of any of Examples C1-4, and further specifies that the first microelectronic component and the second microelectronic component have angled side faces.

Example C6 includes the subject matter of any of Examples C1-5, and further specifies that the face of the first microelectronic component is a first face, the first microelectronic component has a second face opposite to the first face, and the first microelectronic component is wider at the second face than at the first face.

Example C7 includes the subject matter of any of Examples C1-6, and further specifies that the dielectric material has a filler content weight-percentage that is greater than 80 weight-percent.

Example C8 includes the subject matter of Example C7, and further specifies that the dielectric material has a filler content weight-percentage that is between 80 weight-percent and 90 weight-percent.

Example C9 includes the subject matter of any of Examples C1-8, and further specifies that the dielectric material extends between the first microelectronic component and the second microelectronic component.

Example C10 includes the subject matter of any of Examples C1-9, and further specifies that the dielectric material extends between the substrate and the bridge component.

Example C11 includes the subject matter of any of Examples C1-10, and further specifies that the dielectric material extends between the first microelectronic component and the bridge component.

Example C12 includes the subject matter of any of Examples C1-11, and further specifies that the dielectric material is a first dielectric material, and the microelectronic assembly further includes: a second dielectric material having a material composition different from that of the first dielectric material, wherein the second dielectric material is between the first microelectronic component and the second microelectronic component.

Example C13 includes the subject matter of Example C12, and further specifies that the first dielectric material is between the second dielectric material and the substrate.

Example C14 includes the subject matter of any of Examples C12-13, and further specifies that the second dielectric material extends around side faces of the first microelectronic component and the second microelectronic component.

Example C15 includes the subject matter of Example C14, and further specifies that a portion of second dielectric material that extends around side faces of the first microelectronic component and the second microelectronic component has angled side faces.

Example C16 includes the subject matter of any of Examples C12-15, and further specifies that the second dielectric material has a filler content weight-percentage that is less than a filler content weight-percentage of the first dielectric material.

Example C17 includes the subject matter of any of Examples C12-16, and further specifies that the second dielectric material has a filler content weight-percentage that is less than 80 weight-percent.

Example C18 includes the subject matter of Example C17, and further specifies that the second dielectric material has a filler content weight-percentage that is between 65 weight-percent and 80 weight-percent.

Example C19 includes the subject matter of any of Examples C1-17, and further specifies that the face of the bridge component is a first face, the bridge component includes a second face opposite to the first face, the bridge component includes ninth conductive contacts at the second face of the bridge component, the substrate includes tenth conductive contacts at the face of the substrate, and the ninth conductive contacts are coupled to the tenth conductive contacts.

Example C20 includes the subject matter of any of Examples C1-18, and further specifies that the substrate includes an organic dielectric material.

Example C21 includes the subject matter of any of Examples C1-19, and further specifies that the first microelectronic component includes a graphics processor.

Example C22 includes the subject matter of any of Examples C1-20, and further specifies that the second microelectronic component includes a server processor.

Example C23 is a microelectronic assembly, including: a substrate having first conductive contacts and second conductive contacts at a face of the substrate; a first microelectronic component having third conductive contacts and fourth conductive contacts at a face of the first microelectronic component, wherein the third conductive contacts are coupled to the first conductive contacts; a second microelectronic component having fifth conductive contacts and sixth conductive contacts at a face of the second microelectronic component, wherein the fifth conductive contacts are coupled to the second conductive contacts; and a bridge component having seventh conductive contacts and eighth conductive contacts at a face of the bridge component, wherein the fourth conductive contacts are coupled to the seventh conductive contacts, the sixth conductive contacts are coupled to the eighth conductive contacts, the seventh conductive contacts have a smaller pitch than the first conductive contacts, and the eighth conductive contacts have a smaller pitch than the second conductive contacts; wherein: the third conductive contacts are coupled to the first conductive contacts by interconnects; an individual interconnect includes at least one conductive pillar in contact with the associated individual third conductive contact and a single solder region between the at least one conductive pillar and the associated individual first conductive contact; and the first microelectronic component and the second microelectronic component have angled side faces.

Example C24 includes the subject matter of Example C23, and further specifies that the at least one conductive pillar includes a stack of multiple conductive pillars.

Example C25 includes the subject matter of Example C24, and further specifies that a diameter of a first conductive pillar in the stack is less than a diameter of a second conductive pillar in the stack, and the first conductive pillar is between the second conductive pillar and the substrate.

Example C26 includes the subject matter of any of Examples C24-25, and further specifies that the stack of multiple conductive pillars has a stepped profile.

Example C27 includes the subject matter of any of Examples C23-26, and further specifies that the face of the first microelectronic component is a first face, the first microelectronic component has a second face opposite to the first face, and the first microelectronic component is wider at the second face than at the first face.

Example C28 includes the subject matter of any of Examples C23-27, and further includes: a dielectric material between the substrate and the first microelectronic component.

Example C29 includes the subject matter of any of Examples C23-28, and further specifies that the dielectric material has a filler content weight-percentage that is greater than 80 weight-percent.

Example C30 includes the subject matter of Example C29, and further specifies that the dielectric material has a filler content weight-percentage that is between 80 weight-percent and 90 weight-percent.

Example C31 includes the subject matter of any of Examples C23-30, and further specifies that the dielectric material extends between the first microelectronic component and the second microelectronic component.

Example C32 includes the subject matter of any of Examples C23-31, and further specifies that the dielectric material extends between the substrate and the bridge component.

Example C33 includes the subject matter of any of Examples C23-32, and further specifies that the dielectric material extends between the first microelectronic component and the bridge component.

Example C34 includes the subject matter of any of Examples C23-33, and further specifies that the dielectric material is a first dielectric material, and the microelectronic assembly further includes: a second dielectric material having a material composition different from that of the first dielectric material, wherein the second dielectric material is between the first microelectronic component and the second microelectronic component.

Example C35 includes the subject matter of Example C34, and further specifies that the first dielectric material is between the second dielectric material and the substrate.

Example C36 includes the subject matter of any of Examples C34-35, and further specifies that the second dielectric material extends around side faces of the first microelectronic component and the second microelectronic component.

Example C37 includes the subject matter of Example C36, and further specifies that a portion of second dielectric material that extends around side faces of the first microelectronic component and the second microelectronic component has angled side faces.

Example C38 includes the subject matter of any of Examples C34-37, and further specifies that the second dielectric material has a filler content weight-percentage that is less than a filler content weight-percentage of the first dielectric material.

Example C39 includes the subject matter of any of Examples C34-38, and further specifies that the second dielectric material has a filler content weight-percentage that is less than 80 weight-percent.

Example C40 includes the subject matter of Example C39, and further specifies that the second dielectric material has a filler content weight-percentage that is between 65 weight-percent and 80 weight-percent.

Example C41 includes the subject matter of any of Examples C23-40, and further specifies that the face of the bridge component is a first face, the bridge component includes a second face opposite to the first face, the bridge component includes ninth conductive contacts at the second face of the bridge component, the substrate includes tenth conductive contacts at the face of the substrate, and the ninth conductive contacts are coupled to the tenth conductive contacts.

Example C42 includes the subject matter of any of Examples C23-41, and further specifies that the substrate includes an organic dielectric material.

Example C43 includes the subject matter of any of Examples C23-42, and further specifies that the first microelectronic component includes a graphics processor.

Example C44 includes the subject matter of any of Examples C23-43, and further specifies that the second microelectronic component includes a server processor.

Example C45 is a microelectronic assembly, including: a substrate having first conductive contacts and second conductive contacts at a face of the substrate; a first microelectronic component having third conductive contacts and fourth conductive contacts at a face of the first microelectronic component, wherein the third conductive contacts are coupled to the first conductive contacts; a second microelectronic component having fifth conductive contacts and sixth conductive contacts at a face of the second microelectronic component, wherein the fifth conductive contacts are coupled to the second conductive contacts; and a bridge component having seventh conductive contacts and eighth conductive contacts at a face of the bridge component, wherein the fourth conductive contacts are coupled to the seventh conductive contacts, the sixth conductive contacts are coupled to the eighth conductive contacts, the seventh conductive contacts have a smaller pitch than the first conductive contacts, and the eighth conductive contacts have a smaller pitch than the second conductive contacts; wherein: the third conductive contacts are coupled to the first conductive contacts by interconnects; an individual interconnect includes at least one conductive pillar in contact with the associated individual third conductive contact and a single solder region between the at least one conductive pillar and the associated individual first conductive contact; and a dielectric material extends around side faces of the first microelectronic component and the second microelectronic component, and the dielectric material has angled side faces.

Example C46 includes the subject matter of Example C45, and further specifies that the at least one conductive pillar includes a stack of multiple conductive pillars.

Example C47 includes the subject matter of Example C46, and further specifies that a diameter of a first conductive pillar in the stack is less than a diameter of a second conductive pillar in the stack, and the first conductive pillar is between the second conductive pillar and the substrate.

Example C48 includes the subject matter of any of Examples C46-47, and further specifies that the stack of multiple conductive pillars has a stepped profile.

Example C49 includes the subject matter of any of Examples C45-48, and further specifies that the first microelectronic component and the second microelectronic component have angled side faces.

Example C50 includes the subject matter of any of Examples C45-49, and further specifies that the face of the first microelectronic component is a first face, the first microelectronic component has a second face opposite to the first face, and the first microelectronic component is wider at the second face than at the first face.

Example C51 includes the subject matter of any of Examples C45-50, and further specifies that the dielectric material has a filler content weight-percentage that is less than 80 weight-percent.

Example C52 includes the subject matter of Example C51, and further specifies that the dielectric material has a filler content weight-percentage that is between 65 weight-percent and 80 weight-percent.

Example C53 includes the subject matter of any of Examples C45-52, and further specifies that the dielectric material is a first dielectric material, and the microelectronic assembly further includes: a second dielectric material having a material composition different from that of the first dielectric material, wherein the second dielectric material is between the first microelectronic component and the second microelectronic component.

Example C54 includes the subject matter of Example C53, and further specifies that the second dielectric material is between the first dielectric material and the substrate.

Example C55 includes the subject matter of any of Examples C53-54, and further specifies that the second dielectric material has a filler content weight-percentage that is greater than a filler content weight-percentage of the first dielectric material.

Example C56 includes the subject matter of any of Examples C53-55, and further specifies that the second dielectric material has a filler content weight-percentage that is greater than 80 weight-percent.

Example C57 includes the subject matter of Example C56, and further specifies that the second dielectric material has a filler content weight-percentage that is between 80 weight-percent and 90 weight-percent.

Example C58 includes the subject matter of any of Examples C53-57, and further specifies that the second dielectric material extends between the first microelectronic component and the second microelectronic component.

Example C59 includes the subject matter of any of Examples C53-58, and further specifies that the second dielectric material extends between the substrate and the bridge component.

Example C60 includes the subject matter of any of Examples C53-59, and further specifies that the second dielectric material extends between the first microelectronic component and the bridge component.

Example C61 includes the subject matter of any of Examples C45-60, and further specifies that the face of the bridge component is a first face, the bridge component includes a second face opposite to the first face, the bridge component includes ninth conductive contacts at the second face of the bridge component, the substrate includes tenth conductive contacts at the face of the substrate, and the ninth conductive contacts are coupled to the tenth conductive contacts.

Example C62 includes the subject matter of any of Examples C45-61, and further specifies that the substrate includes an organic dielectric material.

Example C63 includes the subject matter of any of Examples C45-62, and further specifies that the first microelectronic component includes a graphics processor.

Example C64 includes the subject matter of any of Examples C45-63, and further specifies that the second microelectronic component includes a server processor.

Example C65 is an electronic device, including: a circuit board; and a microelectronic assembly conductively coupled to the circuit board, wherein the microelectronic assembly includes any of the microelectronic assemblies of any of Examples C1-64.

Example C66 includes the subject matter of Example C65, and further specifies that the electronic device is a handheld computing device, a laptop computing device, a wearable computing device, or a server computing device.

Example C67 includes the subject matter of any of Examples C65-66, and further specifies that the circuit board is a motherboard.

Example C68 includes the subject matter of any of Examples C65-67, and further includes: a display communicatively coupled to the circuit board.

Example C69 includes the subject matter of Example C68, and further specifies that the display includes a touchscreen display.

Example C70 includes the subject matter of any of Examples C65-69, and further includes: a housing around the circuit board and the microelectronic assembly.

Example D1 is a method of manufacturing a microelectronic structure, including any of the methods disclosed herein.

Example D2 is a method of manufacturing a microelectronic assembly, including any of the methods disclosed herein.

The invention claimed is:

1. A microelectronic assembly, comprising:
   a substrate having first conductive contacts and second conductive contacts at a face of the substrate;
   a first microelectronic component having third conductive contacts and fourth conductive contacts at a face of the first microelectronic component, wherein the third conductive contacts are coupled to the first conductive contacts;
   a second microelectronic component having fifth conductive contacts and sixth conductive contacts at a face of the second microelectronic component, wherein the fifth conductive contacts are coupled to the second conductive contacts; and
   a bridge component having seventh conductive contacts and eighth conductive contacts at a face of the bridge component, wherein the fourth conductive contacts are coupled to the seventh conductive contacts, the sixth conductive contacts are coupled to the eighth conductive contacts, the seventh conductive contacts have a smaller pitch than the first conductive contacts, and the eighth conductive contacts have a smaller pitch than the second conductive contacts;
   wherein:
      the microelectronic assembly further includes a first dielectric material between the first microelectronic component and the second microelectronic component;
      the first dielectric material has a first filler content weight-percentage greater than 80 weight-percent and less than 100 weight-percent;
      the microelectronic assembly further includes a second dielectric material between the first microelectronic component and the second microelectronic component;
      the second dielectric material is between the first dielectric material and the substrate; and
      the second dielectric material has a second filler content weight-percentage that is less than the first filler content weight-percentage.

2. The microelectronic assembly of claim 1, wherein the first filler content weight-percentage is between 80 weight-percent and 90 weight-percent.

3. The microelectronic assembly of claim 1, wherein the second filler content weight-percentage is between 65 weight-percent and 80 weight-percent.

4. The microelectronic assembly of claim 1, further comprising:
   a third dielectric material between the first microelectronic component and the substrate and between the second microelectronic component and the substrate, wherein the third dielectric material has a third filler content weight-percentage, and the third filler content weight-percentage is less than the second filler content weight-percentage.

5. The microelectronic assembly of claim 4, wherein the third filler content weight-percentage is less than 65 weight-percent.

6. The microelectronic assembly of claim 5, wherein the third filler content weight-percentage is between 50 weight-percent and 65 weight-percent.

7. The microelectronic assembly of claim 1, wherein the first dielectric material includes a mold material.

8. The microelectronic assembly of claim 1, wherein the second dielectric material includes an underfill material.

9. The microelectronic assembly of claim 1, wherein the first microelectronic component includes a graphics processor.

10. The microelectronic assembly of claim 1, wherein the second microelectronic component includes a server processor.

11. A microelectronic assembly, comprising:
    a substrate having first conductive contacts and second conductive contacts at a face of the substrate;
    a first microelectronic component having third conductive contacts and fourth conductive contacts at a face of the first microelectronic component, wherein the third conductive contacts are coupled to the first conductive contacts;
    a second microelectronic component having fifth conductive contacts and sixth conductive contacts at a face of the second microelectronic component, wherein the fifth conductive contacts are coupled to the second conductive contacts; and
    a bridge component having seventh conductive contacts and eighth conductive contacts at a face of the bridge component, wherein the fourth conductive contacts are coupled to the seventh conductive contacts, the sixth conductive contacts are coupled to the eighth conductive contacts, the seventh conductive contacts have a smaller pitch than the first conductive contacts, and the eighth conductive contacts have a smaller pitch than the second conductive contacts;
    wherein:
       the microelectronic assembly further includes a first dielectric material between the first microelectronic component and the second microelectronic component;
       the first dielectric material has a first filler content weight-percentage that is greater than 80 weight-percent and less than 100 weight-percent;
       the microelectronic assembly further includes a second dielectric material between the first microelectronic component and the substrate;
       the second dielectric material has a second filler content weight-percentage that is less than the first filler content weight-percentage;
       the microelectronic assembly further includes a third dielectric material between the first microelectronic component and the substrate and between the second microelectronic component and the substrate; and
       the third dielectric material has a third filler content weight-percentage that is less than the second filler content weight-percentage.

12. The microelectronic assembly of claim 11, wherein the first filler content weight-percentage is between 80 weight-percent and 90 weight-percent, wherein the second filler content weight-percentage is between 65 weight-percent and 80 weight-percent, and wherein the third filler content weight-percentage is between 50 weight-percent and 65 weight-percent.

13. The microelectronic assembly of claim 11, wherein the substrate includes an organic dielectric material.

14. The microelectronic assembly of claim 1, wherein the face of the bridge component is a first face and the bridge component further includes an opposing second face, and the microelectronic assembly further comprising:
    a third dielectric material at the second face of the bridge component, wherein the third dielectric material has a third filler content weight-percentage, and the third filler content weight-percentage is greater than 80 weight-percent and less than 100 weight-percent.

15. The microelectronic assembly of claim 14, wherein the third filler content weight-percentage is equal to the first filler content weight-percentage.

16. The microelectronic assembly of claim 14, wherein a thickness of the third dielectric material is between 15 microns and 50 microns.

17. The microelectronic assembly of claim 12, wherein the face of the bridge component is a first face and the bridge component further includes an opposing second face, and the microelectronic assembly further comprising:
   a fourth dielectric material at the second face of the bridge component, wherein the fourth dielectric material has a fourth filler content weight-percentage, and the fourth filler content weight-percentage is between 80 weight-percent and 90 weight-percent.

18. The microelectronic assembly of claim 17, wherein a thickness of the fourth dielectric material is between 15 microns and 50 microns.

19. The microelectronic assembly of claim 12, wherein the face of the bridge component is a first face and the bridge component further includes an opposing second face, and the microelectronic assembly further comprising:
   a fourth dielectric material at the second face of the bridge component, wherein the fourth dielectric material has a fourth filler content weight-percentage, and the fourth filler content weight-percentage is between 50 weight-percent and 65 weight-percent.

20. The microelectronic assembly of claim 19, wherein a thickness of the fourth dielectric material is between 15 microns and 50 microns.

\* \* \* \* \*